US006233290B1

(12) United States Patent
Raphaeli

(10) Patent No.: US 6,233,290 B1
(45) Date of Patent: May 15, 2001

(54) METHOD FOR NONCOHERENT CODED MODULATION

(75) Inventor: Dan Raphaeli, Kfar Saba (IL)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 08/999,849

(22) Filed: Apr. 13, 1995

(51) Int. Cl.[7] ................................................. H04L 27/06
(52) U.S. Cl. ........................... 375/341; 375/262; 375/265; 714/792; 714/796
(58) Field of Search ..................................... 375/341, 265, 375/141, 262; 714/795, 755, 752, 792, 796

(56) References Cited

U.S. PATENT DOCUMENTS 4,882,733 * 11/1989 Tanner ................................. 714/752
5,541,955 * 7/1996 Jacobsmeyer ........................ 375/222
5,937,015 * 8/1999 Dent et al. ............................ 375/341

OTHER PUBLICATIONS

Svensson et al., Symbol Error Probability Behaviour for Continuous Phase Modulation with Partially Coherent Detection, AEU, Band 40, 1986, Heft I, pp. 37–45.

Simon et al., Maximum–Likelihood Block Detection of Noncoherent Continuous Phase Modulation, IEEE Transactions on Communications, vol. 41, No. 1, Jan. 1993, pp. 90–98.

Divsalar et al., The Performance of Trellis–Coded MDPSK with Multiple Symbol Detectionn, IEEE Transactions on Communications, vol. 38, No. 9, Sep. 1990, pp. 1391–1403.

Chevillat et al., Decoding of Trellis–Encoded Signals in the Presence of Intersymbol Interference and Noise, IEEE Transactions on Communications, vol. 37, No. 7, Jul. 1989, pp. 669–676.

Svensson, Reduced State Sequence Detection of Partial Response Continuous Phase Modulation, IEE Proceedings–I, vol. 138, No. 4, Aug. 1991, pp. 256–268.

* cited by examiner

Primary Examiner—Stephen Chin
Assistant Examiner—Shuwang Liu
(74) Attorney, Agent, or Firm—Michaelson & Wallace

(57) ABSTRACT

In a communication system receiving from a channel a received signal corresponding to a succession of received symbols during a corresponding succession of symbol times, the succession of symbols corresponding to a succession states of a code of the communication system, each of the states branching to a predetermined number of others of the states, the invention provides a process for deducing an estimate of the succession of symbols from the received signal by overlapped observations of the received signal.

34 Claims, 21 Drawing Sheets

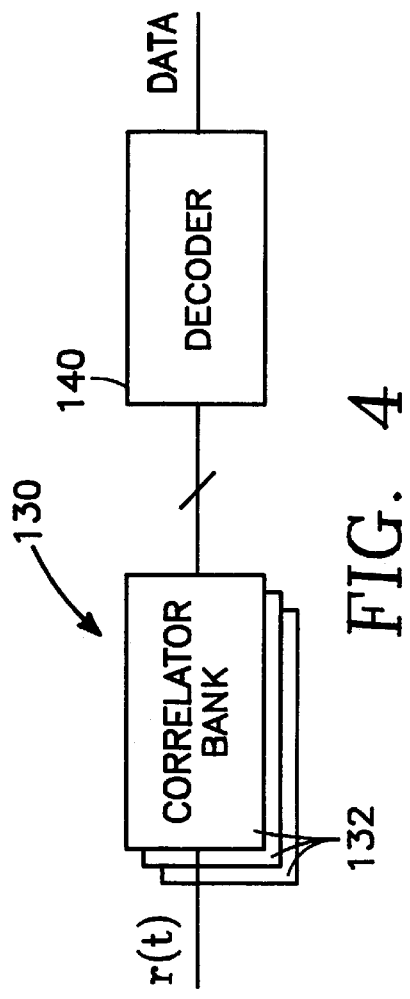
FIG. 4
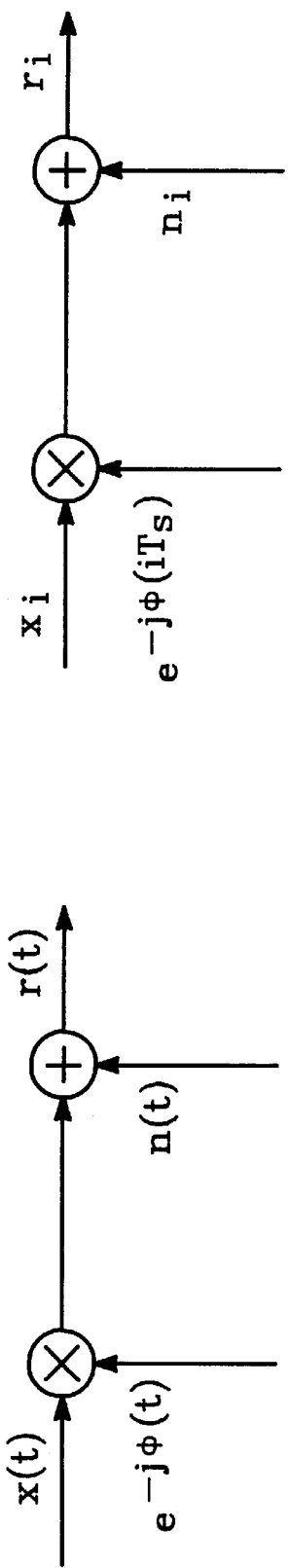
FIG. 5A
FIG. 5B

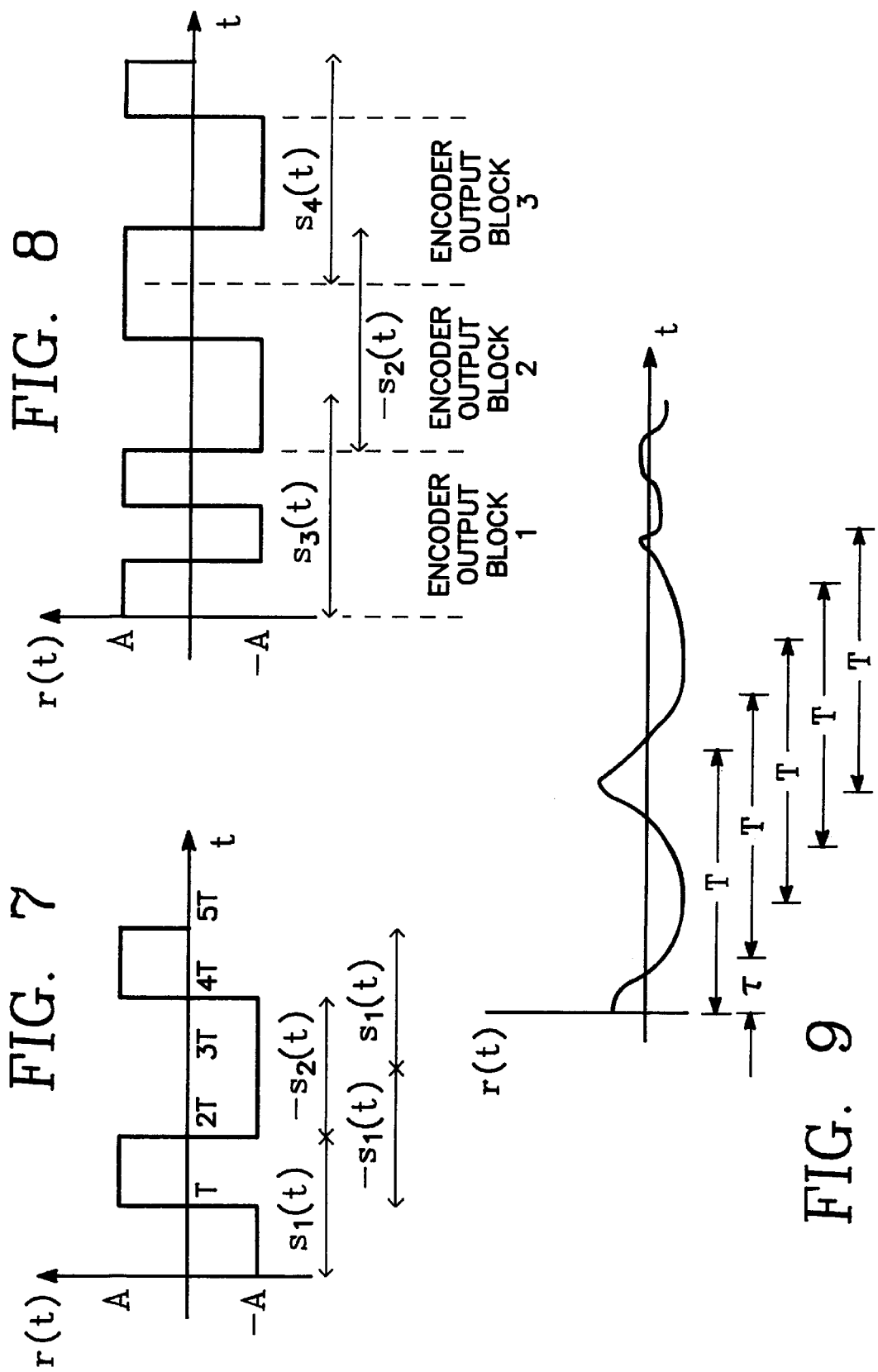

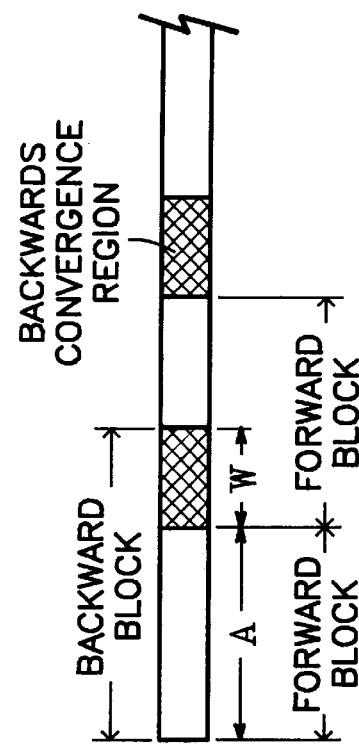
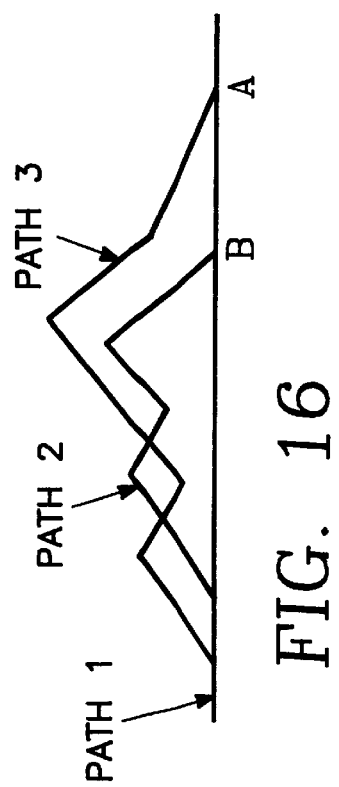
FIG. 16
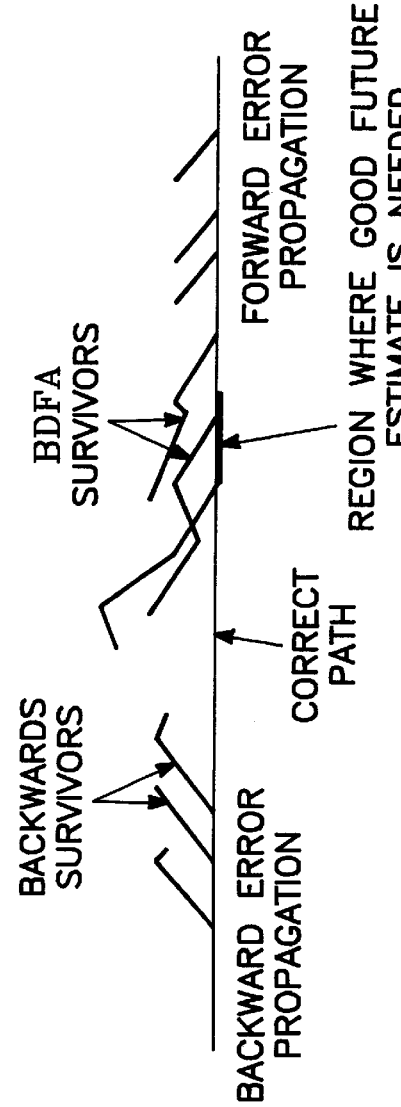
FIG. 18
FIG. 19

METHOD FOR NONCOHERENT CODED MODULATION

BACKGROUND OF THE INVENTION

1. Technical Field

The present invention relates to modulation and demodulation of trellis modulated codes and in particular to processes for performing noncoherent coded modulation of such codes.

2. Background Art

Digital communication systems used in practical applications are often very complicated. For example, the receiver for the NASA Deep Space Network took over one decade to develop and cost millions of dollars. Moreover, every communication system is different. There are many elements to be defined including the code, the modulation, the equalizer, the transmitted frequency, etc. For any such element, there are many possible methods of implementations. To investigate the theory of the operation of a digital communication system, it would be desirable to develop a unifying representation. Working in such a framework will enable us to treat a large class of communication systems as one.

A baseband equivalent block diagram of a digital communication system is shown in FIG. 1. All the signals are represented by their complex envelopes. Our goal is to derive a vectorized version, as shown in FIG. 2. Let $x(t)$ be one of the possible transmitted signals and $T_s$ the duration of an individual symbol. Let us choose a complete orthogonal set $\{\phi_n\}$ of complex functions such that $$\int_{-\infty}^{\infty} \varphi_n^*(t)\varphi_m(t)dt = \begin{cases} 1, & n = m; \\ 0, & n \neq m. \end{cases} \quad (1)$$

It is convenient to assume that the transmitter (i.e., the encoder 100 and modulator 110 of FIG. 1) is turned on at t=0. Then we can represent $x(t)$ as $$x(t) = \sum_{i=0}^{\infty} x_i(t), \quad (2)$$

where $$x_i(t) = \sum_{i=0}^{\infty} \sum_{j=0}^{D-1} x_{i,j} \varphi_j(t - iT_s), \quad (3)$$

and D is the number of complex dimensions needed to represent each symbol $x_i(t)$ in the specific coordinate system $\{\phi_n\}$. The symbols $x_i(t)$ may have an infinite duration, as in the case of Nyquist pulses. Most of the energy of $x_i(t)$ is usually found within the time $iT_s < t < (i+1)T_s$ (with proper alignment of the time origin). For certain modulation types of choices of $\{\phi_n\}$, D can be infinite. Each symbol of $x(t)$ will be written as a complex vector of dimension D, $x_i = (x_{i,0}, \ldots, x_{i,D-1})$. It follow that we can describe the whole transmitter 100, 110 as a code which maps the sequence of input symbols (which are commonly bits) to a sequence of output symbols which are complex vectors, each of D dimensions. The code is often a block code, operating on a finite number of symbols, or a trellis code, operating on an infinite input sequence and outputting an infinite sequence. Practically everything is finite, but for a long message the infinite length is a good approximation. A block code is a mapping between a block of input symbols to a block of output symbols. A trellis code is a state machine. The input symbol and the current state determine the next state, and for each such transition one or more output symbols are assigned. We will assume that $\{\phi_i\}$ are chosen such that there is no Inter-Symbol Interference (ISI) at the matched filter output. This condition can be defined as $$\int_{-\infty}^{\infty} \varphi_n^*(t)\varphi_m(t - lT_s)dt = 0 \quad \forall\, l \neq 0, n, m. \quad (4)$$

If no such representation is possible, then it is always possible to form an equivalent system where the ISI is converted into a trellis code in which output symbols have no ISI.

Let us try some examples. The first is Binary Phase Shift Keying (BPSK) modulation without coding.

$$x(t) = \sum_{i=0}^{\infty} \alpha_i q(t - iT_s), \quad (5)$$

where $q(t)$ is some waveform which does not lead to ISI, and $\alpha_i = \pm 1$ corresponds to the binary input symbols. Naturally, we choose $\phi_0(t) = q(t)$ and D=1. Then we have $x_i = \alpha_i$. The code is reduced to a one-to-one mapping from input bits to output symbols. The next example is DPSK (Differential Phase Shift Keying) modulation. Here $$x(t) = \sum_{i=0}^{\infty} \beta_i q(t - iT_s), \beta_i = \beta_{i-1}\alpha_i, \quad (6)$$

with initial conditions $\beta_{-1} = 1$. We use $\phi_0(t) = q(t)$ and $x_i = \beta_i$. There is a trellis code which maps the input bits to the output symbols $\beta_i$. This code has two states, but has no redundancy (looked upon as a convolutional code, this encoder is non-minimal. The minimal encoder sends the bits uncoded, i.e., it has only one state). Its trellis is shown in FIG. 3.

Any modulator with memory is equivalent to a code, most often a trellis code. Adding a binary encoder (which may be the encoder 100) in front of such a modulator (which may be the modulator 110) merely generates an equivalent code. A good example of such modulator is CPM (Continuous Phase Modulation). Some workers prefer to separate a code into two parts. The first is a binary encoder and the second is a memoryless mapper from bits to complex valued vectors.

The channel 120 of FIG. 1 attenuates, filters, adds noise and causes a phase shift to the signal. Coherent channels do not cause a phase shift to the signal (a phase shift of $\phi$ is mathematically a multiplication of $e^{j\phi}$ of the base-band signal). Noncoherent channels cause random time-varying phase shifts.

The final block or receiver includes a correlator 130 and a decoder 140 and serves to decode the input signal back to the transmitted information. Let $r(t)$ be the complex envelope of the received signal. $r(t)$, as $x(t)$, is decomposed by the orthonormal functions as $$r(t) = \sum_{i=0}^{\infty} r_i(t) = \sum_{i=0}^{\infty} \sum_{j=0}^{\infty} r_{i,j}\varphi_j(t - iT_s). \quad (7)$$

Note that an infinite number of dimensions is needed in general to represent $r(t)$ due to the infinite dimensionality of the noise, but later we will only use D of them since all the components of the received signal outside the signal space are irrelevant for the decision. For an additive noise channel, we can express the received noise n(t) in the same way.

A large class of receiving systems, either coded or uncoded can be represented as follows. Assuming that there is no timing error between the transmitter and the receiver, the receiver performs symbol by symbol correlations between the received signal, r(t), and a candidate signal $\hat{x}(t)$ (a possible transmitted signal). The results of these correlations are the arguments of a real-valued likelihood function $\Lambda(\hat{x})$. The quantity $\Lambda$ is often called a "metric". The receiver chooses $\hat{x}$ which maximizes this function. The correlator output for the i'th symbol is defined as $$\mu_i = \int_{-\infty}^{\infty} r(t)^* x_i(t) dt = r_i^\dagger x_i, \quad (8)$$

where $r_i=(r_{i,0}, r_{i,1}, \ldots, r_i,D-1)$ and '†' denotes the conjugate and transpose of a vector or matrix. The vector $\underline{\mu}=(\mu_0, \ldots, \mu_{N-1})$, representing the sufficient statistics for decision, is the input to the likelihood function $$\Lambda(\hat{x})=f(\underline{\mu}). \quad (9)$$

Here, N is the number of symbols the decoder 140 operates on. For a block code, N is the size of the output block. For the case of uncoded modulation N is usually equal to 1, and for a trellis code N→∞. For a coherent additive noise channel we can express $r_i$ as $$r_i=x_i+n_i, \quad (10)$$

where $n_i=(n_{i,0}, n_{i,1}, \ldots, n_{i,D-1})$. For a coherent decoder, for the case of equiprobable and equal-energy waveforms over the Additive White Gaussian Noise or AWGN channel, the optimal likelihood function, f, is $$f(\mu) = \sum_{i=0}^{N-1} Re\{\mu_i\}. \quad (11)$$

We see that the receiver is composed of two parts. The front end is the demodulator or correlator 130, which correlates the input signal with all the possible symbols. Its output is fed into the decoder 140 (or decision device for the uncoded case) which operates by maximizing the likelihood function, $\Lambda(\hat{x})$ and finding the information bits that correspond to the sequence which achieves this maximum. The decoder 140 is illustrated in FIG. 4. The correlation at the front end is, most often, accomplished by plural matched filters 132 constituting a correlator bank. A matched filter 132 will either output the component $r_{i,j}$ using $\phi_j$ as the template, or will output $\mu_i$ using $x_i(t)$ as the template. In the first case, some signal processing block will compute the vector product $r_i^\Lambda x_i$. We will call this type of receiver a correlator-based receiver. Hereafter, a decoder will always refer to a device which maximizes a likelihood function as described above. The definition of the code is general and it includes the uncoded case as a special case. Since we have included the uncoded modulations as special case of the coded modulations, "decoding" will include the detection using a symbol-by-symbol decision device.

If the decoder 140 is a noncoherent decoder, it ignores the phase shift $\phi(t)$ of the channel 120 with the restriction that the phase is slowly varying. The noncoherent decoder 140 is built under the assumption that we have no information about $\phi(t)$, except its slow variation. When some information is available about the phase, for example if $\phi(t)$ is the residual phase error of a Phase Locked Loop (PLL) within the receiver, then the resulting decoder will be called partially coherent. It is an object of the invention to provide the optimal noncoherent decoder.

1 Noncoherent Channels

As illustrated in FIG. 5A, the noncoherent channel introduces a phase shift $\phi(t)$ and adds noise n(t) to the transmitted waveform x(t), the result being the received signal r(t). Assuming additive noise is independent of the phase shift of the signal, noise statistics remain unchanged, whether the noise is added before the phase shift, i.e., $r(t)=(x(t)+n(t))e^{j\Phi}$ $(t)$, or after the phase shift, i.e., $r(t)=x(t)e^{j\Phi(t)}+n(t)$. For analysis throughout this specification, we will use the latter form. The channel phase, $\phi(t)$, is a random process. Its statistics depend on its physical origin. In many cases, it is very difficult to find the exact model of the phase process (also referred as phase noise or phase jitter). We use the assumption that the phase is slowly varying relative to the symbol rate. If this is not the case, then communication becomes difficult if not impossible, and large degradation is unavoidable. This specification is constrained to cases where the phase variation is negligible over the duration of at least one symbol. More specifically, over the duration where most of the energy of the symbol is concentrated. Under this assumption we can express the received signal in a vector form it $$r_i=x_i e^{j\phi(iT_s)}+n_i, \quad (12)$$

The equivalent process in the channel is illustrated in FIG. 5B. The duration over which the phase is assumed constant will be called an "observation."

2 Existing Noncoherent Decoders

One of the oldest types of noncoherent modulation is M-ary Frequency Shift Keying (MFSK). In MFSK, M frequencies $\omega_0, \ldots, \omega_{M-1}$ are used to transmit the information. Each output symbol is a sinusoidal wave $s_n(t)=\sin(\omega_n t+\theta)$. For optimal noncoherent performance (i.e., optimal with respect to a detector which looks at independent symbols) the frequencies should be separated from each other by multiples of $$\frac{2\pi}{T_s}.$$

This makes the symbols orthogonal to each other. Orthogonality between different symbols in their complex envelope representation is defined as $$\int_0^{T_s} s_n^*(t)s_m(t)dt = 0.$$

If the phase of the sinusoid is kept continuous in the transition between symbols, we call the modulation Continuous Phase FSK (CPFSK). The phase continuity introduces memory to the modulator and has the effects of coding. A decoder that utilizes this memory performs better than one that looks at independent symbols. There are many decoders for noncoherent MFSK. One popular suboptimal detector is based on a discriminator. A discriminator is a device that measures instantaneous frequency. Obviously, one can use this device to determine which one of the possible waveforms was transmitted. This method works especially well when CPFSK is used, and in particular for M=2. In fact, for M=2, the discriminator detector for the optimal choice of parameters has better performance than the optimal detector for FSK with independent symbols, since it uses (indirectly) the modulation memory.

If we assume that the channel phase is independent from one symbol to the next (in this case the phase continuity in the modulator does not make any difference), then the optimal decoder is as follows (this case is most commonly referred to as the only form of noncoherent detection). We assume orthogonal waveforms, equally likely, having equal energy and the channel is an all white Gaussian noise (AWGN) channel. Since the symbols are orthogonal, we can choose $$\phi_n(t)=s_n(t), n=0, \ldots, M-1. \quad (13)$$

The optimal detector is a correlator-based receiver as defined above. Its choice of f is $$f(\mu)=|\mu|^2. \quad (14)$$

Here N=1, so $\mu$ is not a vector, and we perform a separate decision on each symbol. The performance of MFSK over an AWGN channel becomes better and better as M grows, and in the limit of M→∞ it achieves the channel capacity. However, we must remember that the observation time length also grows with M. For each output symbol, $\log_2 M$ bits are sent. Keeping the bit rate, $$\frac{1}{T_b},$$

constant, the observation length is $T_b \log_2 M$. For a large M, the assumption made that the phase is constant over the length of the symbol may no longer be satisfied, so it is not useful over practical channels.

Instead of using different frequencies for making the symbols orthogonal (orthogonality guaranties optimum performance), we can form other sets of orthogonal waveforms to be used as output symbols. For example, we can use the Walsh functions, an exemplary set of which is illustrated in FIGS. 6A through 6D. These functions take only values of +1 or −1, and thus we benefit from using BPSK transmitters and matched filters when using these functions as symbols. We also get easier symbol time synchronization in the receiver compared to MFSK. Let us call this modulation Walsh Shift Keying (WSK). The matched filter bank for MFSK can be implemented using a Fast Fourier Transform (FFT). Likewise, the matched filter bank for WSK can be implemented using the Fast Walsh Transform (FWT). The FWT involves only additions and subtractions, thus is easier to implement than the FFT.

Another type of noncoherent modulation is differential phase shift keying (DPSK). In DPSK the information is encoded in the difference between the phase of two consecutive symbols. Even though DPSK is a coded scheme, it is possible to make symbol-by-symbol decisions. The optimal noncoherent decoder for DPSK and its performance can be found by making the following observation. Two consecutive symbols will switch sign if the input bit is 1, or stay the same if the input bit is 0, as illustrated in FIG. 7. When the input bit is 1, the waveform $\pm s_1(t)$ is transmitted and when it is 0, the waveform $\pm s_2(t)$ is transmitted instead. The sign depends on the previous modulator output value. The resulting output waveform can be seen as an overlap of $s_1(t)$ (FIG. 6A) and $s_2(t)$ (FIG. 6B) in time. The decoder has to make the decision as to which one of $s_1(t)$ or $s_2(t)$ was transmitted by looking at the received signal over two symbols. Since $s_1(t)$ and $s_2(t)$ are two orthogonal waveforms, the receiver is equivalent to the receiver for binary FSK. Thus, the decoder can be simplified to the familiar form $\text{Re}\{r_i r_{i-1}^*\} \lessgtr 0$. Its performance is the same as that of the FSK receiver. There is a dependency between consecutive decisions, but this does not affect the per-bit error probability. The energy for each of the orthogonal waveforms used is the energy of two bits. The energy in binary FSK symbols, on the other hand, is the energy of one bit. Thus, we obtain an improvement of exactly 3 dB, over binary FSK.

In the case of MFSK, the observation length grows with M, and the performance improves. Comparing DPSK to binary FSK, we increase the observation length from one bit to two bits. Hence we conclude that increasing the observation length leads to better performance. This is indeed the case for most noncoherent decoders.

SUMMARY OF THE DISCLOSURE

In a communication system receiving from a channel a received signal corresponding to a succession of received symbols during a corresponding succession of symbol times, the succession of symbols corresponding to a succession states of a code of the communication system, each of the states branching to a predetermined number of others of the states, the invention provides a process for deducing an estimate of the succession of symbols from the received signal by overlapping observations of the received signal. The process includes storing a block of symbols of the received signal, then, for each one of the states at a current symbol time of the received signal, identifying a previously stored survivor path of states corresponding to the received signal leading to the one state. The process then forms plural candidate paths from the one state by appending to the survivor path next ones of the states branching from the one state. For each one of the plural candidate paths, the process computes a path metric including a sum of products of symbols corresponding to the succession of states in the one candidate path and a corresponding succession of symbols in the received signal extending back from the next state of the one candidate path over a predetermined number of prior symbol times. For each of the next states, the process selects one of the plural candidate paths having the greatest path metric as the survivor path to the corresponding one of the next states and stores the survivor path to the one next state. The final result of each cycle of the process is outputting a symbol of one of the survivor paths corresponding to an earlier symbol time displaced from the current symbol time by a predetermined delay.

Preferably, the survivor paths converge within a span of symbol times corresponding to the predetermined delay. Generally, the symbols correspond to transitions between current states and next states branching from the current states. In the disclosed implementation, the code is a trellis code. Preferably, the symbols of the code are mutually orthogonal so that the products correspond to correlations between symbols of the received signal and symbols of the candidate paths.

At the end of each cycle, the process increments the current symbol time by one symbol time and repeats the identifying, computing, selecting and outputting steps, so as to process the entire block of the symbols of the received signal over successive symbol times.

for each current symbol time, the process computes the sum of products over a time period extending back in time by L symbol times, and accumulates the sum of products for each symbol time over the succession of symbol times by updating an accumulated sum of products with the sum of products of the current symbol time. In an improvement of the foregoing process, symbols of the block corresponding to a limited number future symbol times occurring after the current symbol time are known, and the sum of products is computed over a time window including the prior symbol times and the future symbol times. In this improvement, each product in the sum of products involving one of the known symbols of the future symbol times is estimated based upon the orthogonality of the symbols.

The invention also provides a process involving an estimated future. This latter process is carried out in a communication system receiving from a channel a received signal corresponding to a succession of received symbols during a corresponding succession of symbol times, the succession of symbols corresponding to a succession states of a code of the communication system, each of the states branching to a predetermined number of others of the states. The process deduces an estimate of the succession of symbols from the received signal by overlapped observations of the received signal. The process begins by storing a block of symbols of the received signal. Then, starting at the last symbol time and proceeding toward the earliest symbol time of the block, a backward process is performed, as follows: For each one of the states at a current symbol time of the received signal, the process identifies a previously stored survivor past path of states corresponding to the received signal leading from the one state and forming plural past candidate paths through the one state by appending to the survivor path previous ones of the states branching to the one state. For each one of the plural past candidate paths, the process computes a path metric including a sum of products of symbols corresponding to the succession of states in the one past candidate path and a corresponding succession of symbols in the received signal extending from the previous state of the one past candidate path over a predetermined number of prior symbol times. For each of the previous states, the process selects one of the plural past candidate paths having the greatest path metric as the survivor past path to the corresponding one of the previous states and stores the survivor past path from the one previous state. The backward process concludes each of its cycles by decrementing the current symbol time by one symbol time and repeating the identifying, computing, selecting and outputting steps, so as to process the entire block of the symbols of the received signal over successive symbol times to form survivor past paths for each state at each symbol time of the block. Upon completion of the backward process, a forward process is performed starting with the earliest symbol time of the block, as follows: for each one of the states at a current symbol time of the received signal, forming plural candidates including (a) a future candidate path extending between the one state and the next state in the past survivor path passing through the one state at the current symbol time, (b) plural no-future candidate paths extending through the one state and ending at each next state branching from the one state, and (c) plural future candidate paths formed by appending to each the no-future candidate path a portion of that past survivor path extending through the next state of the no-future candidate path. For each one of the plural future and no-future candidate paths, the process computes a path metric including a sum of products of symbols corresponding to the succession of states in the candidate path and a corresponding succession of symbols in the received signal. For each of the next states, the process selects one of the future candidate paths having the greatest path metric as the survivor future path to the corresponding one of the next states and stores the survivor future path to the one next state. For each of the next states, the process selects one of the future and no-future candidate paths having the greatest path metric as the survivor no-future path to the corresponding one of the next states and stores the survivor no-future path to the one next state. The forward process then concludes each cycle by outputting a symbol of one of the no-future survivor paths corresponding to an earlier symbol time displaced from the current symbol time by a predetermined delay and increments the current symbol time by one symbol time to repeat the identifying, computing, selecting and outputting steps, whereby to process the entire block of the symbols of the received signal over successive symbol times.

In the latter process involving future estimates, the no-future survivor paths converge within a span of symbol times corresponding to the predetermined delay. The symbols can correspond to transitions between current states and next states branching from the current states. The code can be a trellis code. The symbols of the code are preferably mutually orthogonal whereby the products correspond to correlations between symbols of the received signal and symbols of the candidate paths. Generally, the no-future survivor path is the most reliable estimate of a sequence of symbols of the received signal.

The computing processes of the backward and forward processes include, respectively, for each current symbol time, computing the sum of products over a time period extending, respectively, back and forward, in time by L symbol times, and accumulating the sum of products for each symbol time over the succession of symbol times by updating an accumulated sum of products with the sum of products of the current symbol time. In an improvement of the backward process, symbols of the block corresponding to a limited number future symbol times occurring after the current symbol time are known, and the sum of products is computed over a time window including the prior symbol times and the future symbol times. In this improvement of the backward process, each product in the sum of products involving one of the known symbols of the future symbol times is estimated based upon the orthogonality of the symbols.

BRIEF DESCRIPTION OF THE DRAWINGS

FIG. 4 is a block diagram of a correlation-based receiver.

FIG. 5A and FIG. 5B illustrate noncoherent additive noise channels.

FIG. 7 is a time domain waveform illustrating baseband DPSK modulation as FSK with time overlapping of Walsh functions.

FIG. 8 is a time domain waveform illustrating baseband 4FSK modulation as time overlapping of Walsh functions.

FIG. 9 is a time domain waveform with successive time overlapped observation windows.

FIG. 16 is a diagram of candidate paths through a trellis of states, illustrating error propagation in the process of FIG. 15.

FIG. 18 illustrates backward and forward time blocks of third decoder of the present invention employing an EFDFA process.

FIG. 19 is a diagram of candidate paths through a trellis of states illustrating the operation of the EFDFA process.

DETAILED DESCRIPTION OF THE PREFERRED EMBODIMENTS

Figure 1:
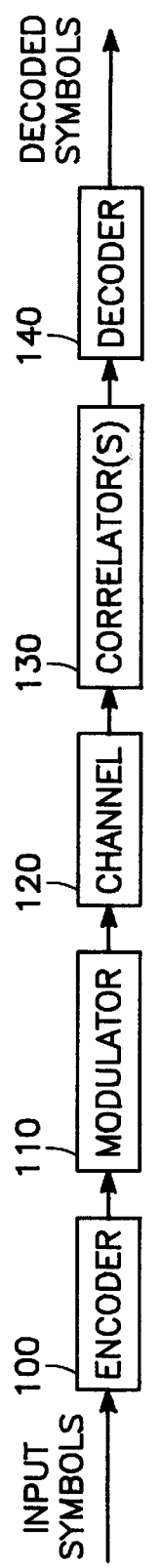
FIG. 1 is a block diagram of a communication system of the prior art.
Figure 2:
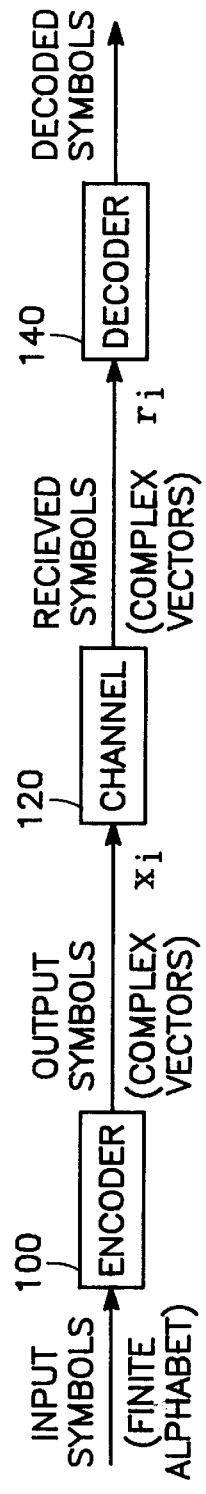
FIG. 2 is a block diagram of a baseband equivalent model of a communication system.
Figure 3:
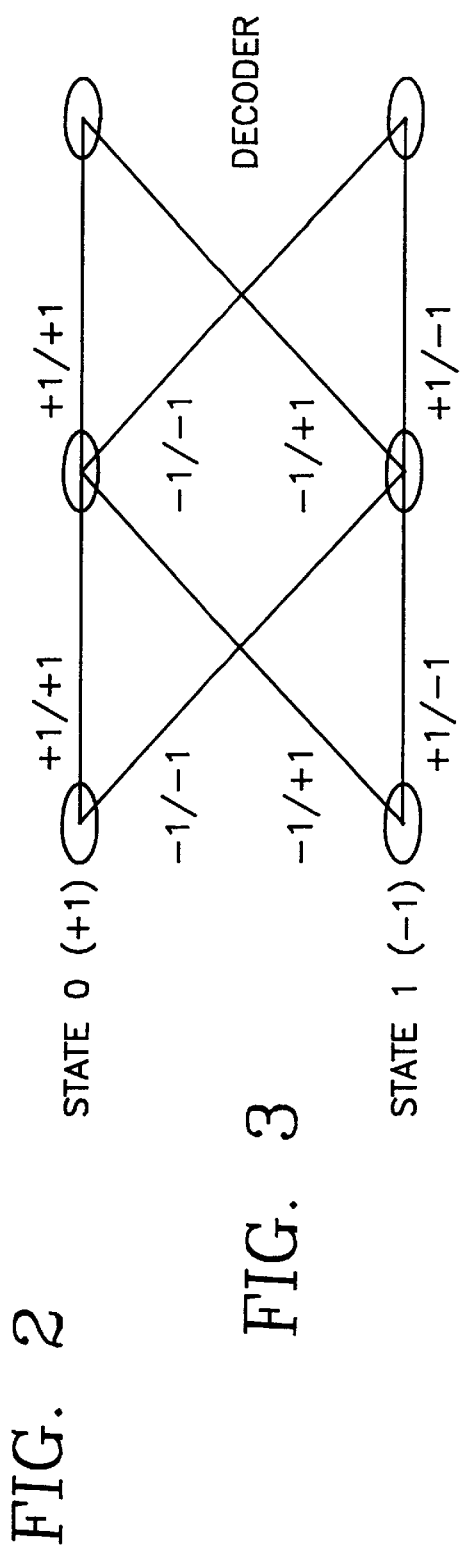
FIG. 3 is a diagram of a trellis code representation of DPSK modulation.
Figure 6A:
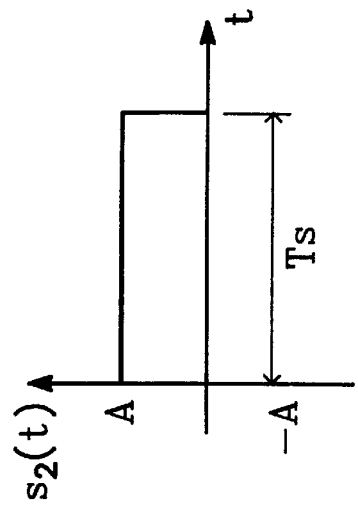
FIGS. 6A, 6B, 6C and 6D illustrate a set of Walsh functions as time domain waveforms.
Figure 6C:
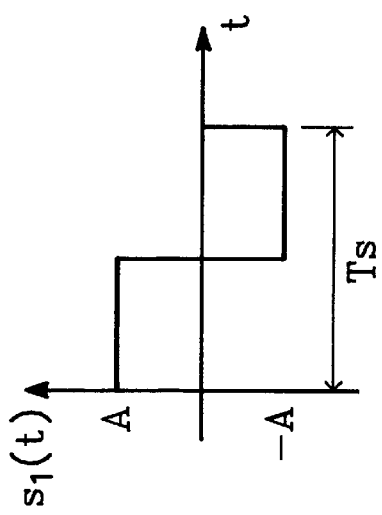
Figure 6B:
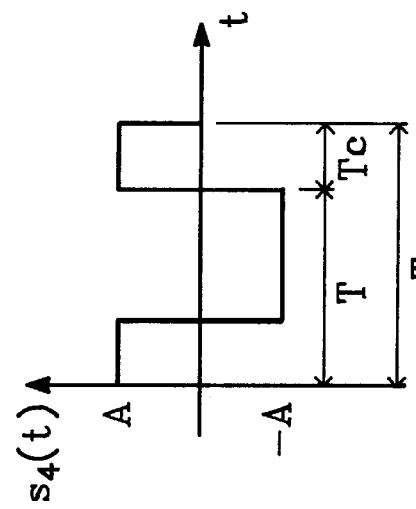
Figure 6D:
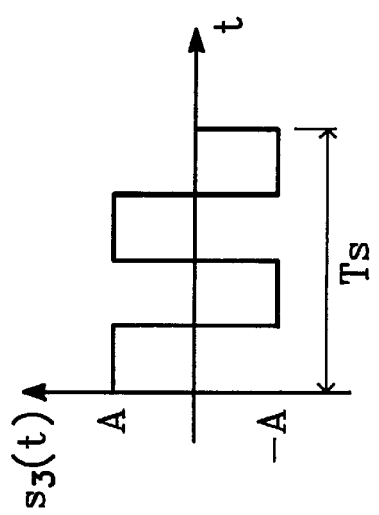

3 Improvement of Noncoherent Orthogonal Coding by Time-Overlapping

Block orthogonal coding is a modulation technique that works either coherently or noncoherently. Using either method of detection, we can approach the capacity of the AWGN channel as the number of symbols M grows. Noncoherent detection is used when the carrier phase is unknown at the receiver and no attempt is made to estimate its value. M-ary block orthogonal coding is the optimal noncoherent modulation for the AWGN channel in the case in which decisions are made independently symbol by symbol. This modulation is simple to implement and has a relatively good performance, especially for large M. Each k bits of the input stream is assigned to one of possible $2^k$ signals. All the signals of the set are orthogonal to each other. The signals are transmitted over the AWGN channel and received by an optimal noncoherent receiver. The present section of this specification does not include coding in the transmission. Later sections of this specification will include coding.

The optimal M-ary receiver chooses the signal which corresponds to the maximum of the energy among the outputs of $M=2^k$ matched filters, each matched to one of the possible transmitted signals. Specifically, the receiver finds i which maximizes $$\left| \int_0^{T_s} x(t) s_i^*(t) dt \right|^2, \tag{15}$$

where $x(t)$ is the received waveform, $s_i(t)$, $i=1 \ldots M$ are the set of the possible transmitted signals, and $T_s$ is the symbol duration. Let us now try to overlap the transmitted symbols in time. This means that the "tail" of the current symbol is a part of the next symbol and so on. By doing so, and choosing the appropriate set of orthogonal signals which can be overlapped, we will see that we actually can have an improvement in performance. This improvement, we show, comes in the expense of only a very small increase in the complexity of the receiver or the transmitter. The only difference in the receiver is that the integration window in equation (15) advances in time in smaller steps than $T_s$. The receiver, as before, makes decisions for each symbol independently. We will first show that improvement in performance over conventional noncoherent block orthogonal signaling can be actually achieved.

In order to describe the idea, let us take as an example the case of binary transmission (k=1). DPSK can be described as the time-overlapping version of the binary orthogonal transmission. The probability of symbol error for FSK (or any other binary orthogonal signaling) is:

$$P_e = \frac{1}{2} e^{-\frac{E_b}{2N_0}}, \tag{16}$$

and for DPSK we have $$P_e = \frac{1}{2} e^{-\frac{E_b}{N_0}}. \tag{17}$$

We can notice clearly the 3 dB improvement: half the $$\frac{E_b}{N_0}$$

is needed in DPSK relative to FSK to get the same error probability. For DPSK the two transmitted signals are: +A, +A or +A, −A in baseband. The duration of those signals is 2T, when $$\frac{1}{T}$$

is the bit rate. There is an overlapping in time between each signal and the one that follows. The amount of overlap is half of the signal duration as shown in FIG. 7. Because of the overlapping in time, we are transmitting with DPSK at twice the rate we would have transmitted without any overlapping. Yet the probability of error per bit still stays the same as in the non-overlapping case. This error probability is the error probability of FSK in which the symbol duration is 2T.

The result is that without degrading any other aspect of performance, we get an improvement of 3 dB with DPSK over FSK. The 3 dB corresponds to the extended duration of the symbol: instead of T the duration is 2T. However, the errors that will occur are no longer independent; they tend to happen in pairs, but this fact does not change the error probability per bit. The following sections of this specification generalize this concept to M-ary block orthogonal signaling.

4 Generalization to M-ary Transmission

Not any set of symbols can be overlapped. We will present the constraints that a set must satisfy and show that the set of the Walsh functions satisfies those constraints and thus can be used to utilize the performance gain. It is also important to note that the phases of the transmitted symbols are not independent when using overlapped signals. This situation is similar to the case of continuous phase FSK (CPFSK).

Assume that the duration of the overlap in time between a given symbol and the following one is x. In order that any two consecutive independent signals be able to overlap in time, the set of signals must satisfy the following requirements:

1. For a window in time $0 \leq t \leq x$, all the signals must have the same waveform except for a possible phase shift.
2. For a window in time $T_s - x \leq t \leq T_s$, all the signals must have the same waveform except for a possible phase shift, where $T_s$ is the symbol duration.

In order to understand the first requirement, let the signal $s_k e^{j\theta}$ be transmitted. Here $s_k$ is a signal from the set and $\theta$ is a phase shift that we introduce to comply with the previous symbol. Now we want to transmit the next symbol, $s_i$. The time segment $0 \leq t \leq x$ of this signal was already transmitted, so we just have to transmit the rest of the signal. It is clear then that all the signals that we might transmit must have the same beginning section or "head." If $s_i$ does not have the required beginning section, but only a phase shift of it, we can still transmit it if we properly phase shift the whole signal such that its beginning will be equal to what was already transmitted. We are free to choose any phase shift in the transmitter since the receiver is not sensitive to phase shift.

The following orthogonal set is an example of a set that can be used for time-overlapped orthogonal signaling. Let $M = 2^k$ and let the set of orthogonal functions be the set of M Walsh functions illustrated in FIGS. 6A–6D. This set of functions also achieves the upper bound that we will prove next, so it is an optimal set. Walsh functions are a set of functions which are binary codes. In each time slot they assume a value of either –A or +A. The functions are defined by the following equation:

$$s_i(t) = A \sum_{n=0}^{M-1} a_{n,i} P(t - nT_c), \, i = 1 \ldots M, \quad (18)$$

where P(t) is a rectangular pulse of duration $T_c$ that will be called a chip. The $a_{n,i}$ can have the value +1 or –1 and are computed by the following formula:

$$a_{n,i} = \prod_{j=0}^{k-1} (-1)^{b_j(n) b_{k-1-j}(i)}, \quad (19)$$

where $b_j(m)$ is the j'th bit in the binary representation of m (j=0 for the least significant bit). This set of functions has the desired orthogonality property.

We will always be able to overlap the first chip of a certain signal with the last chip of the preceding signal. For example, consider M=4, i.e., two bits per symbol. Denote $T_s$ as the symbol duration, $T_c$ as the chip duration, and T as the effective symbol duration after overlapping, i.e., the non-overlapped symbol duration. The following relations hold:

$$T_s = 4T_c, \, T = 3T_c. \quad (20)$$

Because of the overlapping (as shown in FIG. 8) by ¼ symbol, the performance gain over conventional 4FSK is ⅘ which is 1.25 dB.

Asymptotically, it can be shown that both the bit error probability of coherent BPSK, DPSK and 4FSK approach the same expression as in equation (17) in terms of the needed $E_b/N_0$ per given bit error probability. Thus, with M=4 and overlapping we can do up to 1.25 dB better than DPSK and even better than BPSK.

For example, we take the point $P_b = 10^{-5}$ ($P_b$ is the bit error probability). With DPSK we need $$\frac{E_b}{N_0} = 10.34 \text{ dB},$$

with BPSK we need $$\frac{E_b}{N_0} = 9.59 \text{ dB}.$$

With set of 4 orthogonal signals (like 4FSK) we need $$\frac{E_b}{N_0} = 10.61 \text{ dB},$$

but with the 1.25 dB improvement we need only 9.36 dB, which is better than BPSK by 0.23 dB.

5 Noncoherent Coded Modulation

Currently, there is a gap between the performance of coded noncoherent systems and the coherent ones. For example, there is about 3 dB difference in performance on the AWGN channel between constraint length 7 rate 1/2, coded PSK and DPSK (differential PSK), even when interleaving is used for the DPSK. Moreover, there is not much available trade-off between bandwidth and power efficiency with currently used noncoherent modulations as it is with coherent ones. Recently it has been shown that the performance of noncoherent detection can be improved by using a longer observation time (one symbol for FSK and two symbols for differential detection). The observation is the time window in which the carrier phase is assumed to be constant. Multiple symbol noncoherent detection of uncoded DPSK and multiple symbol noncoherent detection of uncoded CPM are both well-known. Application to block coded MSK is well-known as is a new block coded MPSK for noncoherent detection. Multiple-symbol differential detection of trellis coded MDPSK is also well-known. Multiple-symbol noncoherent detection of trellis coded modulation has been confined to applications which use differential encoding. Also, no optimization of the code selection has been performed. In all of the above contributions, the observations are independent. In the case of uncoded or block coded modulation, one observation was used for each decision. When convolutional coded modulations were decoded, independent observations were used. In some methods the observations overlap in one symbol and interleaving was used for making them independent. The interleaving function adds extra complexity to the system and causes unwanted delay in the received data, although in some applications such as fading channels, interleaving is required.

The noncoherent decoding of the present invention described below herein can be applied to almost all types of coded modulation, without changing the encoder, and with performance that in general approaches the coherent decoding of these codes as the observation length grows. We also show new codes with high noncoherent performance which are also optimal for coherent decoding (have maximum free distance), and their performance with the efficient noncoherent decoding.

Figure 10:
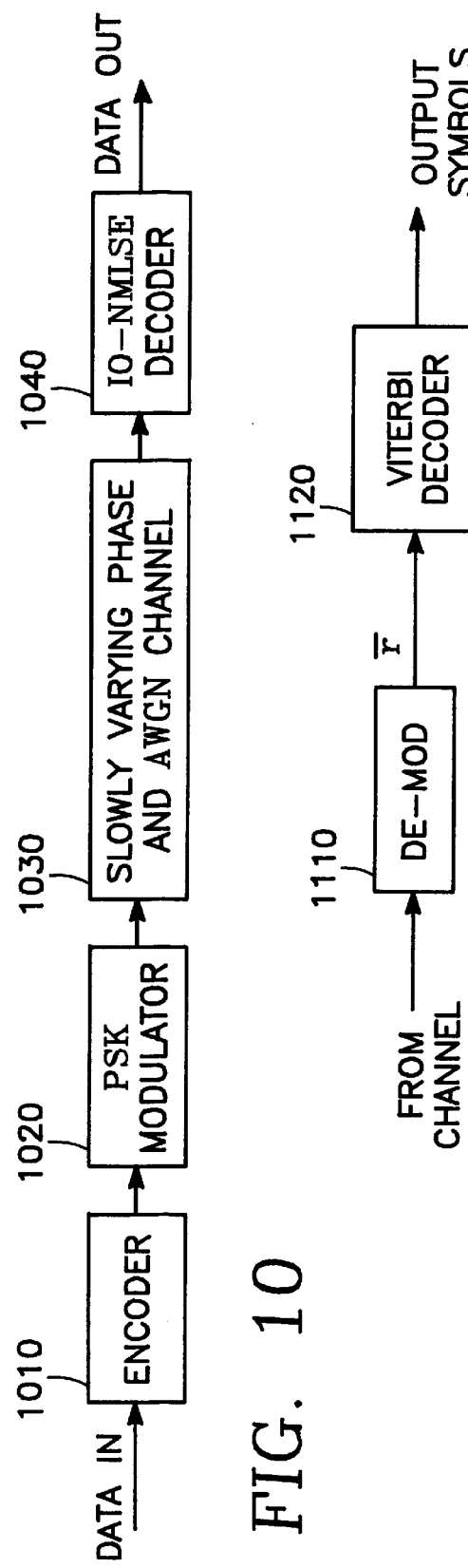
FIG. 10 is a block diagram of a noncoherent coded modulation communication system.

Unlike the previous approaches, we use maximally overlapped observations as illustrated in FIG. 9, which will not and cannot be made independent. We thus utilize the information from all possible (time shifted) observations of length T. When applying this technique to trellis coded modulation, each observation spans several branches of the code trellis. The resulting noncoherent sequence estimator of the invention is described below. The performance of the noncoherent sequence estimator can be shown analytically to approach the performance of the coherent one as the observation length grows and can be applied to many other codes and modulations. This related coded modulation and detection communication system is referred to hereinafter as "Noncoherent Coded Modulation (NCM)" and is illustrated in FIG. 10. It provides tradeoff between robustness with respect to phase variations (or frequency uncertainty) and power efficiency, by controlling the observation length of the detector. The existence of decoding algorithms, whose complexity depends only slightly on the observation length (which will be described hereinbelow) makes this tradeoff efficient. Referring to FIG. 10, the system includes an encoder 1010, a phase shift key modulator 1020, an AWGN channel 1030 having slowly varying phase and a noncoherent maximum likelihood sequence estimator (IO-NMLSE) 1040. NCM may be attractive even in cases where phase synchronization is not a major problem, since its degradation relative to coherent demodulation can be smaller than the degradation caused by imperfect phase estimation.

The noncoherent codes include the linear convolutional codes used with BPSK modulation. The existing coded systems with coherent detection (for example the codes used in the NASA Deep Space Network) can be modified to be used with the suggested detection ith negligible degradation. The only limitation to this is that the code should not be a noncoherently catastrophic one. In coherent coded modulations, in cases where enough bandwidth is available, better performance can be achieved with lower code rates without considerably increasing the complexity. In the same way, it is possible to trade bandwidth efficiency with power efficiency in NCM. Note that this trade is not efficient when using conventional detection of coded DPSK or MFSK.

5 The Noncoherent Sequence Estimator

The Optimal Noncoherent Maximum Likelihood Sequence Estimator (NMLSE) depends on the statistics of the time varying carrier phase. When such statistics are unavailable, the derivation of the optimal NMLSE must start from some broad assumptions. The commonly used assumption is that the carrier phase is constant (but completely unknown) during some observation interval (t, t+T) for any t. This common assumption is reformed as follows.

If the phase is constant over any interval of a certain length, then it has to be constant everywhere. It is clear that some phase variation should be allowed over the observation time. To make the optimal NMLSE a well-defined problem, the allowed phase variation over the observation interval, and the way to measure it, should be defined. Then, the worst-case phase random process among those which fit into the constraint can be found and used for deriving the maximum of the likelihood function. This approach seems too complex and probably will not lead to any simple implementable solution.

In previous approaches, the observations were either independent or overlapping in one symbol. The invention employs maximally overlapped observations, making use of the fact that the carrier phase can be assumed to be constant for any observation of length T. Thus, the channel memory is utilized in a more efficient manner. In fact, it will be shown in the results that the decoding performance can be improved by increasing the overlapping ratio κ (which will be defined shortly). It is further assumed that the observations, even when they overlap in time, are independent, and have independent phases. We call the resulting estimator Independent Overlapped observations NMLSE (IO-NMLSE). Note that the observations are not made independent by any means. They are only treated as such for the derivation of the estimator, thus leading to a sub-optimal solution for the NMLSE.

In the case of coded DPSK, which uses two-symbols observations, the overlapping is inherent. However, the observations are commonly made independent by interleaving.

The IO-NMLSE discriminates between a set of possible transmitted waveforms $\{x_i(t)\}$ by choosing the signal m which maximizes the following metric:

$$\eta(x_m(t), \tau) = \sum_{k=-\infty}^{\infty} \log Q_m(k\tau, k\tau + T), \quad (21)$$

where $Q_m(T_a, T_b)$ is the ML metric for one observation interval, $T_a \leq t \leq T_b$, k is the observation number, τ is the observations spacing and T is the observation length. The choice of τ is a tradeoff between maximizing bit error rate (BER) performance and minimizing system complexity. The complexity is approximately proportional to ½.

$$Q_m(T_a, T_b) = \exp\left[-\frac{\alpha^2}{2}\int_{T_a}^{T_b} x_m(t)q_m^*(t)dt\right] I_0\left[\alpha\left|\int_{T_a}^{T_b} r(t)q_m^*(t)dt\right|\right], \quad (22)$$

where r(t) is the received waveform (both x(t) and r(t) appear in the baseband representation), α is the channel attenuation and $q_m(t)$ is defined in Chapter 6 of Proakis, Digital Communications, (McGraw Hill, N.Y. 1989).

The overlapping ratio is $\kappa=(T-\tau)/T$ and has values between 0 and 1. In the case of κ=0, we get non-overlapped observations.

In the case of additive white Gaussian noise with one sided spectral density $N_0$, $q_m(t)=x_m(t)/N_0$. In the case of equal energy signals, the estimator can as well maximize $$\eta(x_m(t), \tau) = \sum_{k=-\infty}^{\infty} \log I_0\left[\frac{\alpha}{N_0}\left|\int_{k\tau}^{k\tau+T} r(t)x_m^*(t)dt\right|\right]. \quad (23)$$

For low SNR (small argument) the log $I_0(x)$ function is approximated by $x^2/4$, leading to an estimator which maximizes the metric $$\eta(x_m(t), \tau) = \sum_{k=-\infty}^{\infty} \left|\int_{k\tau}^{k\tau+T} r(t)x_m^*(t)dt\right|^2. \quad (24)$$

We have confirmed by simulations that the use of this approximation does not lead to any noticeable performance degradation. In a digital implementation, where $x_m(t)$ is a sequence of symbols of duration $T_s$ and each symbol is constructed using a 2×D dimensional signal space, the metric can be written as $$\eta(\overline{x}^{(m)}, l) = \sum_{k=-\infty}^{\infty} \eta_k = \sum_{k=-\infty}^{\infty} \left| \sum_{i=0}^{S-1} \overline{r}_{lk-i}^\dagger \overline{x}_{lk-i}^{(m)} \right|^2, \quad (25)$$

where S is the observation length in symbols, l (an integer) is the observations spacing in symbols, and for every symbol i, $\overline{r}_i$ is a complex vector which assumes the output of D complex matched filters, each for one complex dimension of modulation. The sequence of vectors of dimension D, $\overline{x}^{(m)}$, is the signal space representation of $x_m(t)$. Let us define L as the number of trellis branches which are covered by one observation, i.e., $\lceil L=S/n \rceil$ (assuming l is a multiple of n; or else, in some cases it is necessary to add 1), where n is the number of symbols in a trellis branch. L is more important than S since it determines the complexity of the decoder and also relates more closely to the actual observation time T. Unless stated otherwise, we will use l=n for maximal overlapping and convenient decoder implementation.

If the code is not noncoherently catastrophic (see next section), then as S increases (and the allowed phase variations are reduced appropriately), the performance of the IO-NMLSE approaches that of the MLSE with a completely known phase. This provides a tradeoff between robustness to phase variations and power efficiency.

EXAMPLE 6.1

Suppose that we want to discriminate between two possible received signals $\{r_1, \ldots, r_8\}$; one is $\{1, 1, 1, 1, 1, 1, 1, 1, \}$ and the other is $\{1, 1, 1, 1, -1, -1, -1, -1\}$. Assume that our observation ignores the absolute phase. By taking the non-overlapping observation $\{r_1, \ldots, r_4\}$ and $\{r_5, \ldots, r_8\}$, it is clear that the two possible received signals are indistinguishable. By adding the observation $\{r_2, \ldots, r_5\}$, we are able to distinguish between the two hypotheses; for the first case we get $\{1, 1, 1, 1\}$, and for the second case we get $\{1, 1, -1, -1\}$. This shows the importance of the overlapped observations.

7 Linear Noncoherent Coded Modulation

We suggest the use of a specific type of trellis coded modulation called Linear Noncoherent Trellis Coded Modulation (LNTCM) in conjunction with the maximum likelihood sequence estimator of the invention. This code exhibits the UEP (Uniform Error Property) for noncoherent detection. This property simplifies the analysis and helps us in the search for good codes. The UEP means that the error probability is not dependent on the specific codeword that was sent. By using this property, we do not have to check all possible pairs of codewords in order to find the decoder error probability when using the union bound.

When using coded modulation and a noncoherent metric, the linearity of the code does not imply that the code exhibits the UEP. The LNTCM are codes who indeed satisfy the UEP under noncoherent detection. The present description is limited to convolutionally coded PSK modulation. For these codes the LNTCM reduces to the following codes.

Let K be the constraint length of the code, B be the number of input bits per trellis branch and $R=2^B$ be the number of branches reaching a node, and also the number of phases in the MPSK modulation. $R^{K-1}$ is the number of states and n is the number of PSK symbols in one branch. Let the input group and the output group be the modulo R set of integers $Z_R$, i.e., the input field is not GF(2) for R>2. The encoder consists of a shift register of K stages; each stage contains an integer between 0 to R-1. Each output i of the encoder is generated by a modulo R weighted sum of the shift register contents and the generator $G_i=(\alpha_{i,1}, \alpha_{i,2}, \ldots, \alpha_{i,K})$, $0 \leq \alpha_{i,j} < R$.

The output is mapped to the phase of the PSK signals linearly (not by set partitioning). The rate of the code is B/nB, which means that for every trellis branch, B bits are entering the encoder and nB bits are getting out, followed by a mapping to n PSK symbols. Other rates are also possible by having multiple shift registers or using punctured codes.

8 Searching for Good Codes

Given a specific observation length and code parameters, the optimal code was found by a computer search. The minimum Euclidean distance serves only as a lower bound, thus it is not very useful for NCM selection.

We have used the bit error probability bound as the optimization criterion, but we took care to minimize the maximum error event probability as much as possible. For small K, R and n, the number of possible codes is not too large and a one by one search was performed to check all possible codes in order to find the optimal one. For larger values of the parameters, this method is not practical. In this case, the codes to be tested were produced at random. Since there is a large number of good codes, the probability of finding one of these good codes is not too small.

With either method, a large number of codes had to be checked. By observing symmetry properties of the codes, we can reduce the number of codes to be checked. For example, a code and its reverse (the generators are reversed) have exactly the same performance, since all the possible error events are reversed. Permutating the generators yields to an equivalent code, and the same thing happens if we conjugate all the generators' coefficients. For each code, we have to compute the error probability of each of the possible error events. Since there is an infinite number of error events, we will consider only error events limited to a finite length. Error events longer than those are assumed to have only a small contribution to the error event probability.

The exact error probability computation for an error event involves the computation of the eigenvalues and eigenvectors of a matrix and the computation of the quadratic form cumulative distribution. We have used simple lower bound criteria for fast preselection of codes to speed up the search. The search was performed in four stages, alternating preselection rules with exact computation, and in each stage M is increased. The first preselection is based on the computation of the correlation (absolute squared) of the sequence with the all-Z sequence, $$\rho = \left| \sum_{i=0}^{N-1} \overline{\phi}_i^\dagger \overline{x}_i \right|^2. \quad (26)$$

The total correlation can be used to compute a lower bound on the error probability. Our decoder cannot be better than the optimal way of deciding between two hypotheses under random phase conditions. The latter has an error probability (for a constant symbol energy) which is a function of the correlation ρ and the sequence length N. For the fast preselection, ρ was compared to a threshold which is a precomputed function of N. The error probability of binary noncoherent block detection is found in Section 4.3.1 of Chapter 6 of Proakis, Digital Communications. This lower bound is tighter than the one based on the Euclidean distance which is the coherent error probability.

The second preselection rule was based on the high SNR approximation, which upperbounds the pairwise error probability.

The code search procedure consists of four stages. Every code must pass three stages, and then in the fourth stage the final calculation of bit error probability is being made. In the first stage, which is the fastest, all the error events of length up to K+2 are checked against the preselection rules described above. Having passed the first stage, the code reaches the second stage, in which an exact error probability calculation using all error events up to length K+2 is performed. To pass the second stage, both the maximal probability and the union bound must pass thresholds. In the third stage, the fast preselection is applied again, but now, to all error events up to a maximal length depending on the allowed computing time. In the fourth stage, an exact probability computation is done using error events of length less or equal to a certain length, again limited by computing power. The result of the final stage is the base for choosing the optimal code. The probability calculation is done for a specific $E_b/N_0$, and L whose values will slightly influence the optimal code selection.

The codes to be presented in the next section are some of the results of this computer search. For the BPSK and QPSK case we have used L=4, and for the 8PSK case we have used L=3. The codes that the BPSK or QPSK are also found to be maximum free distance codes. This shows their optimality to either coherent or noncoherent detection.

9 Results of the Search for Good Codes

The best codes for noncoherent detection found in the search include (a) ½ coded BPSK with K=5 (16 states), (b) ⅔ coded QPSK with K=3 (16 states), (c) ⅔ coded QPSK with K=4 (64 states), (d) ⅖ coded QPSK with K=4, and (e) ⅗ coded 8Psk with K=4.

Fortunately, except for the case K=7, rate ½ convolutionally coded BPSK, the optimum codes found also have maximum free distance, thus they are also optimal for coherent detection. The best convolutional codes are tabulated in Table 5.3 of Chapter 6 of Proakis, Digital Communications. For the K=7, rate ½ case the free distance of the best found NCM is 9, while the maximum free distance possible for K=7, rate ½ is 10. For the BPSK and QPSK cases, we get a fair comparison between noncoherent and coherent detection. By fair comparison we mean that the best found NCM is also optimal for coherent detection, thus the performance curves for this code will reflect the best possible for either case. For the case of 8PSK, it is difficult to make fair comparison since to the best of our knowledge no optimal rate ⅗ TCM using 8PSK has been published. However, the coherent results, for the 8PSK code found, are very good (compared to BPSK and QPSK). Thus, we get a good comparison between coherent and noncoherent detection also in this case.

We see that as the observation length grows, the performance of the noncoherent detection approaches that of the coherent, and we observe that the rate of convergence seems to be only slightly dependent on the SNR.

10 Decoding the Noncoherent Trellis Coded Modulation

We have introduced the notion of Noncoherent Trellis Coded Modulation (NTCM), the noncoherent decoding of multi-dimensional trellis coded modulation. The sequence estimator used for the noncoherent decoding is the Independent Overlapped observations Noncoherent Maximum Likelihood Sequence Estimator (IO-NMLSE). In this chapter, we present and evaluate several practical decoding algorithms for NTCM. First, we describe the use of the Viterbi Algorithm (VA) for an optimal decoding by the IO-NMLSE. Optimal decoding requires the use of an augmented trellis diagram with a number of states that grows exponentially with L, the observation length in symbols. Thus, it is practical only for small L. Then, we present three suboptimal algorithms that perform close to optimal, yet with complexity which does not grow exponentially with L. These algorithms, which are based on the VA, use the trellis diagram of the original code. Thus, the number of states does not increase, and the dependence of the complexity on L has linear affinity. The first suboptimal algorithm to be described below is called the Basic Decision Feedback Algorithm (BDFA). In this algorithm, the symbols from the decisions are fed back to be used in the subsequent decisions. This algorithm suffers from increased error event probability and from error propagation (to be abbreviated as e.p.). However, by a small modification of the BDFA, we obtain another improved algorithm, which will be called Modified DFA (MDFA). For some practical codes, degradation of 0.5–1 dB relative to the optimum is demonstrated. The MDFA still has degradation relative to the optimal algorithm, thus a better algorithm is desired. The third algorithm, the Estimated Future Decision Feedback Algorithm (EFDFA), which uses the BDFA as a basic building block, is based on a novel concept called "estimated future," and performs very close to the optimal in most practical cases. Its degradation is high SNR ($R_b<10^{-3}$) is negligible. The degradation of the suboptimal algorithms can be overcome by employing error detection, and processing erroneous blocks off-line using an optimal algorithm. If the probability of error is low, the off-line process can be complex, since more time is available for its completion (causing delay in the decoding of that block).

The encoder uses trellis coded modulation which has the following parameters:

N—number of states.
B—number of input bits per branch.
$R=2^B$—number of branches reaching a node.

The trellis is assumed not to contain parallel transitions. However, only minor changes in the algorithms are required to remove this restriction.

11 Optimal IO-NMLSE Implementation by the Viterbi Algorithm

Figure 11:
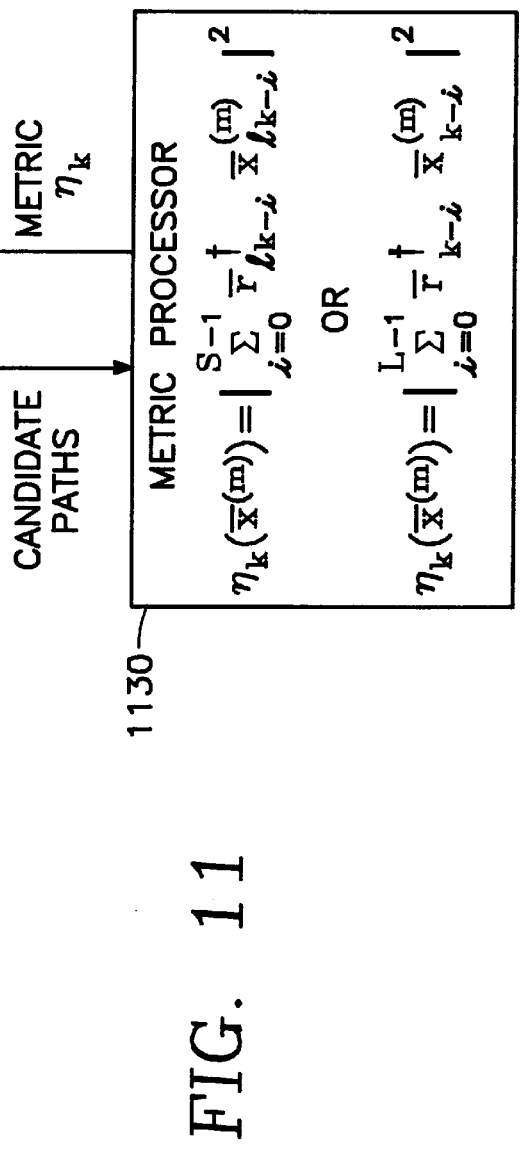
FIG. 11 is a block diagram of an IO-NMLSE receiver implemented with a Viterbi decoder.

It seems natural to choose the Viterbi Algorithm (VA) for implementing the IO-NMLSE. A receiver incorporating this algorithm is illustrated in FIG. 11. A demodulator 1110 provides received symbols to a Viterbi decoder 1120. The Viterbi decoder forms candidate paths through the trellis of states, which are evaluated using a metric processor 1130 by computing a metric for each candidate path. The decoder 1120 employs these metrics in deducing the output symbols. However, the VA cannot be used without modification. We cannot use $\Delta\eta_k$ as the branch metric since it is a function of the current branch value $x_k$ together with the previous branch values $\{x_{k-1}, \ldots, x_{k-L+1}\}$. Since the tentative decisions made by the VA should not affect the following branch metrics, this choice of metric will not cause optimal operation of the VA as a maximization algorithm. If we insist on using this metric in the VA, we get a suboptimal algorithm that will be described in the next section below. In order to make the branch metrics independent of previous decision, we can construct a new trellis diagram with $NR^{L-1}$ states as follows.

Figure 13:
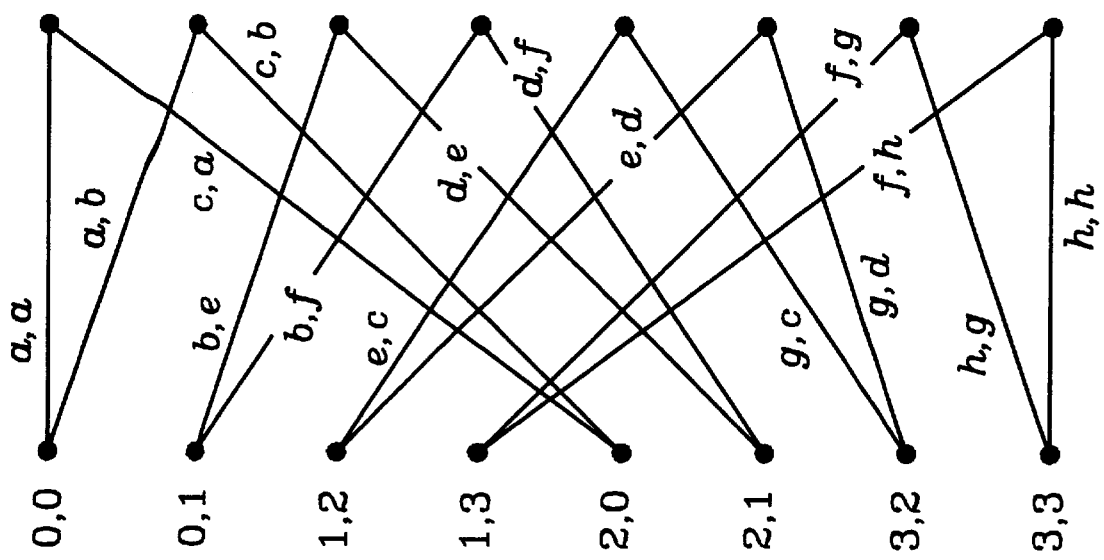
FIG. 13 is a diagram of a trellis code obtained by augmenting the trellis code of FIG. 12.
Figure 12:
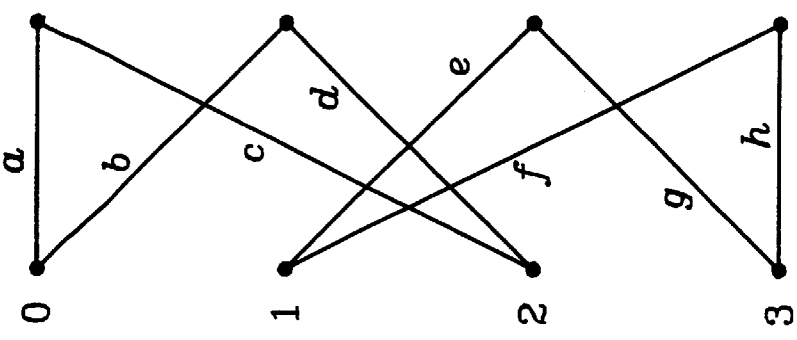
FIG. 12 is a diagram of one example of an original trellis code.

A state in the new trellis will be assigned to each of the possible sequences of l consecutive states $\{z_0, \ldots, z_{L-1}\}$ that can be produced by the original trellis. The original transitions from state $z_{L-1}$ to state $z_L$ are mapped to transitions from state $\{z_0, \ldots, z_{L-1}\}$ to state $\{z_1, \ldots, z_L\}$ for all possible choices of $\{z_0, \ldots, z_L\}$. The corresponding branch value is the sequence of symbols $\{x_0, \ldots, x_{L-1}\}$ which is the output of the path $\{z_0, \ldots, z_L\}$ on the original trellis. An example of an original trellis is illustrated in FIG. 12 while the corresponding new trellis modified from the original in accordance with the foregoing is illustrated in FIG. 13. When using the new trellis, $\Delta\eta_k$ is a function of the branch value only, enabling correct maximizations of the metric by the VA. Note that having $NR^{L-1}$ states is sufficient but not necessary. Note that in some cases the number of states can be reduced since what is important to the independence of the branches' metrics is that the state should correspond to the L−1 previous symbols and not necessarily to the L−1 previous states.

An alternative, but essentially equivalent, diagram of a new trellis can be constructed from the original in a more simple way as follows. The equivalent code is produced by adding L−1 unconnected stages to each of the shift registers which generates the code. These stages are only used for the purpose of delaying the merge of two sequences on the trellis by L−1 symbols. During this "waiting period" the outputs of the two sequences are equal and in this way we eliminate the influence of the unknown future after the merge. By using an example, let us demonstrate that this code has no future dependence. Let us have one shift register in the encoder, L=4 and K=3. We change K to 6 by adding 3 unconnected stages. We have the following two paths leading to the same final state.

$$abcde \xrightarrow{f\,abcde} f\,abcd \xrightarrow{g\,f\,abcd} g\,f\,abc \xrightarrow{hg\,f\,abc} hg\,f\,ab,$$

$$abijk \xrightarrow{f\,abijk} f\,abij \xrightarrow{g\,f\,abij} g\,f\,abi \xrightarrow{hg\,f\,abi} hg\,f\,ab.$$

The numbers are represented in base R (Least significant . . . Most significant) such that every letter represents a digit which is contained in one stage of the shift register. The states are shown between the arrows and above the arrows are the shift register contents which determines the output. We can see that in the last three (L−1) steps, the shift register contents differ only in the last three stages, and since they are unconnected, the corresponding outputs are equal. With any common future path, these two candidate paths have the same output symbols sequence for time t−L+1 to t+L−1 where the decision is made at time t. As a result, any two sequences of length L which include future symbols, each taken from one of the two candidate paths, are the same. We see that here the unknown future cannot influence the decision, thus the decisions are optimal.

12 The Basic Decision Feedback Algorithm

We would like to use $\Delta\eta_k$ as the metric in the VA, using the original code trellis instead of the augmented one. Doing so, the number states as well as the number of correlations stay constant as L increases. Only the number of complex multiplication per correlation grows with L.

Figure 14:
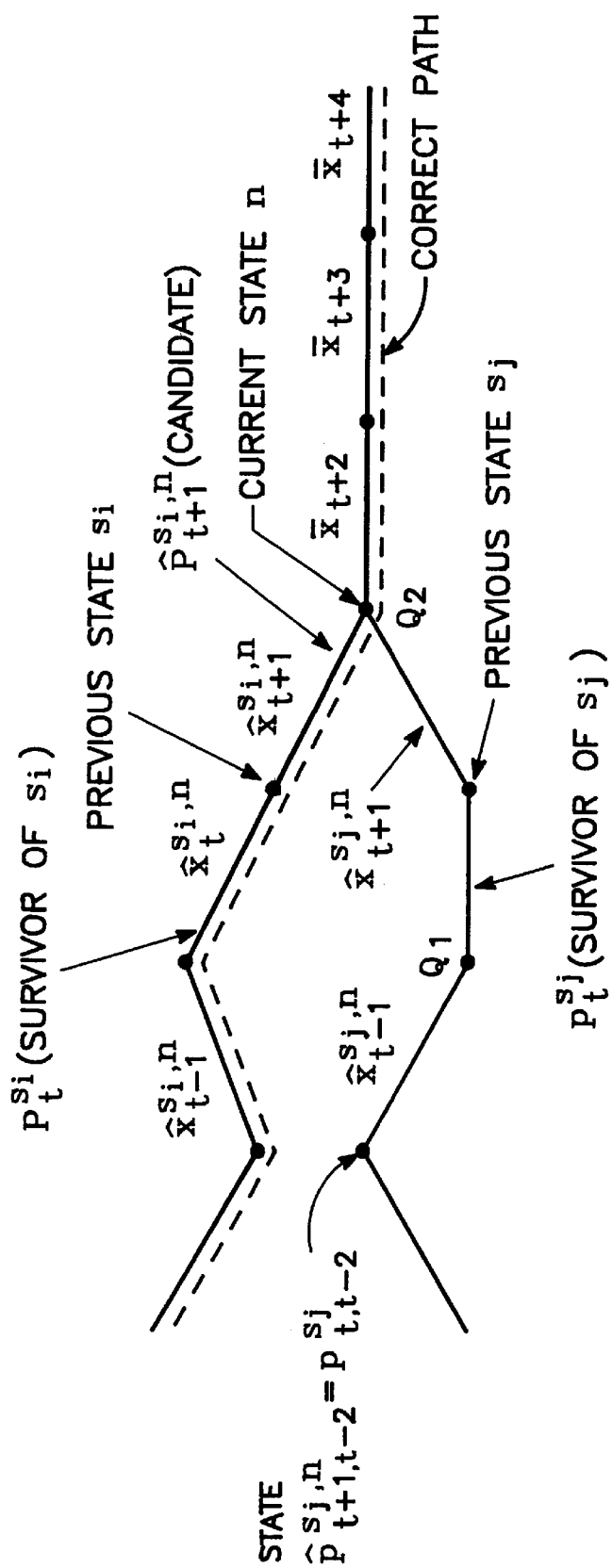
FIG. 14 is a diagram of candidate paths states through a trellis obtained in the operation of maximum likelihood sequence estimation algorithms of the present invention.

In order to get the metric for the branch connecting the previous state to the current state, the received symbols are correlated with the L last symbols of the candidate path (the concatenation of the survivor path ending in the previous state with the branch connecting the previous to the current state). This metric is added to the accumulated metric of the survivor path. The accumulated metric, as in the VA, is saved in the accumulator array indexed by the previous state number. Note that the metric computation for time t makes use of the decisions made at times t−1, . . . , t−L+1. This can be viewed as if the decisions are fed back to the decoder. The progress of this process through the trellis is illustrated in FIG. 14, while the steps of the process itself are illustrated in the flow diagram of FIG. 15. The process will now be described in detail with simultaneous reference to FIGS. 14 and 15.

Let $Z=\{z_0, \ldots, z_k\}$ be a path or sequence of states of the trellis. Then define the accumulated metric of the path at time $t (t \leq k)$ as $$\eta(Z)_t = \sum_{k=0}^{t} \left| \sum_{j=0}^{L-1} r^\dagger_{k-j} x_{k-j} \right|^2, \qquad (27)$$

where $x_k$ is the output associated with the trellis branch connecting $z_{z-1}$ with $z_k$. For $k \leq 0$, $x_k = 0$ by definition. If t is omitted, then we use the entire path, i.e., $\eta(Z)=\eta(Z)_k$.

For each state s and time t, the algorithm keeps track of the associated survivor, i.e., the most likely path of previous states, $$P_t^s = \{p_{t,0}^s, \ldots, p_{t,t-1}^s, p_{t,t}^s\}, p_{t,t}^s = s, \qquad (28)$$

where $p_{t,k}^s$ denotes the state indexed by k in the list $P^t_s$. The last state in the list, $p_{t,t}^s$, is always the current state s. Only the last m (truncation length) states are actually stored by the decoder. The algorithm also keeps track of an accumulator metric $$J_t^s = \eta(P_t^s). \qquad (29)$$

Out of all N data paths $P_t^s$, the one with the largest metric value, $J_t^s$, has the greatest likelihood. The input data which corresponds to the branch in that path connecting the two "oldest" states $p_{t,t-M}^s$ and $p_{t,t-M+1}^s$ serves as the final estimate of the BDFA of the transmitted data delayed by M−1 symbols. To achieve near-MLSE performance, M should be much larger than the memory, K, of the encoder. In our simulations we have used M>5K, like in the VA, and the survivors have always converged as expected. Since the BDFA is a recursive process, it contains provisions for the recursive update of $P_t^s$ and $J_t^s$. Denote the next state that follows the present state s for the input symbol $0 \leq i < R$ by next(s,i). Each path $p_t^s$ is appended with each one of the state $n_i = \text{next}(s,i)$, i=0, . . . , R−1, to form the candidate paths $\hat{P}_{t+1}^{s,n_i} = \{p_{t,0}^s, \ldots, p_{t,t-1}^s, s, n_i\}$. There are R paths $\hat{P}_{t+1}^{s_i,n}$ which end is state n. For each of them, $\hat{J}_{t+1}^{s_i,n}$ is computed by the formula $$\hat{J}_{t+1}^{s_i,n} = J_t^{s_i} + \left| \sum_{j=0}^{L-1} r^\dagger_{t+1-j} \hat{x}_{t+1-j}^{s_i,n} \right|^2, \qquad (30)$$

where $\{\hat{x}_k^{s_i,n}\}$ are the output symbols of the path $\hat{P}_{t+1}^{s_i,n}$. The index i which maximizes $\hat{J}_{t+1}^{s_i,n}$ is used to update $J_{t+1}^n$ and $P_{t+1}^n$, by $J_{t+1}^n = \hat{J}_{t+1}^{s_i,n}$ and $P_{t+1}^n = \hat{P}_{t+1}^{s_i,n}$ correspondingly.

Figure 15:
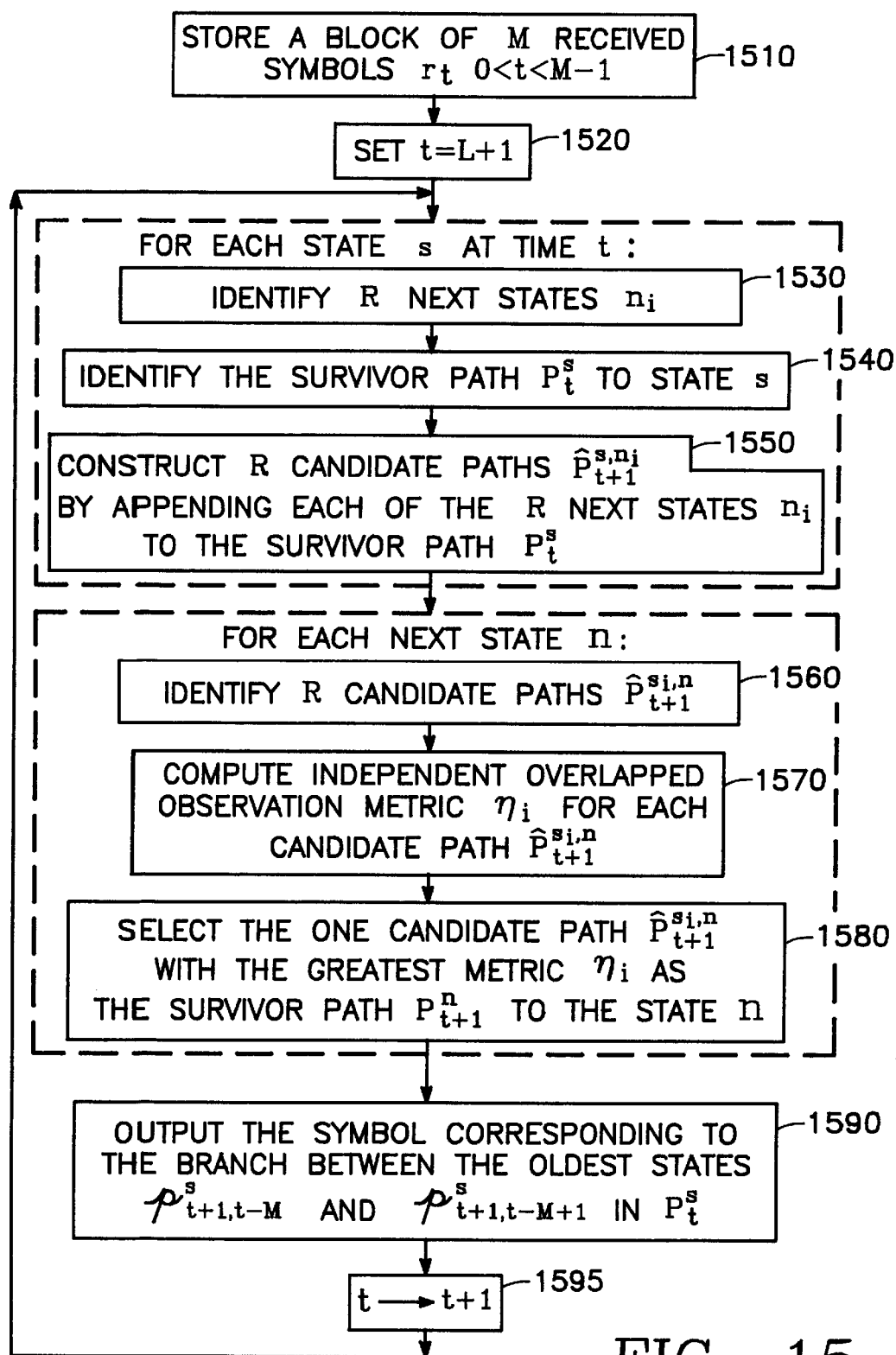
FIG. 15 is a flow diagram illustrating the operation of a first decoder of the present invention employing a BDFA process.

Referring to FIGS. 14 and 15, the foregoing process begins by storing a block of M received symbols r (block 1510 of FIG. 15) and initializing the time t (block 1520 of FIG. 15). Then, for time t and for each state s on the trellis, the process identifies the R next states n branching from s (block 1530), recalls the survivor path to s (block 1540) and constructs R candidate paths from s by appending the R next states n to the survivor path (block 1550). Thereafter, for each next state n, the process recalls the R candidate paths constructed in the step of block 1550 (block 1560), computes the metric of each candidate path (block 1570) and selects the candidate path with the greatest metric as the survivor path to state n (block 1580). The process then outputs the symbol corresponding to the branch between the oldest states stored in the survivor paths (which have converged into one path at that early point in time) (block 1590). The time is incremented (block 1595) and the process returns to the step of block 1530 to begin the next cycle.

The foregoing process may be summarized with reference to FIG. 15 as follows: In a communication system receiving from a channel a received signal corresponding to a succession of received symbols during a corresponding succession of symbol times, the succession of symbols corresponding to a succession states of a code of the communication system, each of the states branching to a predetermined number of others of the states, the process deduces an estimate of the succession of symbols from the received signal by overlapping observations of the received signal. The process includes storing a block of symbols of the received signal (block 1510 of FIG. 15), then, for each one of the states at a current symbol time of the received signal, identifying a previously stored survivor path of states corresponding to the received signal leading to the one state (block 1540). The process then forms plural candidate paths from the one state by appending (block 1550) to the survivor path next ones of the states branching from the one state (identified in block 1530). For each one of the plural candidate paths (block 1560), the process computes a path metric including a sum of products of symbols corresponding to the succession of state in the one candidate path and a corresponding succession of symbols in the received signal extending back from the next state of the one candidate path over a predetermined number of prior symbol times (block 1570). For each of the next states, the process selects one of the plural candidate paths having the greatest path metric as the survivor path to the corresponding one of the next states and stores the survivor path to the one next state (block 1580). The final result of each cycle of the process is outputting a symbol of one of the survivor paths corresponding to an earlier symbol time displaced from the current symbol time by a predetermined delay (block 1590).

This algorithm seems likely to result in a survivor path that has the largest metric. This is true most of the time, but not always. The VA assumes that when a decision is made, it does not depend on future decisions. This will not apply in our case. We are deciding L−1 symbols too early. We should have decided on the branch of a state in time t, after we included the contribution of the symbols on the path emerging from this state continuing up to time t+L−1. After time t+L−1, there no longer is a dependence between the future symbols and the current decisions. As will be seen below, if we want to make the correct decision, we may want to include the future path of L−1 symbols to the candidate paths of our current decision. But, for every state, there are $R^{L-1}$ possible future paths for which we will have to consider each (or at least consider the most probable one). Thus, the complexity of the decoder is increased at least by $R^{L-1}$. Alternatively, we can convert the code to an equivalent one by adding L−1 unconnected stages to the encoder shift register. When such code is used, the BDFA becomes the optimal algorithm.

The suboptimal algorithm causes degradation through two processes. The first is an increase in the error event probability and the second is e.p. The increase in the error event probability can be explained as follows. Each time we make a decision we essentially compare two truncated sequences instead of infinite sequences, as in the IO-NMLSE. The sequences are truncated at the current symbol when we compare and make the decision. In order to make the correct decision, we have to compare the metric of two infinite sequences (both of which are assumed to follow the correct path after the current decision point). However, instead of using infinite paths, it is sufficient to include only the future L−1 symbols in the comparison to make the optimal decision. For example, with L=4 it is better to compare the metric of the two sequences {1,1,1,−1,−1,−1,1,1,1} and {1,1,1,1,1,1,1,1,1} than to compare the metric of the truncated sequences {1,1,1,−1,−1,−1} and {1,1,1,1,1,1}. The first error event probability of the BDFA can be evaluated by the union bound when using the truncated sequences instead of infinite sequences. Only two sequences which pass through the same state are truncated as described when the decoder makes its decision at that state. If there exists a path which has output symbols which are a constant phase shift of the transmitted path symbols, this path is equally likely to be decoded instead of the correct path. This leads to an essentially infinite number of decoding errors if the incorrect path is decoded to different output bits. However, if that incorrect path is decoded to the same output bits, then there is no catastrophic behavior. In this case, additional error events are possible: The paths that diverge from the true path and reach a path with symbols which are a constant phase shift of the transmitted path symbols. For these error events, there is no truncation because the decisions are being made a separate states. We now discuss the e.p., which is the main cause of degradation.

After an error occurs in the decision process, the error probability for future decisions increases. If a new error occurs, further future decisions may be in error in a chain reaction-like fashion. This process of e.p. leads to large error bursts. For some applications this phenomena is not crucial. For example, is a message must be transmitted without error, and any number of errors cause the message to be discarded and re-transmitted.

The mechanism of the e.p. is explained now with reference to FIG. 16. Suppose that Path 1 was transmitted. At point B, a wrong decision has been made (due to the noise), i.e., η(path 1)$_B$<η(path 2)$_B$. Suppose that we could have decided at point B which of the sequences 1 or 2 was transmitted using the accumulated metric up to point A, not up to point B, i.e., using η(•)$_A$ instead of η(•)$_B$. Then we might have decided on Path 1 instead. Let us assume that this is the case, i.e., η(path 1)$_A$>η(path 2)$_A$. Returning to the algorithm, at point A we now decide between Path 3 and Path 2. Path 3 might win even though it would have lost had it been compared to Path 1 at point A. Even though Path 1 has the maximal metric up to point A, Path 3 has won due to the wrong decision made at a point B. Path 3 can deviate from the true path by more symbols than the original error, i.e., Path 2, and still win. After making the first wrong decision, candidate paths will not have to win over the maximal path but over a path whose metric is less than the maximal. The e.p. can continue as long as there are candidates that pass the lower threshold. It is very difficult to predict when this process stops.

We now consider the case where we can use the future symbols of the path in the decisions. In this case we argue that even if we make an error, no e.p. will result. Let us suppose that we could have decided at point B which of the sequences 1 or 2 were transmitted using η(•)$_A$ instead of η(•)$_B$. Suppose that Path 2 won again. In this case no e.p. can occur because when Path 2 was decided at point B (although it is an error), Path 2 had indeed the largest metric (up to point A) so we are truly maximizing the path metric between these three paths. Note that if point A is less than L−1 symbols away from point B, e.p. can still occur in later decisions. An important and not very intuitive fact is that for the same input, error events that occur both in the optimal algorithm and in the BDFA will not cause e.p. in the BDFA.

In the analysis of the following EFDFA algorithm, we will assume that the e.p. length can be modeled by a geometric distribution. This model results from the assumption that whenever we are already in an e.p. event, the probability that it will stop is the same no matter when this e.p. began. In other words the e.p. is assumed to be memoryless. This model holds well for large e.p. events.

13. The Modified Decision Feedback Algorithm

We can improve the decision process of the BDFA even without knowing the future L−1 states emerging from the current state. The new algorithm will be referred to herein as the Modified Decision Feedback Algorithm (MDFA). Let $\bar{x}_i$ be the transmitted symbols. Let us assume that the symbols $\bar{x}_{t+2}, \ldots, \bar{x}_{t+L}$ are known to the decoder when it has to make a decision at time t+1, in accordance with the diagram of FIG. 14. If n is on the correct path, the optimal decision rule is then the following. For each of the new paths $\hat{P}_{t+1}^{s_i,n}$, we compute the metric $\hat{J}_{t+L}^{s_i,n}$ by $$\hat{J}_{t+L}^{s_i,n} = J_t^{s_i} + \sum_{k=t+1}^{t+L} \left| \sum_{j=0}^{L-1} r_{k-j}^\dagger \hat{x}_{k-j}^{s_i,n} \right|^2, \quad (31)$$

where $\hat{x}_j^{s_i,n} = \bar{x}_j$ (the known symbols) if J>t+1. If the next state n where we make the decision is not on the correct path, then there is no meaning to this expression, and using it may cause wrong decisions. Such a wrong decision can only change the paths competing with the correct path in later decisions. For example, in FIG. 14 a wrong decision at point $Q_1$ will change the candidate path competing with the correct path at point $Q_2$. Assuming that the correct path has the largest metric, no other path will win above it no matter which path it is. Thus, the decoding error probability will not increase. We can express the received signal as $r_j = \alpha \bar{x}_j e^{j\theta} + n_j$, where θ is the carrier phase and α is the channel attenuation (both assumed constant over 2L symbols, but unknown). Since we use constant amplitude symbols such that $\bar{x}_j^\dagger \bar{x}_j = 1$, $$r_j^\dagger \bar{x}_j = \alpha e^{-j\theta} + n_j^{554} \bar{x}_j, j=t-L+2, \ldots, t+L. \quad (32)$$

For the correct path (n is correct and $s_i$ is correct), $\hat{x}_j^{s_i,n}$ for j=t−L+1, . . . , t+1, are the correct symbols. Let us define $$\mu = \sum_{j=t-L+1}^{t+1} r_j^\dagger \hat{x}_j^{s_i,n} = L\alpha e^{-j\theta} + \sum_{j=t-L+1}^{t+1} n_j \hat{x}_j^{s_i,n}. \quad (33)$$

Provided that the SNR in L symbols is high enough, $\alpha e^{-j\theta}$ can be estimated by $$\frac{\mu}{L}.$$

Then we can use $$\frac{\mu}{L}$$

as an estimate for $r_j^{554\bar{x}}{}_j$, whenever j>t+1 and use it in (31). We tested several other ways to estimate $\alpha e^{-j\theta}$, but none were more successful than this simple method. To summarize, the change in the algorithm is the following: Compute $$\mu = \sum_{j=0}^{L-1} r_{t+1-j}^\dagger \hat{x}_{t+1-j}^{s_i,n}, \quad (34)$$

$$\tilde{J}_{t+1}^{s_i,n} = J_t^{s_i} + |\mu|^2, \quad (35)$$

and $$\tilde{J}_{t+L}^{s_i,n} = J_t^{s_i} + \sum_{k=t+1}^{t+L} \left| \sum_{j=0}^{L-1} \begin{cases} r_{k-j}^\dagger \hat{x}_{k-j}^{s_i,n}, & \text{if } k - j \leq t + 1 \\ \frac{\mu}{L}, & \text{otherwise} \end{cases} \right|^2. \quad (36)$$

$\tilde{J}_{t+L}^{s_i,n}$ is used as an estimate for $\hat{J}_{t+L}^{s_i,n}$. The index i which maximizes $\tilde{J}_{t+L}^{s_i,n}$ is used to update $J_{t+1}^n$ and $P_{t+1}^n$, by $J_{t+1}^n = \hat{J}_{t+1}^{s_i,n}$ and $P_{t+1}^n = \hat{P}_{t+1}^{s_i,n}$.

Figure 17A:
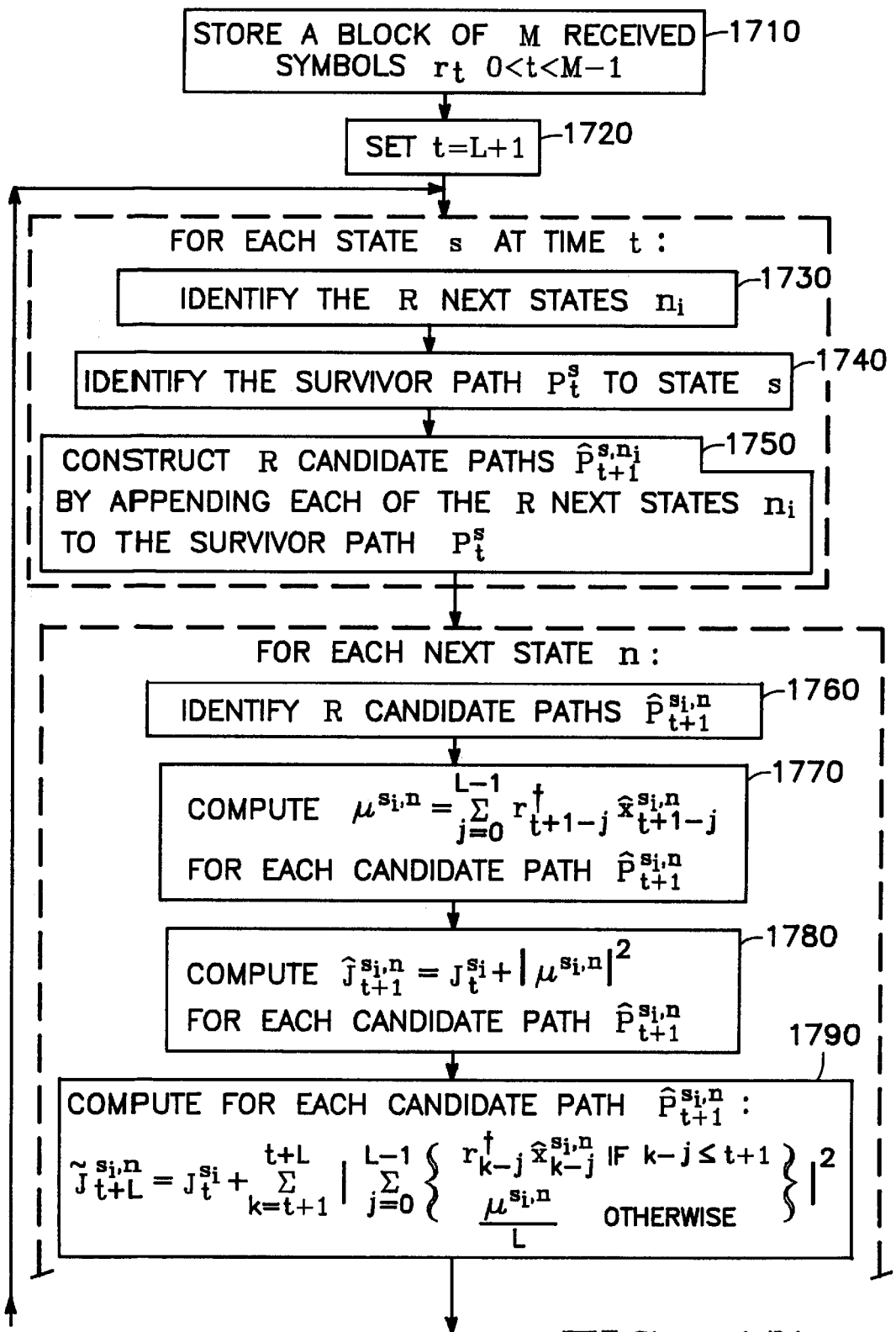
FIGS. 17A and 17B illustrate a flow diagram of the operation of a second decoder of the present invention employing an MDFA process.
Figure 17B:
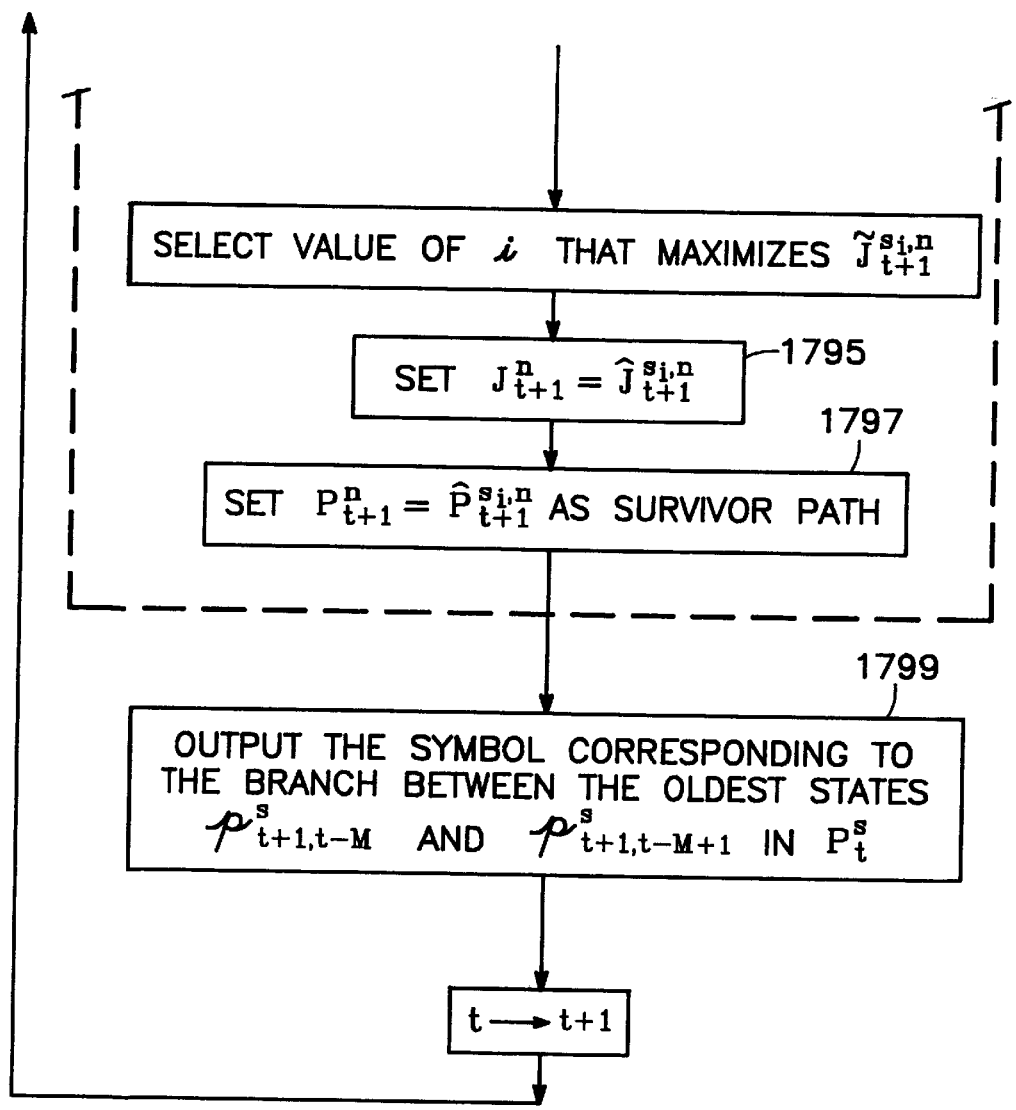

Referring to FIG. 17, the foregoing MFDA process begins by storing a block of M received symbols r (block 1710 of FIG. 17) and initializing the time t (block 1720 of FIG. 17). Then, for time t and for each state s on the trellis, the process identifies the R next states n branching from s (block 1730), recalls the survivor path to s (block 1740) and constructs R candidate paths from s by appending the R next states n to the survivor path (block 1750). Thereafter, for each next state n, the process recalls the R candidate paths constructed in the step of block 1750 (block 1760) and computes the intermediate variable μ for each candidate path including the known future symbols (block 1770). It updates the path metric as a function of μ (block 1780). A final path metric is computed (block 1790) over the old and future states, in which μ is employed in the computation whenever the known future states are involved. The final metric having the greatest value is chosen to update the stored path metric (block 1795) and the corresponding candidate path is chosen as the survivor (block 1797). The process then outputs the symbol corresponding to the branch between the oldest states stored in the survivor paths (which have converged into one path at that early point in time) (block 1799). The time is incremented and the process returns to the step of block 1730 to begin the next cycle.

The algorithm was found to reduce the number of e.p. events significantly. although this algorithm cannot stop e.p. once it has begun (since then μ/L is not a good estimate for $\alpha e^{-j\theta}$), it can reduce the probability of continuing the e.p. event. It was found that the length of the error bursts was reduced considerably compared to the BDFA.

14. Estimated Future Decision Feedback Algorithm

The MDFA still has degradation compared to the optimal algorithm. Thus, a better algorithm is desired. The invention provides an algorithm which performs very close to the optimal algorithm, but with significantly lower complexity. This algorithm, like the BDFA, uses the original code trellis. On the other hand, the optimal algorithm, uses an augmented trellis with a large number of states. The EFDFA complexity is roughly 4 times that of the BDFA. The algorithm uses a novel concept called estimated future to improve the decision process. We have previously recognized that we need to include the future path to make the current decision in order to make optimal decisions in the BDFA. If such a future path is given, but it is not completely reliable, we call it estimated future.

The algorithm works as follows. In each trellis state, at each time, two independent decisions are being made. One is called the no-future (n.f.) decision, which is similar to the BDFA, and the other is a decision using the L−1 estimated future symbols and it is called the with-future (w.f.) decision. The first suffers from e.p. and increased sequence error as discussed in the previous section. The second will make the best decisions as long as the future sequence which is being used is the true one. On the other hand, if wrong future is used for the w.f. decision, then it can cause an error. However, utilizing both the n.f. and the w.f. decisions, one can arrive at a combined decision which chooses the right sequence in an optimal way. How can one possibly know the future? The approach is to save a block of the input signal in memory and perform the DFA (BDFA or MDFA) backwards, starting from the end of the block. After the backward process ends, we have the survivor paths belonging to each state at each time in the trellis within the block. These paths will be used as future estimates. The future estimation performance by this method is as good as the performance of the reversed code (reversing the generators) when decoded with a DFA. The performances of the code and its reversed version can be different only because of the suboptimality of the DFA.

The input stream is divided into overlapped blocks, each block having a length of A+W symbols and starts A symbols after the beginning of the previous block, as illustrated in FIG. 18. The backward process (to be abbreviated by b.p.) operates first and processes the whole block. Then the forward process (to be abbreviated by f.p.) operates on the first A symbols of the block. The f.p. is continuous from block to block. The blocking is intended only for the operation of the b.p. The section of length W is intended for letting the b.p. converge from the initial conditions, in which no particular state is used as a beginning state. This convergence region can be eliminated by inserting K+B(L−2) known input bits at the end of each block of BA input bits, where K is the code memory, and in that way reach a known state at the end of each block. The f.p. and the b.p. operating on the same block are highly correlated.

Referring to FIG. 19, when there is an error event in the f.p., similar error event is also likely to occur in the b.p. However, the initial error and the e.p. following it in the b.p. is going to the other direction—towards the past, leaving the estimated future intact at the time needed for correcting the forward e.p., as illustrated in FIG. 19.

Returning to the issue of the convergence of the b.p., the first decisions in the b.p. are made using very few symbols. In particular, the first decision is based only on the last symbol in the block (remember, we are going backwards so this last symbol is our first). This means that it is probable that we start with an error. Since the b.p. suffers from e.p., the convergence time is similar to the time needed to recover from e.p. This is why it is preferable to use the MDFA for the b.p. instead of BDFA.

For the algorithm description that follows, we are using the BDFA decisions in both the backward decisions and the forward n.f. decisions. Each one of them can be replaced by the modified version without altering the principle of operation.

14.1 The Backward Process

The b.p. operates on a block of length A+W, $kA \leq t < (k+1)A+W$, and is the BDFA going back in time. For each state s, the algorithm keeps track of the associated survivor, i.e., the most likely path of previous states $$Q_t^s = \{q_t^s, (k+1)A+W, q_t^s, (k+1)A+W-1, \ldots, q_{t,t+1}^s, q_{t,t}^s\}, \quad q_{t,t}^s \equiv s, \quad (37)$$

and also of an accumulator metric $$E_t^s = \sum_{k=t}^{(k+1)A+W} \left| \sum_{j=1}^{L} r_{k+j}^\dagger x_{k+j}^s \right|^2, \quad (38)$$

where $x_k^s$ is the output of the trellis branch connecting $q_{t,k-1}^s$ with $q_{t,k}^s$. Denote the previous state which produced s by moving one step forward in the code trellis for the input symbol $0 \leq i < R$ by previous(s,i). For the recursive update of $Q_t^s$ and $E_t^s$, each path $Q_t^s$ is appended with each one of the states $p_i$=previous(s,i), i=0, ..., R−1 to form the candidate paths $\hat{Q}_{t-1}^{s,p_i} = \{q_{(k+1)A+W}^s, q_{(k+1)A+W-1}^s, \ldots, q_{t-1}^s, s, p_i\}$. There are R paths $\hat{Q}_{t+1}^{s,p}$ which end at state p. For each of them, $\hat{E}_{t-1}^{s,p}$ is computed by the formula $$\hat{E}_{t-1}^{s,p} = E_t^{s_i} + \left| \sum_{j=0}^{L-1} r_{t+j}^\dagger \hat{x}_{t+j}^{s,p} \right|^2, \quad (39)$$

where $\{\hat{x}_k^{s,p}\}$ are the output symbols of the path $\hat{Q}t-1^{s,p}$. The index i which maximizes $\hat{E}_{t-1}^{s,p}$ is used to update $E_{t-1}^p$ and $Q_{t-1}^p$.

Figure 20A:
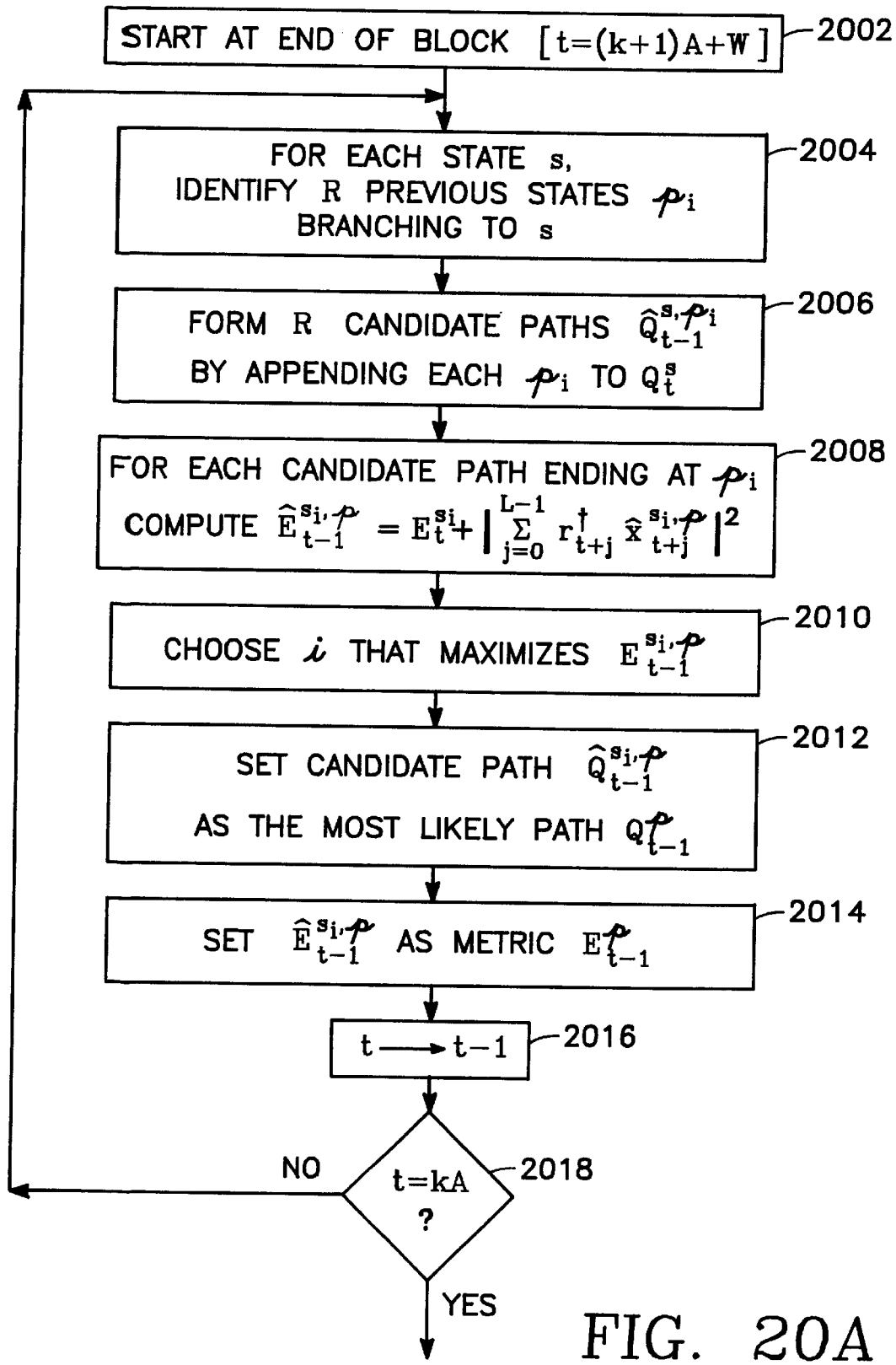
FIGS. 20A, 20B, 20C and 20D illustrate a flow diagram of the EFDFA process of the decoder employing the EFDFA process.

Referring to FIG. 20A, the backward process begins at the end of the data block (block 2002 of FIG. 20A). Then, for time t and for each state s on the trellis, the process identifies the R next states n branching from s (block 2004), recalls the survivor path to s (block 2006) and constructs R candidate paths from s by appending the R next states n to the survivor path (block 2008). Thereafter, for each next state n, the process recalls the R candidate paths constructed in the step of block 2008 (block 2010), computes the metric of each candidate path (block 2012) and selects the candidate path with the greatest metric as the survivor path to state n (block 2014). The process then outputs the symbol corresponding to the branch between the oldest states stored in the survivor paths (which have converged into one path at that early point in time) (block 2016). The time is decremented (block 2018) and the process returns to the step of block 2004 to begin the next cycle.

14.2 The Forward Process

Given the estimated future (contained in Q), the f.p. works as follows: For each state s, the algorithm keeps track of two associated survivors. The first, $C_t^s$, is called the n.f. survivor and is our best guess of the ML path.

$$C_t^s = \{\ldots, C_{t,t-k}^s, C_{t,t-k+1}^s, \ldots, C_{t,t-1}^s, C_{t,t}^s\}, \quad c_{t,t} \equiv s. \quad (40)$$

Here $C_{t,k}^s$ denotes the state indexed by k in the list $C_t^s$. For every path $C_t^s$ there is an associated accumulator metric $$G_t^s = \eta(C_t^s). \quad (41)$$

The second survivor, $F_t^s$, is called the w.f. survivor and is used as a temporary variable.

$$F_t^s = \{\ldots, f_{t,t-k}^s, f_{t,t-k+1}^s, \ldots, f_{t,t-1}^s, f_{t,t}^s, f_{t,t+1}^s, \ldots, f_{t,t+L-1}^s\}. \quad (42)$$

Its associated accumulator metric is $$H_t^s = \eta(F_t^s). \quad (43)$$

F is constructed such that $$f_{t,t}^s = s \text{ and } f_{t,t+i}^s = q_{t,t+i}^s, \; i=1,\ldots,L-1. \quad (44)$$

F is the path that includes the future estimate. It extends from the state s at time t, L−1 symbols, towards the future. As in the implementation of the VA, only M (truncation length)

last states need to be saved in each path list. The algorithm works recursively. Each time we do the following:

Step 1. For each state s, form the w.f. candidate path $\hat{F}_{t+1}^{s,m}$, $m=q_{t,t+1}^s$, by appending the state $q_{t,t+L}^s$ to $F_t^s$ (block 2020 of FIG. 20B).

Figure 20B:
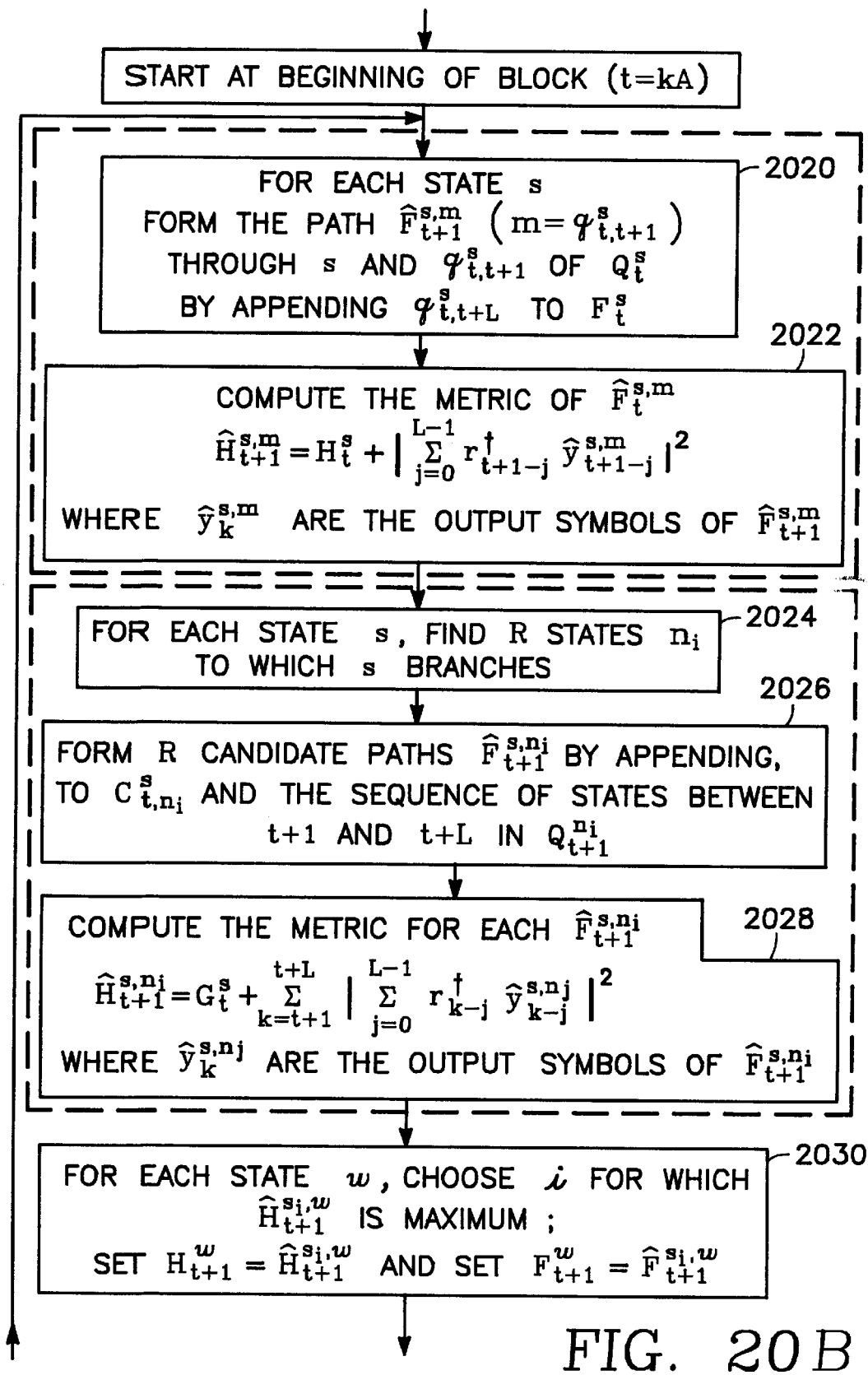

Step 2. For each $\hat{F}_{t+1}^{s,m}$, compute the accumulated metric $\hat{H}_{t+1}^{s,m}$ by $$\hat{H}_{t+1}^{s,m} = \eta(\hat{F}_{t+1}^{s,m}) = H_t^s + \left| \sum_{j=0}^{L-1} r_{t+1}^\dagger \hat{y}_{t+1-j}^{s,m} \right|^2, \quad (45)$$

where $\{\hat{y}_k^{s,m}\}$ denotes the output symbols of $\hat{F}_{t+1}^{s,m}$ (block 2022 of FIG. 20B).

Step 3. For each state s, find the next states $n_i$=next(s,i) i=0, ..., R−1 (block 2024 of FIG. 20B). For every $n_i \neq m$ form the w.f. candidate path $\hat{F}_{t+1}^{s,n_i}$ by appending the sequence $\{n_i, q_{t+1,t+2}^{n_i}, q_{t+1,t+3}^{n_i}, \ldots, q_{t+1,t+L}^{n_i}\}$ to $C_t^s$ (block 2026 of FIG. 20B).

Step 4. For each $\hat{F}_{t+1}^{s,n_i}$, compute the accumulated metric $\hat{H}_{t+1}^{s,n_i}$ by $$\hat{H}_{t+1}^{s,n_i} = \eta(\hat{F}_{t+1}^{s,n_i}) = G_t^s + \sum_{k=t+1}^{t+L} \left| \sum_{j=0}^{L-1} r_{k-j}^\dagger \hat{y}_{k-j}^{s,n_i} \right|^2, \quad (46)$$

where $\{\hat{y}_k^{s,n_i}\}$ denotes the output symbols of $\hat{F}_{t+1}^{s,n_i}$ (block 2028 of FIG. 20B).

Step 5. (w.f. decision) For each state w, there are a total of R values $\hat{H}_{t+1}^{s_i,w}$. The index i which maximizes $\hat{H}_{t+1}^{s_i,w}$ is used to update $H_t^w$ and $F_t^w$ by $H_{t+1}^w = \hat{H}_{t+1}^{s_i,w}$ and $F_{t+1}^w = \hat{F}_{t+1}^{s_i,w}$ (block 2030 of FIG. 20B).

Step 6. For each state s and input i=0, ..., R−1 (block 2032 of FIG. 20C), form the n.f. candidate path $\hat{C}_{t+1}^{s,n_i}$, by appending the state $n_i$=next(s,i) to $C_t^s$ (block 2034 of FIG. 20C).

Figure 20C:
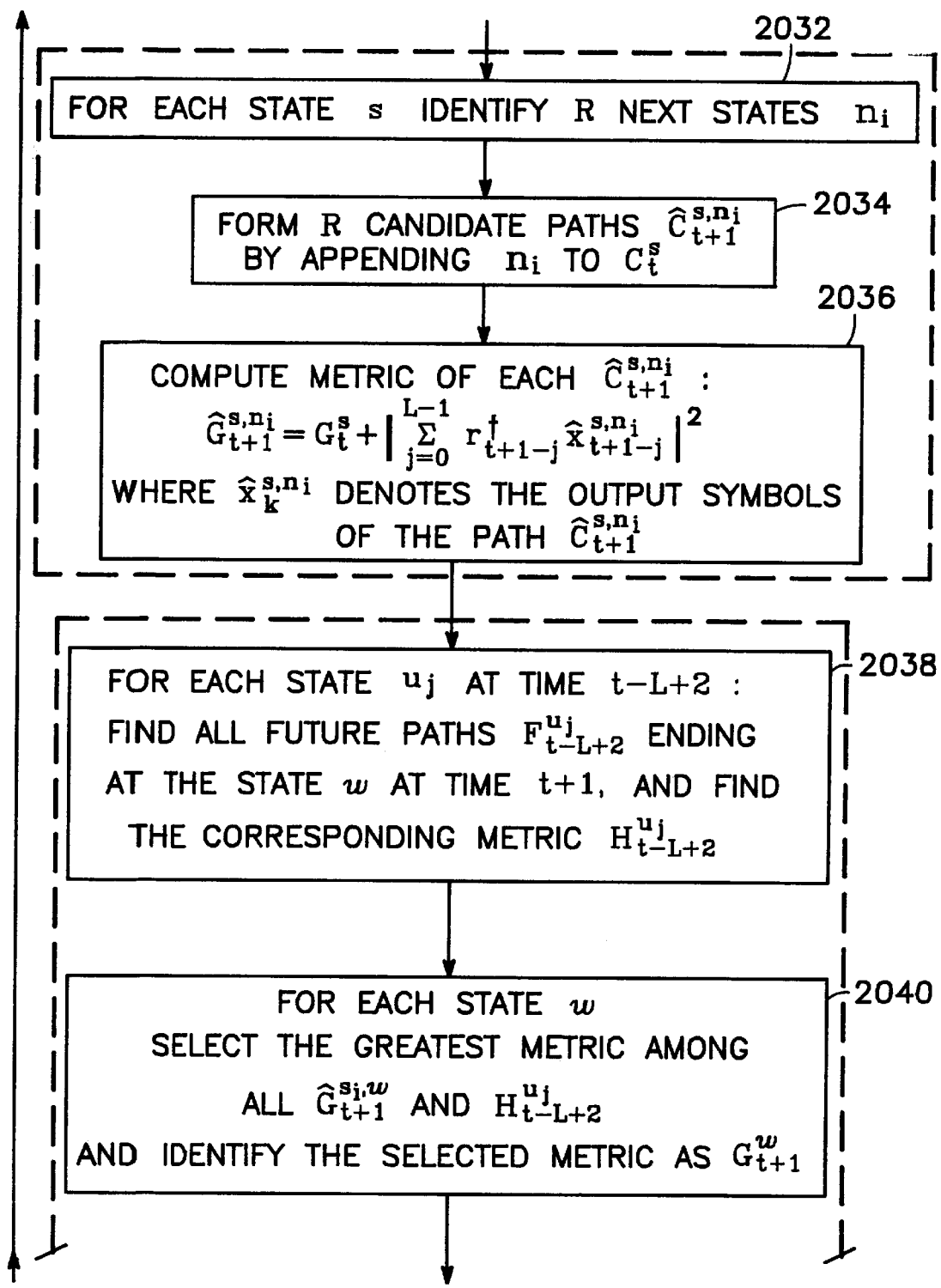

Step 7. For each $\hat{C}_{t+1}^{s,n_i}$, compute the accumulated metric $\hat{G}_{t+1}^{s,n_i}$ by $$\hat{G}_{t+1}^{s,n_i} = \eta(\hat{C}_{t+1}^{s,n_i}) = G_t^s + \left| \sum_{j=0}^{L-1} r_{t+1-j}^\dagger \hat{x}_{t+1-j}^{s,n_i} \right|^2, \quad (47)$$

where $\{\hat{x}_k^{s,n_i}\}$ denotes the output symbols of the path $\hat{C}_{t+1}^{s,n_i}$ (block 2036 of FIG. 20C).

Step 8. (n.f. decision) For each state w, find all states $u_j$, j=0, ..., l−1, such that the path $F_{t-L+2}^{u_j}$ ends with w, i.e., $q_{t-L+2,t+1}^{u_j}=w$. For an empty set, l=0. Including the R values of the form $\hat{G}_{t+1}^{s_i,w}$, we define $$\alpha_i = \begin{cases} \hat{G}_{t+1}^{s_i,w}, & \text{if } i < R \\ H_{t-L+2}^{u_{(i-R)}}, & \text{if } R \le i < R+l \end{cases}, \quad i = 0, \ldots, R+l-1. \quad (48)$$

This last step completes the step of block 2038 of FIG. 20C. Then, the index i which maximizes $\alpha_i$ (block 2040) is used to update $C_{t+1}^w$ and $G_{t+1}^w$ by $G_{t+1}^w = \alpha_i$ and $$C_{t+1}^w = \begin{cases} \hat{C}_{t+1}^{s_i,w}, & \text{if } i < R \\ F_{t-L+2}^{u_{(i-R)}}, & \text{if } R \le i < R+l \end{cases}. \quad (49)$$

Figure 20D:
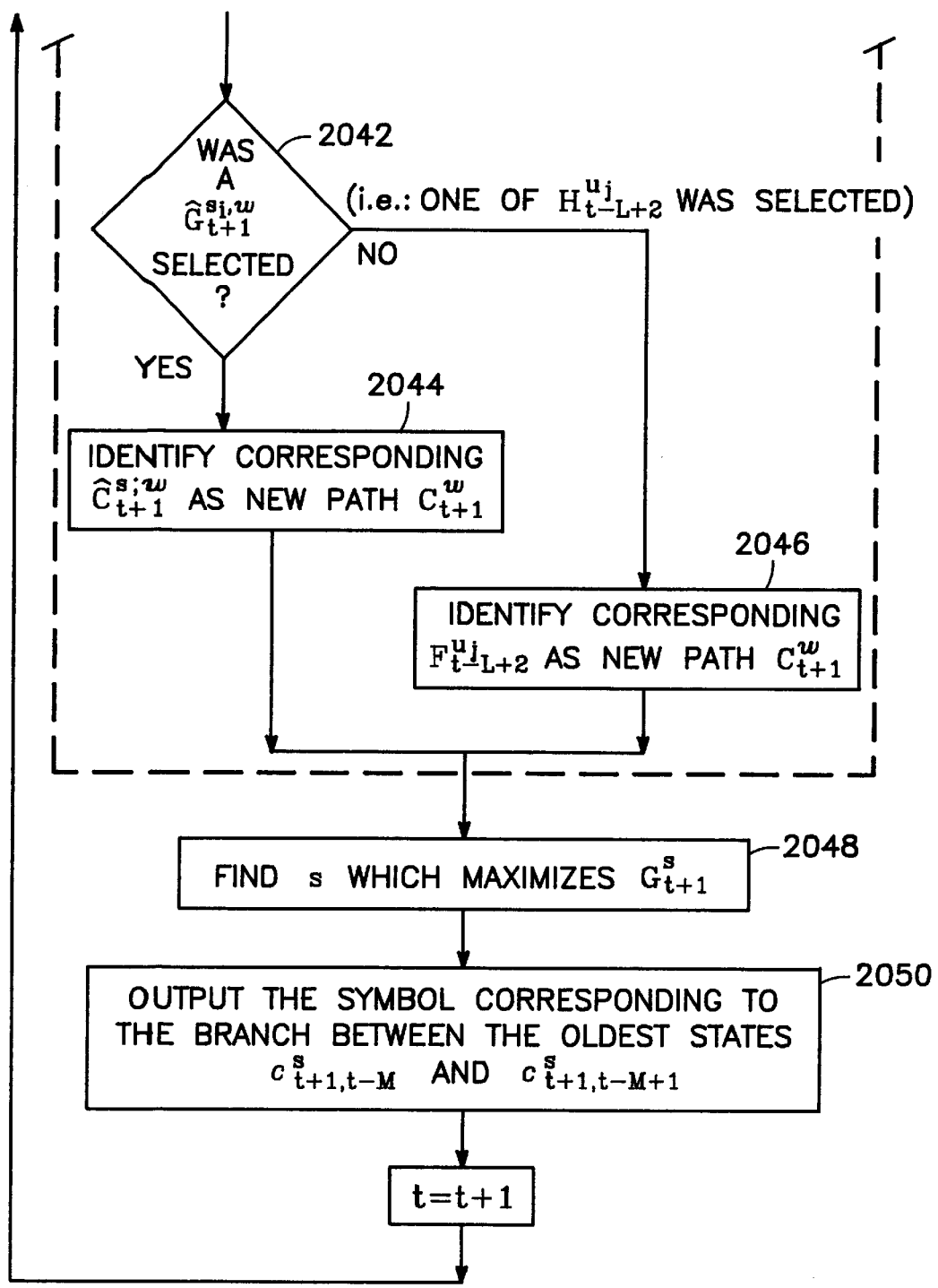

The foregoing equation corresponds to the steps of blocks 2042, 2044 and 2046 of FIG. 20D.

Step 9. Find the s which maximizes $G_{t+1}^s$ (block 2048 of FIG. 20D). The input data which corresponds to the branch connecting the two "old" states $c_{t+1,t-M}^s$ and $c_{t+1,t-M+1}^s$ serves as the decoder output, where M is the decoder memory length (block 2050).

The foregoing process may be summarized with respect to FIGS. 20A through 20D as follows. The process is carried out in a communication system receiving from a channel a received signal corresponding to a succession of received symbols during a corresponding succession of symbol times, the succession of symbols corresponding to a succession of states of a code of the communication system, each of the states branching to a predetermined number of others of the states. The process deduces an estimate of the succession of symbols from the received signal by overlapped observations of the received signal. The process begins by storing a block of symbols of the received signal (block 2002). Then, starting at the last symbol time and proceeding toward the earliest symbol time of the block, a backward process is performed, as follows: For each one of the states at a current symbol time of the received signal, the process identifies a previously stored survivor past path of states corresponding to the received signal leading from the one state (block 2004). The process then forms plural past candidate paths through the one state by appending to the survivor path previous ones of the states branching to the one state (block 2006). For each one of the plural past candidate paths, the process computes a path metric including a sum of products of symbols corresponding to the succession of states in the one past candidate path and a corresponding succession of symbols in the received signal extending from the previous state of the one past candidate path over a predetermined number of prior symbol times (block 2008). For each of the previous states, the process selects one of the plural past candidate paths (block 2012) having the greatest path metric (block 2010) as the survivor past path to the corresponding one of the previous states and stores the survivor past path from the one previous state. The backward process concludes each of its cycles by decrementing the current symbol time by one symbol time (block 2016) and repeating the identifying, computer, selecting and outputting steps, so as to process the entire block of the symbols of the received signal over successive symbol times to form survivor past paths for each state at each symbol time of the block. Upon completion of the backward process, a forward process is performed starting with the earliest symbol time of the block, as follows: for each one of the states at a current symbol time of the received signal, forming plural candidates including (a) a future candidate path extending between the one state and the next state in the past survivor path passing through the one state at the current symbol time (block 2020), (b) plural no-future candidate paths extending through the one state and ending at each next state branching from the one state (block 2034), and (c) plural future candidate paths formed by appending to each the no-future candidate path a portion of that past survivor path extending through the next state of the no-future candidate path (block 2026). For each one of the plural future and no-future candidate paths, the process computes a path metric including a sum of products of symbols corresponding to the succession of states in the candidate path and a corresponding succession of symbols in the received signal (blocks 2022, 2028 and 2036). For each of the next states, the process selects one of the future candidate paths having the greatest path metric as the survivor future path to the corresponding one of the next states and stores the survivor future path to the one next state (block 2030). For each of the next states, the process selects one of the future and no-future candidate paths (blocks 2042, 2044 and 2046) having the greatest path metric (block 2040) as the survivor no-future path to the corresponding one of the next states and stores the survivor no-future path to the one next state. The forward process then concludes each cycle by outputting a symbol of one of the no-future survivor paths corresponding to an earlier symbol time displaced from the current symbol time by a predetermined delay (block 2050) and increments the current symbol time by one symbol time and repeats the identifying, computing, selecting and outputting steps, whereby to process the entire block of the symbols of the received signal over successive symbol times.

Figure 21A:
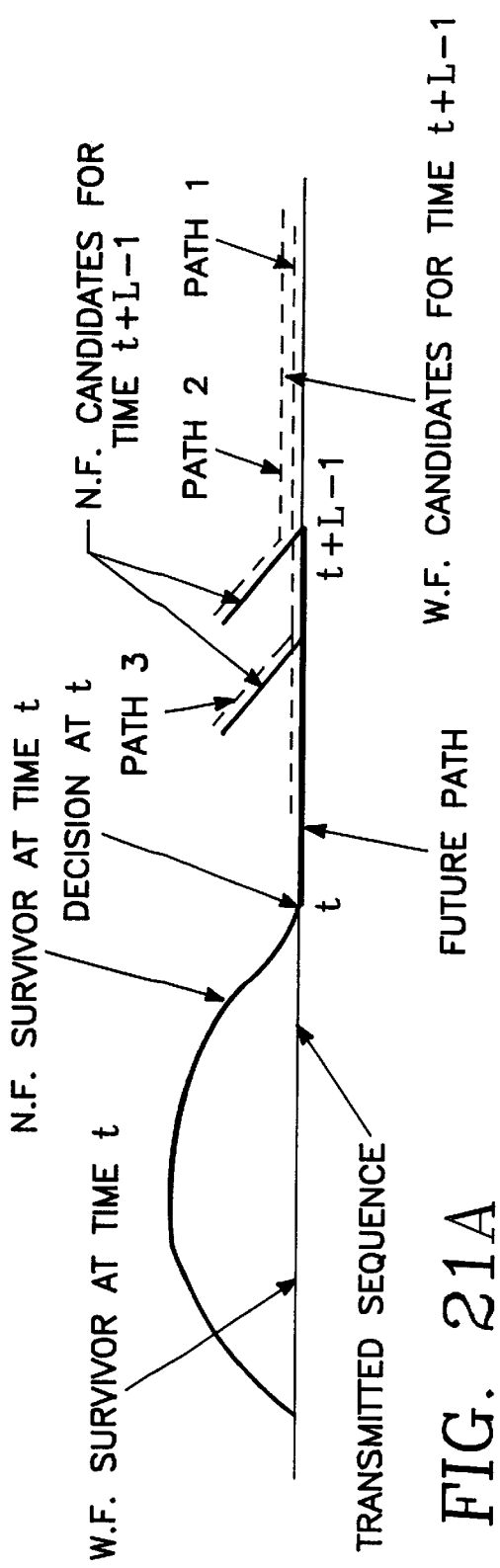
FIGS. 21A and 21B are diagrams of candidate paths formed in the forward process of the EFDFA decoder in two different cases.
Figure 21B:
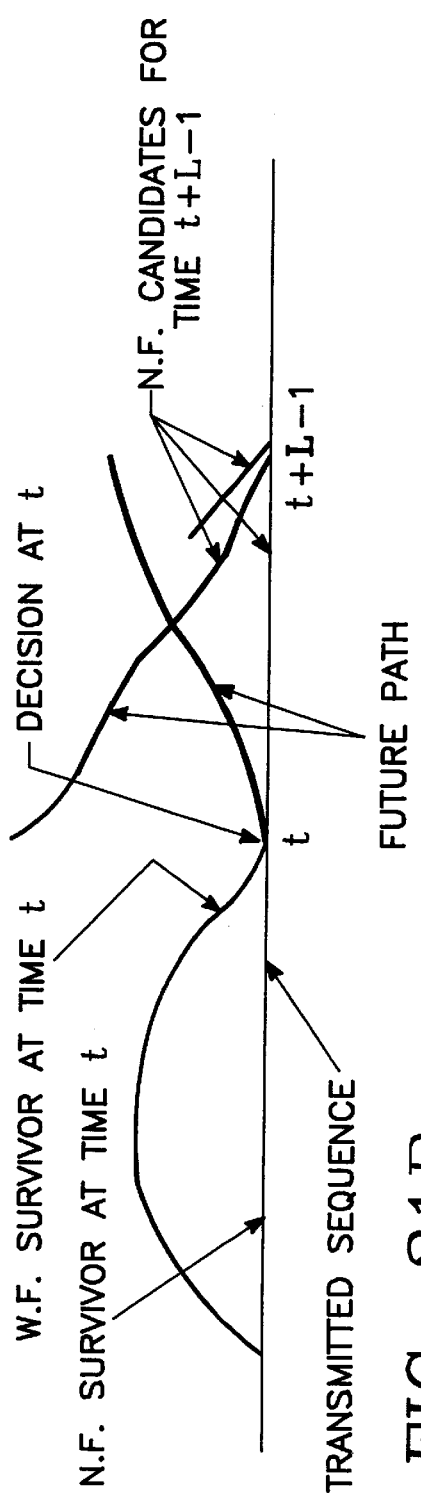
Figures 22A, 22B:
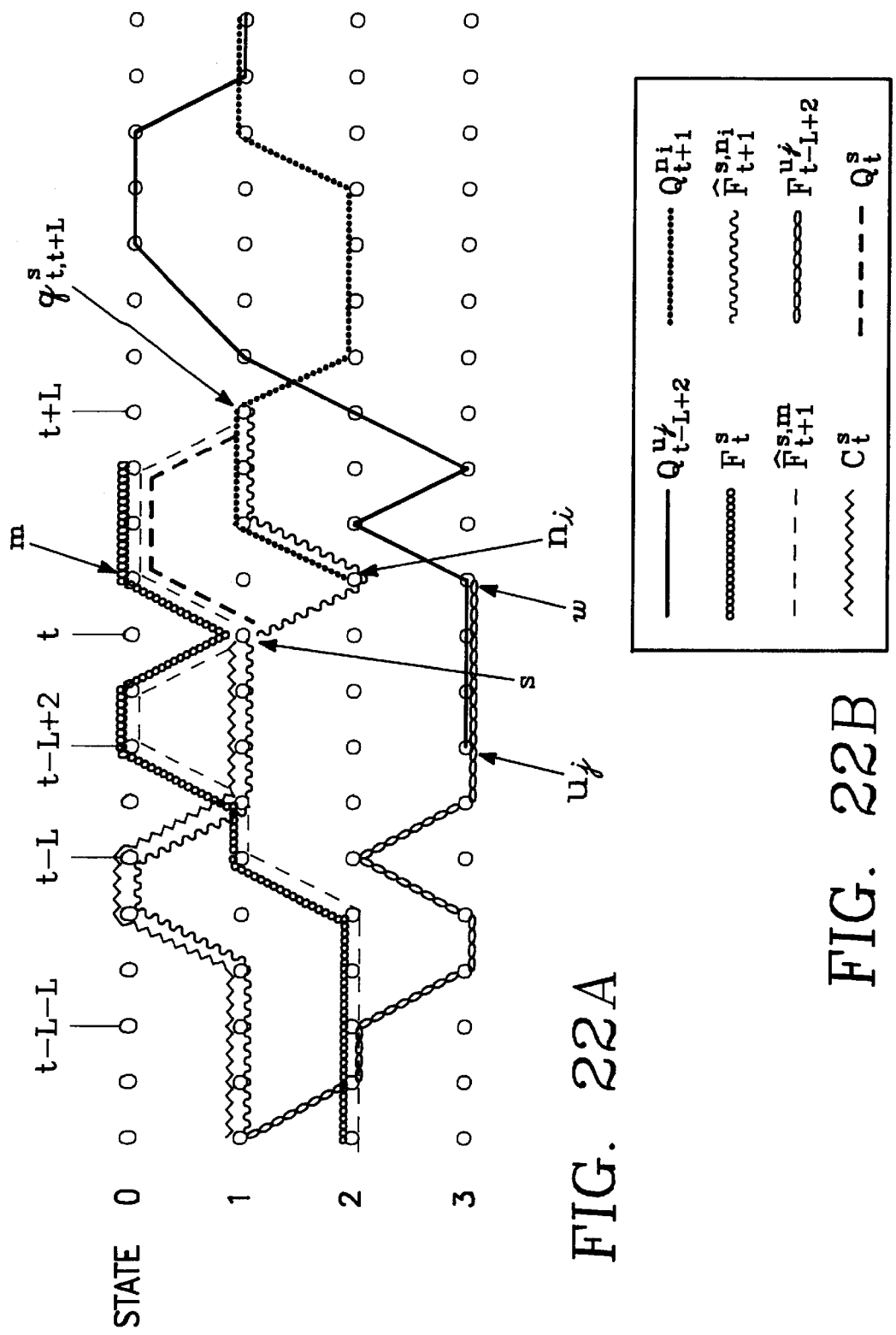
FIG. 22A illustrates key candidate paths passing through a trellis of states in accordance with the EFDFA.
FIG. 22B is an explanatory legend for FIG. 22A.

The operation of the algorithm is described now with reference to FIGS. 21A, 21B 22A and 22B. FIGS. 21A and 21B illustrate the transmitted sequence and the survivor candidate paths for two exemplary cases. FIG. 22A illustrates one example for each of the key states and paths defined in the forward process above passing through a trellis. FIG. 22B is the legend for FIG. 22A, correlating the mathematical quantities defined above with various curves passing through the trellis of FIG. 22A.

$C_t^s$ always holds the best survivor path that we have at time t to state s. Its update is done in Step 8, the n.f. decision, where two kinds of competitors are compared: The n.f. candidate paths which are extensions by one symbol of the previous n.f. survivor and are not using the future estimate, and the w.f. candidate paths which are found in F. The w.f. candidate paths are the survivors of past decisions that used the future estimates. These decisions were made at time t−L+1, while the path is used at time t. When the w.f. survivor is used, the L−1 states that used to be the future at time t−L+1 are the past for time t, and the last state becomes the current one. In the case the future estimation was correct, that w.f. path is a result of an optimal decision. In this case this path will either win or its metric will be equal to the maximal n.f. path metric. A win condition indicates that wrong decisions have been made which might lead to e.p., unless corrected by the winning path from F. Equality between the w.f. path and the n.f. candidate indicates that the previous n.f. decisions were correct leading to the same survivor. Correct decisions mean that the decisions are leading to the ML path, not necessarily to the transmitted path. In order to update F, we make the decisions about the survivor path at time t, using the future L−1 symbols which are assumed to be correct. The candidates that pass through the state s at time t are divided into two categories. The first category contains paths that are extensions of previous w.f. paths, by appending the next state from the future estimate path (Step 1), like Path 1 in FIG. 21A. The second category contains n.f. paths combined with the estimated future path (Step 3), like Path 2 and Path 3 in FIG. 21A. The paths of the second category which share their last L states with paths of the first category, like Path 3, are eliminated from the comparison since those two candidates have already been compared in the previous w.f. decision. This elimination is taking place in Step 3 checking that the next state $n_i$ is not equal to the next state from the estimated future, m.

In FIG. 21a, the n.f. decision at time t was in error. A correct future estimate enabled the w.f. decision to be correct. The n.f. error caused error propagation in the n.f. decisions. The w.f. survivor of time t became a candidate for the n.f. decision at time t+L−1, and wins over all the wrong n.f. candidates, leading to elimination of the error. In FIG. 21B, the n.f. decision was correct, but the future estimate was wrong, leading to w.f. decision error. At time t+L−1, the n.f. candidates did not include the wrong w.f. survivor, but has included other (arbitrary) w.f. candidates. The candidate which coincides with the transmitted path had the largest metric and no error occurred.

EXAMPLE 14.1

Figure 23:
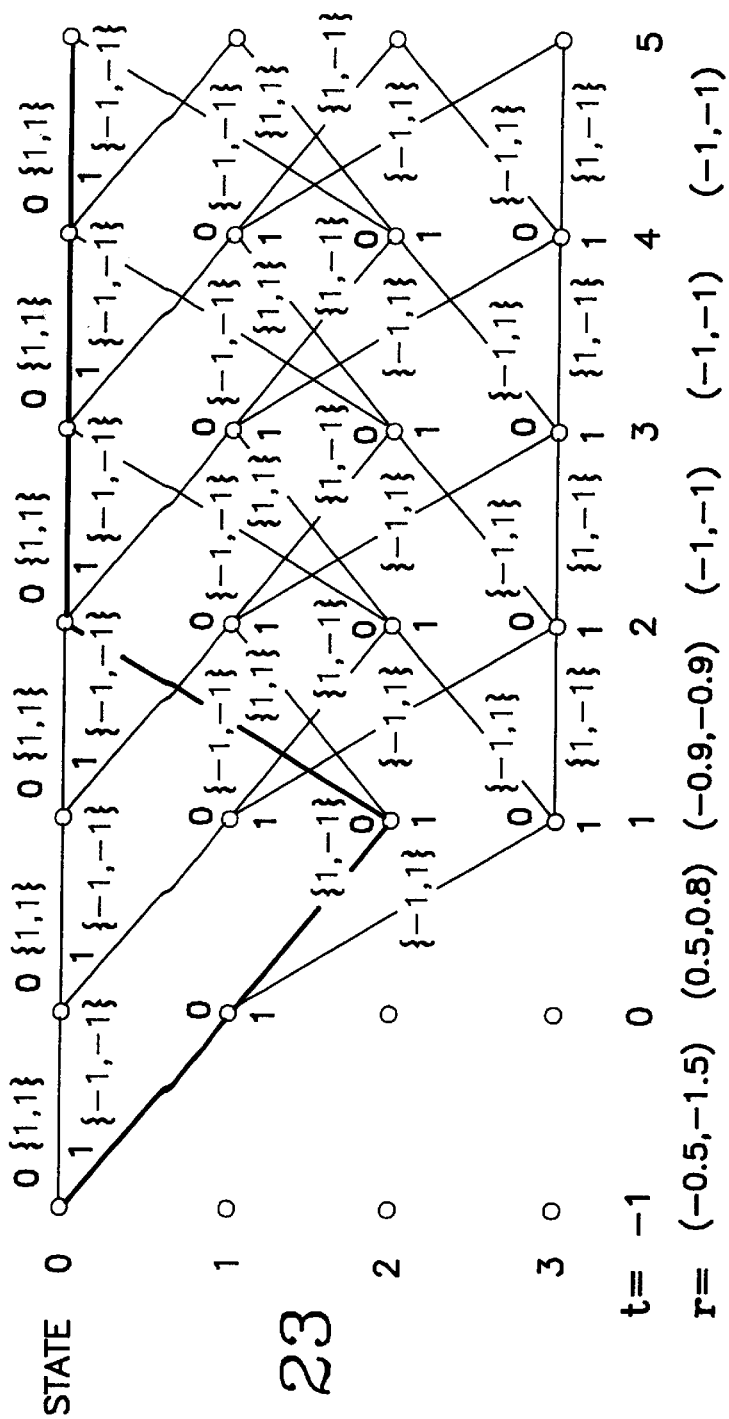
FIG. 23 is a diagram of a trellis of a code employed in a working example of the invention.

Referring to FIG. 23, we would like to decode a rate ½, K=3 code with BPSK modulation, and we choose L=3. The input to the decoder is as shown, where the numbers are real for simplicity. The symbols are in general complex vectors.

Initial conditions: 0 is received for t<0 and the state of the encoder is 0 at time t'−1, where all paths originate (it is not needed for the algorithm operation, only for the example). For t<2 we only compute the metrics—there are no decisions. At t=0:

$F_0^0 = \{0,0,0,0\}$, $H_0^0 = (-0.5-1.5)^2 + (-0.5-1.5+0.5+0.8)^2 + (-0.5-1.5+0.5+0.8-0.9-0.9)^2 = 10.74$, $F_0^1 = \{0,1,2,0\}$, $H_0^1 = (0.5+1.5)^2 + (0.5+1.5-0.5+0.8)^2 + (0.5+1.5-0.5+0.8+0.9+0.9)^2 = 26.1$, $C_0^0 = \{0,0\}$, $G_0^0 = (-0.5-1.5)^2 = 4$, $C_0^1 = \{0,1\}$, $G_0^1 = 4$.

Step 1,2: s=0→m=0 and s=1→m=2.

$\hat{F}_1^{0,0} = \{0,0,0,0,0\}$, $\hat{H}_1^{0,0} = 10.74 + (0.5+0.8-0.9-0.9-1-1)^2 = 16.99$, $\hat{F}_1^{1,2} = \{0,1,2,0,0\}$, $\hat{H}_1^{1,2} = 26.1 + (-0.5+0.8+0.9+0.9-1-1)^2 = 26.11$, Step 3,4: For s=0, $\{n_i\} = \{0,1\}$. m=0 so we take only $n_i = 1$.

$\check{F}_1^{0,1} = C_0^0 + \{1,2,0\} = \{0,0,1,2,0\}$, $\{\hat{y}_i^{0,1}\} = \{(1,1),(-1,-1),(-1,1),(-1,-1)\}$, for i=0 . . . 3, $$\check{H}_1^{0,1} = G_0^0 + \sum_{k=1}^{3} \left| \sum_{j=0}^{2} r_{k-j}^\dagger \hat{y}_{1,k-j}^1 \right|^2 = 4 + (-0.5 - 1.5 - 0.5 - 0.8)^2 +$$
$$(-0.5 - 1.5 - 0.5 - 0.8 + 0.9 - 0.9)^2 +$$
$$(-0.5 - 0.8 + 0.9 - 0.9 + 1 + 1)^2 = 26.27.$$

For s=1, $\{n_i\} = \{2,3\}$. m=2 so we use only $n_i = 3$.

$\check{F}_1^{1,3} = \{0,1,3,2,0\}$, $\check{H}_1^{1,3} = 12.67$.

Step 5: There are no decisions to be made, only updating: $F_1^0 = \hat{F}_1^{0,0}$, $F_1^1 = \hat{F}_1^{0,1}$, etc.

Step 6,7:

$\hat{C}_1^{0,0} = \{0,0,0\}$, $\hat{G}_1^{0,0} = G_0^0 + (-0.5-1.5+0.5+0.8)^2 = 4.49$, $\hat{C}_1^{0,1} = \{0,0,1\}$, $\hat{G}_1^{0,1} = G_0^0 + (-0.5-1.5-0.5-0.8)^2 = 14.89$, $\hat{C}_1^{1,2} = \{0,1,2\}$, $\hat{G}_1^{1,2} = 9.29$, $\hat{C}_1^{1,3} = \{0,1,3\}$, $\hat{G}_1^{1,3} = 6.89$.

Step 8: There are no decisions, only updates: $C_1^0=\hat{C}_1^{0,0}$, $C_1^1=\hat{C}_1^{0,1}$ etc. The part that involves $F_{t-L+2}=F_{-1}$ is not relevant since F is not defined at $t=-1$.

At $t=1$:

Step 1,2: $s=0 \rightarrow m=0$, $s=1 \rightarrow m=2$, $s=2 \rightarrow m=0$, $s=3 \rightarrow m=2$.

$\hat{F}_2^{0,0}=\{0,0,0,0,0\}$, $\hat{H}_2^{0,0}=50.63$, $\hat{F}_2^{1,2}=\{0,0,1,2,0,0\}$, $\hat{H}_2^{1,2}=26.27$, $\hat{F}_2^{2,0}=\{0,1,2,0,0,0\}$, $\hat{H}_2^{2,0}=30.95$, $\hat{F}_2^{3,2}=\{0,1,3,2,0,0\}$, $\hat{H}_2^{3,2}=12.67$, Step 3,4:

$\hat{F}_2^{0,1}=\{0,0,0,1,2,0\}$, $\hat{H}_2^{0,1}=29.75$ in, $\hat{F}_2^{1,3}=\{0,0,1,3,2,0\}$, $\hat{H}_2^{1,3}=31.47$, $\hat{F}_2^{2,1}=\{0,1,2,1,2,0\}$, $\hat{H}_2^{2,1}=11.83$, $\hat{F}_2^{3,3}=\{0,1,3,3,2,0\}$, $\hat{H}_2^{3,3}=13.87$, Step 5:

$\hat{H}_2^{0,0} > \hat{H}_2^{2,0} \rightarrow F_2^0 = \{0,0,0,0,0,0\}$, $H_2^0 = 50.63$, $\hat{H}_2^{0,1} > \hat{H}_2^{2,1} \rightarrow F_2^1 = \{0,0,0,1,2,0\}$, $H_2^1 = 29.75$ in, $\hat{H}_2^{1,2} > \hat{H}_2^{3,2} \rightarrow F_2^2 = \{0,0,1,2,0,0\}$, $H_2^2 = 26.27$, $\hat{H}_2^{1,3} > \hat{H}_2^{3,3} \rightarrow F_2^3 = \{0,0,1,3,2,0\}$, $H_2^3 = 31.47$, Step 6,7:

$\hat{C}_2^{0,0}=\{0,0,0,0\}$, $\hat{G}_2^{0,0}=10.74$, $\hat{C}_2^{0,1}=\{0,0,0,1\}$, $\hat{G}_2^{0,1}=5.7$, $\hat{C}_2^{1,2}=\{0,0,1,2\}$, $\hat{G}_2^{1,2}=25.78$, $\hat{C}_2^{1,3}=\{0,0,1,3\}$, $\hat{G}_2^{1,3}=25.78$, $\hat{C}_2^{2,0}=\{0,1,2,0\}$, $\hat{G}_2^{2,0}=26.1$, $\hat{C}_2^{2,1}=\{0,1,2,1\}$, $\hat{G}_2^{2,1}=9.54$, $\hat{C}_2^{3,2}=\{0,1,3,2\}$, $\hat{G}_2^{3,2}=9.78$, $\hat{C}_2^{3,3}=\{0,1,3,3\}$, $\hat{G}_2^{3,3}=9.78$, Step 8: For $w=0$, we have two paths from the list F at time $t-L+2=0$ that end with 0, i.e., $l=2$. these paths are $F_0^0$ and $F_0^1$.

$\alpha_i = \{\hat{G}_2^{0,0}, \hat{G}_2^{2,0}, H_0^0, H_0^1\} = \{10.74, 26.1, 10.74, 26.1\}$.

The maximal $\alpha_i$ is $\hat{G}_2^{2,0}$ so $G_2^0=26.1$ and $C_2^0=\{0,1,2,0\}$. Note that at this point the decoder made an error. Let us look at the w.f. survivor at this point (state=0, t=2). This path is $F_2^0=\{0,0,0,0,0\}$. We can see that the w.f. decisions were correct, as opposed to the n.f. decisions. Since the future estimate is correct, the w.f. decision will override all the wrong n.f. decisions, as we will see later. Continuing Step 8, for $w=1,2$ and 3, we have no paths $F_0^s$ that end with w, so we get:

$C_2^1=\{0,1,2,1\}$, $G_2^1=9.54$, $C_2^2=\{0,0,1,2\}$, $G_2^2=25.78$, $C_2^3=\{0,0,1,3\}$, $G_2^3=25.78$,

At $t=2$:

the paths computed at steps 1–5 are not needed for this example since we will stop at $t=4$ to read the final results.

Step 6,7:

$\hat{C}_3^{0,0}=\{0,1,2,0,0\}$, $\hat{G}_3^{0,0}=26.11$, $\hat{C}_3^{0,1}=\{0,1,2,0,1\}$, $\hat{G}_3^{0,1}=42.91$, $\hat{C}_3^{1,2}=\{0,1,2,1,2\}$, $\hat{G}_3^{1,2}=11.79$, $\hat{C}_3^{1,3}=\{0,1,2,1,3\}$, $\hat{G}_3^{1,3}=11.79$, $\hat{C}_3^{2,0}=\{0,0,1,2,0\}$, $\hat{G}_3^{2,0}=26.27$, $\hat{C}_3^{2,1}=\{0,0,1,2,1\}$, $\hat{G}_3^{2,1}=36.67$, $\hat{C}_3^{3,2}=\{0,0,1,3,2\}$, $\hat{G}_3^{3,2}=27.47$, $\hat{C}_3^{3,3}=\{0,0,1,3,3\}$, $\hat{G}_3^{3,3}=27.47$, Step 8: For $w=0$ we have 4 paths ending with w: $F_1^0$, $F_1^1$, $F_1^2$ and $F_1^3$.

$\alpha_i=\{\hat{G}_3^{0,0}, \hat{G}_3^{2,0}, H_1^0, H_1^1, H_1^2, H_1^3\}=\{26.11, 26.27, 16.99, 26.27, 26.11, 12.67\}$ The maximal is $\hat{G}_3^{2,0}$ or $H_1^1$ and without ambiguity, we get $C_3^0=\{0,0,1,2,0\}$ and $G_3^0=26.27$. Here the n.f. decision is again an error. Continuing with Step 8, there is no path $F_1^s$ that ends with $w>0$ and we get $C_3^1=\{0,1,2,0,1\}$, $G_3^1=42.91$, $C_3^2=\{0,0,1,3,2\}$, $G_3^2=27.47$, $C_3^3=\{0,0,1,3,3\}$, $G_3^3=27.47$, At $t=3$:

Again, we will omit steps 1–5.

Step 6,7: We are interested only in the decision at state 0.

$\hat{C}_4^{0,0}=\{0,0,1,2,0,0\}$, $\hat{G}_4^{0,0}=26.27$, $\hat{C}_4^{2,0}=\{0,0,1,3,2,0\}$, $\hat{G}_4^{2,0}=31.47$, $\alpha_i=\{\hat{G}_4^{0,0}, \hat{G}_4^{2,0}, H_2^0, H_2^1, H_2^2, H_2^3\}=\{26.27, 31.47, 50.63, 29.75 \text{ in}, 26.27, 31.47\}$.

The maximal is $H_2^0$, so we have $C_4^0=F_2^0=\{0,0,0,0,0,0\}$, $G_4^0=H_2^0=50.63$.

Eventually the correct path is decided on and overrides the wrong decisions of the past. Note that without this help from the w.f. candidate, the n.f. decision would have made another wrong decision by taking the maximal among the G's. This is a part of an endless e.p. that occurs in this example if the future estimate is not used or is wrong and the input remains $-1$.

15 Software Implementation

Figure 24:
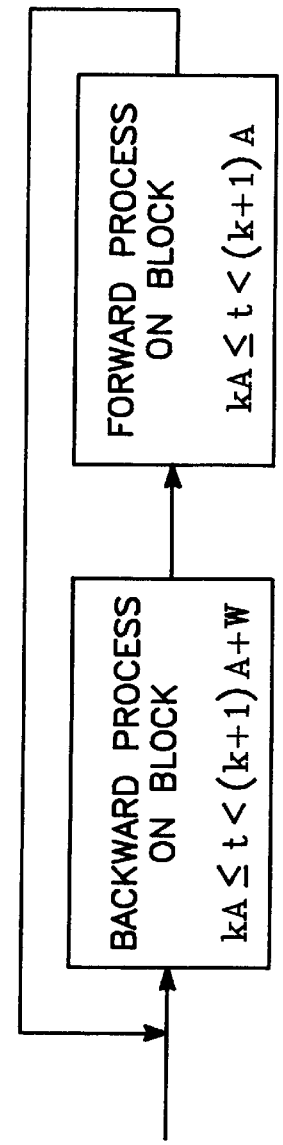
FIG. 24 is a high-level flow diagram of a software implementation of the EFDFA algorithm.
Figure 25A:
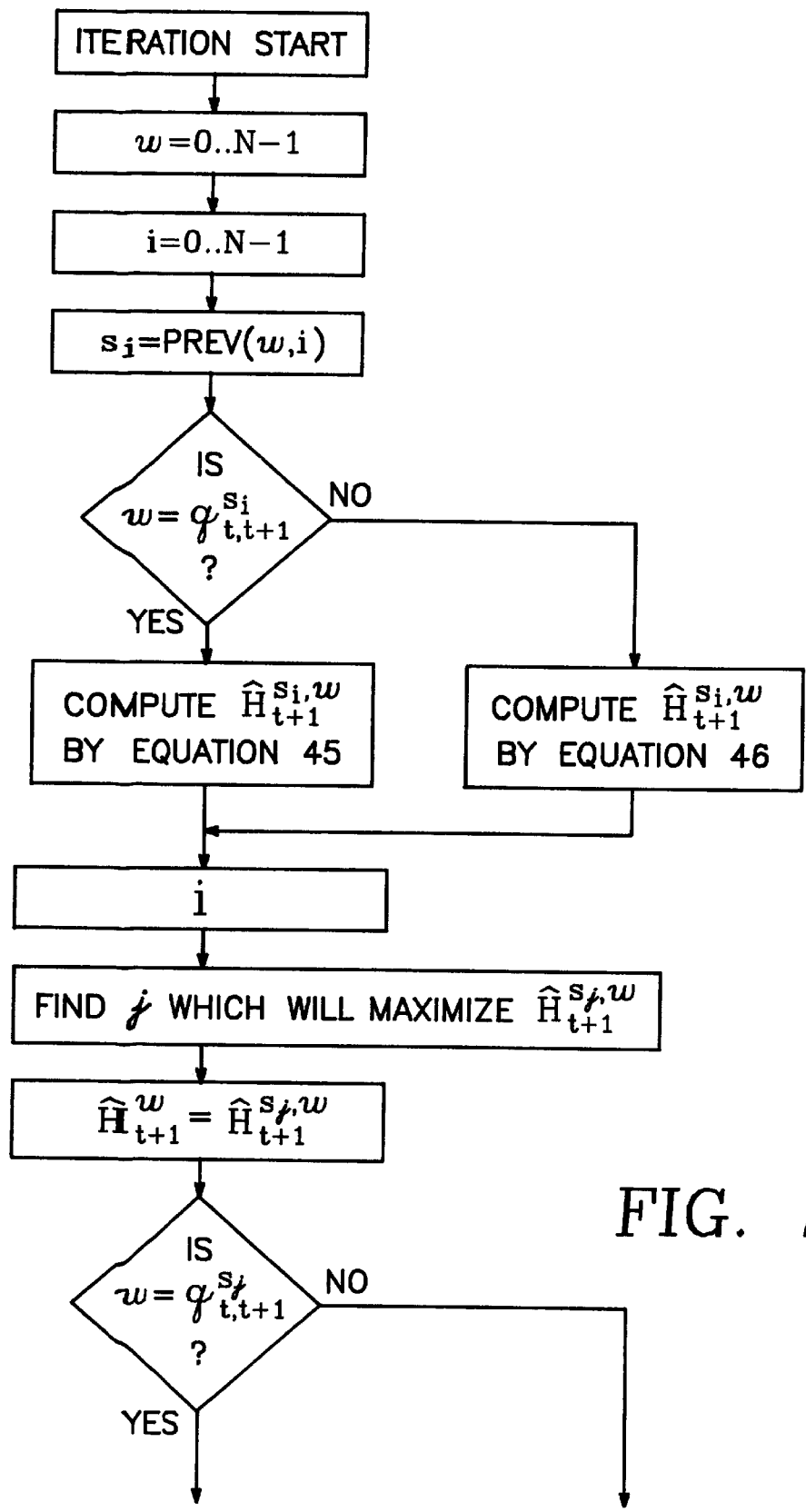
FIGS. 25A, 25B and 25C together constitute a low-level (detailed) flow diagram of a software implementation of the EFDFA algorithm.
Figure 25B:
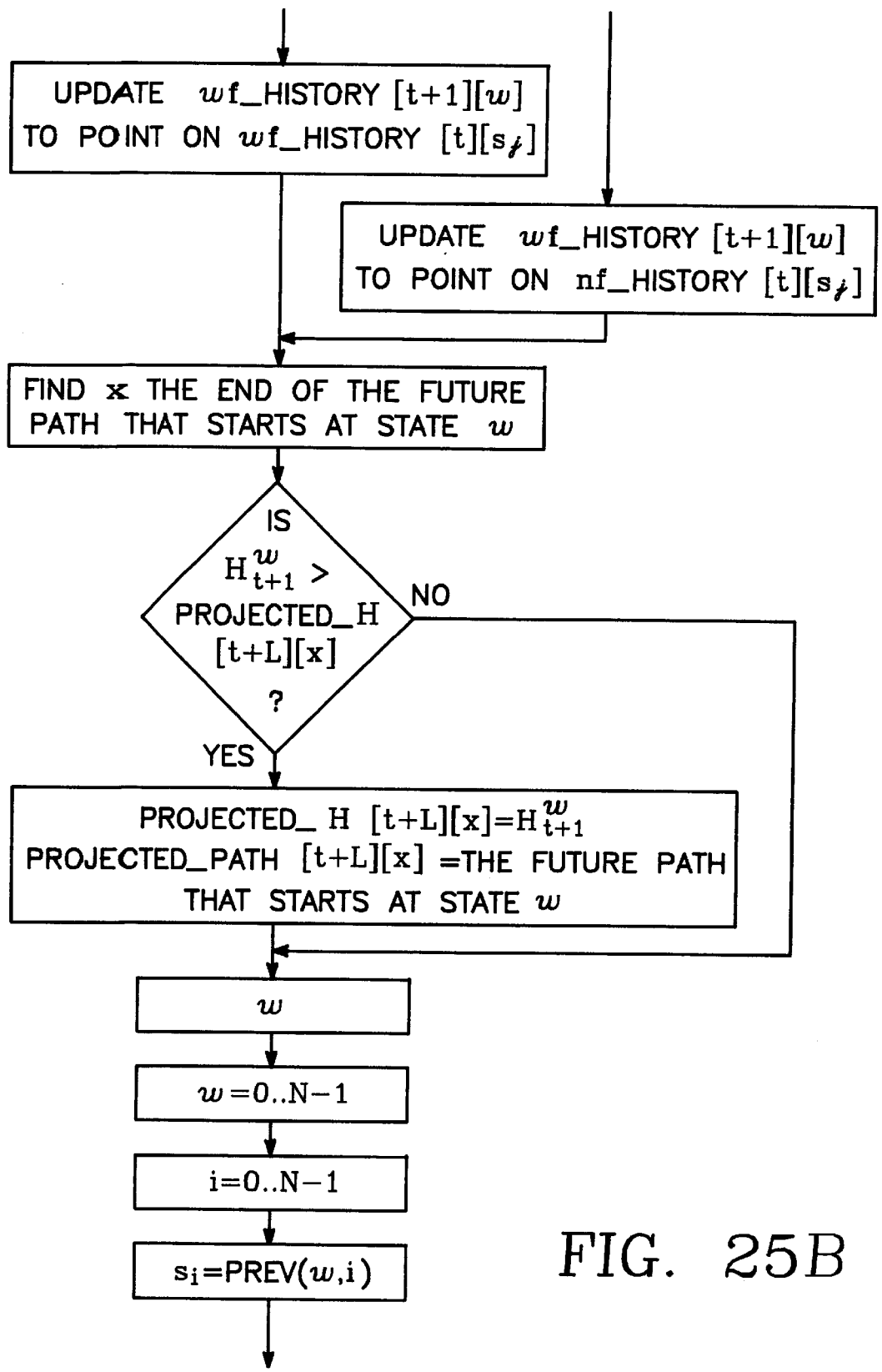
Figure 25C:
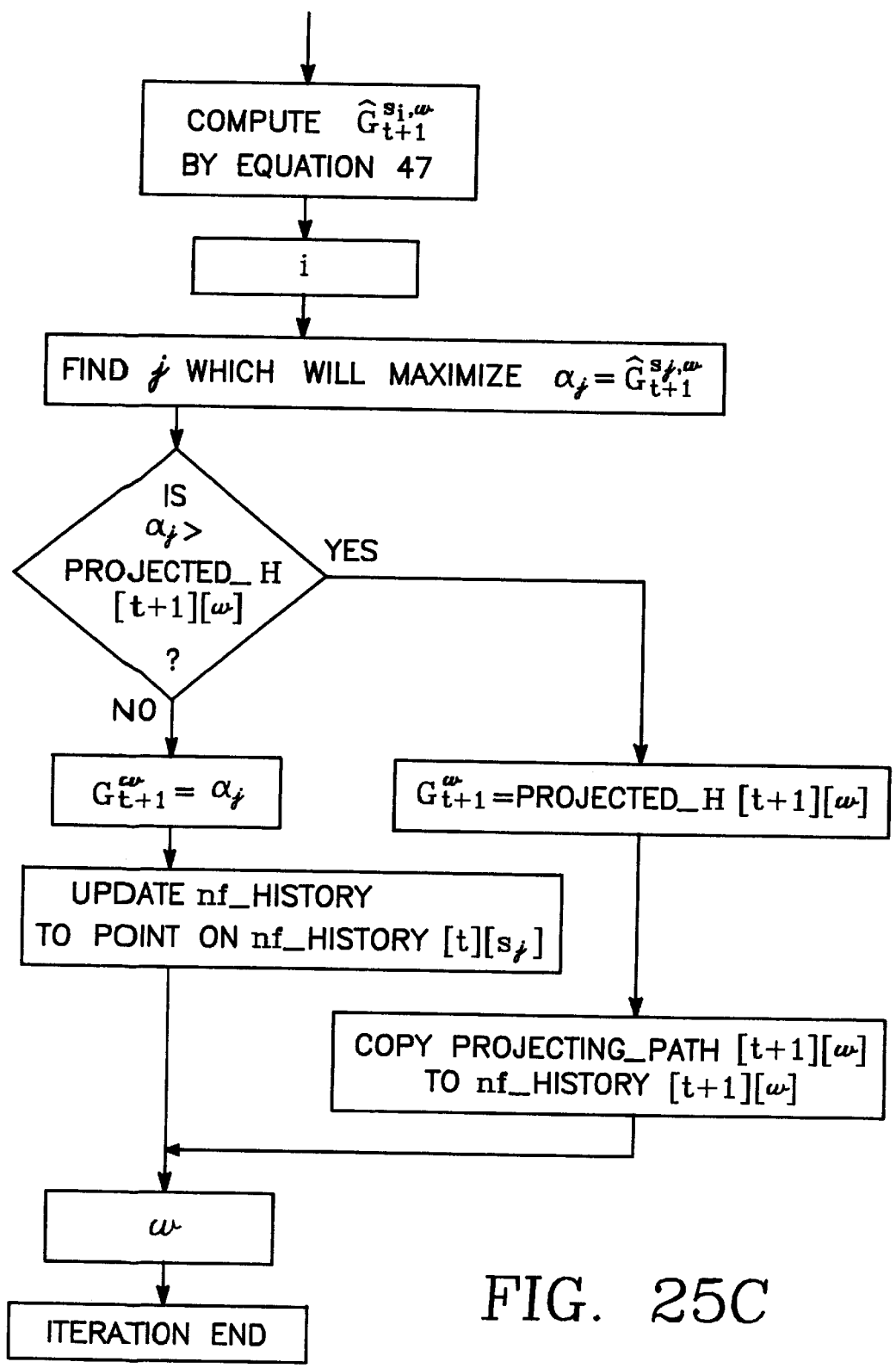

A direct implementation of the algorithm requires the maintenance of a list for each state and each time, so the memory use is infinite. It is clear, however, that only the last list $C_t^s$ and the $L-1$ lists $F_{t-L+2}^s, \ldots, F_t^s$ need to be saved per state. For an efficient software implementation, the amount of required memory is minimized. The first thing to note is that instead of saving a list of states, we only need to save B bits per state. Also, we want to avoid copying whole lists, to save CPU time. In our implementation, we only maintain two lists per state and we avoid copying whole lists. We describe the implementation method next. The backward DFA which is implemented very similar to the VA (therefore will not be elaborated on) provides us with its path history $Q_t^s$, t=kA, ..., (k+1)A+W, s=0, ... N−1. Since each list of time t is an extension of a list of time t+1, it is sufficient to save for each state and each time on B-bits pointer. This pointer is used to choose the trellis branch when tracking a survivor path. Hence, the whole path history has a tree structure. In the f.p. we maintain two tree-structured path history arrays, which are implemented as two-dimensional cyclic buffers, nf_History and wf_History. The two are not independent: there are links between the two, as we will describe later. The first, nf_History, saves the n.f. decisions while wf_History saves the w.f. decisions. A path starting in wf_History will correspond to a list in F (except the future symbols in F) and a path starting in nf_History will correspond to a list in C. Each entry, in either arrays, contains one extra bit to connect to the other array. Thus, while tracking a typical path, we move back and forth between nf_History and wf_History. Two double-buffer, one-dimensional arrays are used to maintain $G_t^s$ and $H_t^s$. A high level flowchart of this implementation is illustrated in FIG. 24 while a low level (detailed) flow chart of this implementation is illustrated in FIGS. 25A through 25C. For the w.f. decision (Step 5), we need to form the candidate paths and their metric. These can be formed by steps 1 and 2 or by steps 3 and 4.

The routine starts at a given state w and needs to find all $\hat{H}_{t+1}^{s_i,w}$. First, we find all $s_i$, the previous states to w on the trellis. For each $s_i$ we decide whether to use steps 1 and 2 or steps 3 and 4 by checking if $w=q_{t,t+1}^{s_i}$. In steps 1 and 2 we use the path from wf_History and in steps 3 and 4 we use the path from nf_History. After making the decision which value of $\hat{H}_{t+1}^{s_i,w}$ is maximal, we update $H_t^w$ and wf_History. If the candidate path formed from the nf_History path in Step 3 was decided on, then we set the appropriate entry in wf_History to point to that path in nf_History. Hence, we form a link between wf_History and nf_History. The new survivor path formed, $F_{t+1}^w$, will be used at time t+L in the n.f. decisions. Thus, we have to save some information for future use. For this purpose, we maintain two additional data structures, cyclic buffers, each of size L−1 per state. The cyclic buffers are used to implement a delay of L−1 iterations. The first cyclic buffer Projecting_path saves the estimated future path used in the w.f. decisions (instead of saving the path we can also save w, and read the path from Q when needed) and the second cyclic buffer Projected_H saves $H_{t+1}^w$ for future use. The estimated future path of state w leads to (projects on) state x. Since the above saved information is needed when making the n.f. decisions at state x, it helps to index the information in these arrays by x instead of w. We update Projecting_path [x] and Projected_H[x] only if $H_{t+1}^w$>Projected _H[x] (there is a value different from zero in Projected_H[x] if the previous state already led to state x). Maximization of the saved value is needed since several states may lead to one state, but in Step 8 only the maximum is needed. Here, we did part of the work of Step 8, and also saved memory.

Now, let us move on to described the n.f. decisions. Here we have R+1 candidate paths. The first R are the paths formed from the previous states and their survived paths from nf_History, and the last is the path containing the saved estimated future path. For a state w, the value found in Projected_H[w] (after the delay of L−1) is already the maximum element of $\{\alpha_i\}$, i=R, ... R+L−1 (equation (48)). If this value is also the maximum element of $\{\alpha_i\}$ $\forall$i, then we should update nf_History to point to the path $F_{t-L+2}^{u(i-R)}$. This path is composed of two parts. $F_{t-L+2}^{u(i-R)}$ is a concatenation of the survivor in wf_History at time t−L+2 and the saved estimated future path. Thus, the latter path is copied into nf_History (each entry in nf_History should be long enough) and a point is set to point to wf_history. - -

Like in the VA, we start from the maximal metric node and backtrack. After backtracking a length M (the decoder truncation length), we assume convergence to the optimal path and start reading data.

While tracking the survivor path, we move back and forth between nf_history and wf_History since the survivor path is the combination of the formers.

We start with the n.f. survivor. We continue backtracking in nf_history until the extra bit that is used to link the two buffers is set. Then, we backtrack through the L−1 states of the estimated future path saved in nf_History and then switch to wf_History. We continue backtracking in wf_History as long as the extra bit used to link the two buffers is off. If it is on that means that we have used n.f. information in this path, so we now backtrack in nf_history.

16 Simulation Results

The algorithms presented were evaluated by simulation. The channel used was AWGN with a slowly varying phase (10° change over one observation of length L symbols generated by a frequency offset). The codes used were the quaternary (R=4) Linear Noncoherent Trellis coded Modulation (LNTCM) family. These codes are built over the modulo 4 group and use QPSK symbols. Both have rate ½. The first codes has 16 states and generators (in base 4) 133,231. The second has 64 states and generators 2123, 1312. The codes are maximum $d_{free}$ codes with $d_{free}$ of 7 and 10 respectively. For proper operation of the MDFA, it is necessary to have enough SNR per observation. For $$\frac{E_b}{N_0} = 2 \, \text{dB},$$

we need L≧5 and for $$\frac{E_b}{N_0} = 3 \, \text{dB},$$

we need L≧4. L=4 was used in the 16 states code simulation and L=5 for the 64 states code. We chose W=100 for the EFDFA to achieve a good convergence. It was convenient to choose also A=100.

For the 16 states code, 1024 states are required for the optimal algorithm but only 16 states are required in the suboptimal algorithms.

For the 64 states example, 16384 states are required, so the optimal algorithm could not been simulated. Since the suboptimal algorithms require only 64 states, their complexity is two orders of magnitude lower in this example. Compared to the BDFA, the CPU time requirements of the EFDFA is 4–5 times larger.

Due to mainly e.p. effects, the BDFA lost 2 dB compared to the optimal. The MDFA worked well, but degradation of up to 0.5 dB in one case and 0.8 dB in the other remains. The EFDFA algorithm essentially achieved the optimal performance in moderate and high SNR ($P_b<10^{-3}$). In low SNR ($P_b \cong 10^{-2}$), we see 0.2–0.3 dB degradation. The reason for the degradation in low SNR is that the ratio $$\frac{P_b P_f}{P_e}$$

becomes higher.

All the algorithms suffer less degradation compared to the bit error rate case. The reason is that all the algorithms suffer from increased length error bursts when they fail. We also note that the modification of the MDFA reduces the error events probability of the BDFA.

While the invention has been described in detail by specific reference to preferred embodiments, it is understood that variations and modifications thereof may be made without departing from the true spirit and scope of the invention.

A- 1

APPENDIX A

The following is a listing of a C-language software implementation of the BDFA algorithm.

```c
// BDFA
#include "complex.h"
#include "stdlib.h"
#include "stdio.h"
#include "mem.h"
#include "conio.h"
#include "dos.h"
//#include "matrix.h"
define zero_input 0    //1=YES 0=NO define L 5   // number of symbols in one integration.
define B 2   // number of bits per symbol
#define N 256  // number of branches. number of actual states is N/R #define K 4    // log2(N)/B
#define D 2   // number of outputs
#define R 2    // 2^B
#define P 0   // number of bits in parralell transitions (be careful to put these as lowest bits in Next and Prev. #define Memory_Length 32
#define CODE 31209
#define Na (N/R)
define CPM 0 if CPM
define h 2./3.
#define G 2 // number of symbols in partial response
#define Pulse_Type 1   // 0-Linear 1-RC
#define index_to_inp_symbol(m) (2*(m)-R+1)
endif double Acc[Na]; // accomulates metrics
double Acc0;
int History[Memory_Length][Na];
int PN;  // for the input preparation
int history_cnt; // modulu counter
int State; // remember the state for encode.
int Next[N][R];  // for each state, what the next and Previous.
int Prev[N][R];
#if !CPM
typedef struct {complex v[D];} symbol;
#else
typedef struct {complex v[D]; complex rotation;} symbol;// phase rotation of this symbol. complex rotation=1; // its the transmitter phase state.
endif symbol Output[N];
complex Inps[L][D];
typedef struct symbol_link {
  symbol s;
  symbol_link *link;
```

A- 2

```
 } symbol_link;
symbol_link *Output_History[2][Na];

long I;
#define   J complex(0,1)
complex   Q=polar(1,M_PI_4);
int next;
complex Base[K][D];
long
last_err,first_err,ep_len,avv_ep_len,avv_ep_len_cnt,seq_err_cn
t; long ep_hist[101];
define Max_len_hist 100 void printbaseR(int a)
{
int i,hh[20];
for (i=0;i<K-1;i++) {
  hh[i]=a & (R-1);
  a >>= B;
  }
for (i=K-2;i>=0;i--) printf("%d",hh[i]);
printf(" ");
} int check_const(int g,int n)   // g is from the N semi-states {
int b;
int k;

if (n>20) return(0);

b=((g<<B) & (N-1));
for (k=0;k<R;k++) {
   int t;
   for (t=0;t<D;t++)
      if (Output[b+k].v[t]!=Output[g].v[t]) break;
   if (t==D) {
       if (check_const(b+k,n+1)>=0) return(k);
       }
   }
if (k==R) return(-1);
//list[j]=g;
}
if CPM
double phase_func(double t)
{
#if PULSE_TYPE==0
return(t/(2*G));
#endif
#if PULSE_TYPE==1
return(t/(2*G)-sin(2*M_PI*t/G)/(4*M_PI));
#endif
} matrix prepare_cpm_symbols()
{
```

```
                              A- 3
int a,i,j,x,g;
#define Resolution 10
g=pow(R,G);
matrix q(G,Resolution),A(g,G),X,Y,Z;
for (j=0;j<G;j++) for (x=0;x<Resolution;x++)
q(j,x)=phase_func(j+x/(float)Resolution); for (i=0;i<g;i++) {
a=i;
   for (j=0;j<G;j++) {
      A(i,j)=index_to_inp_symbol(a%R); // difference symbol.
a/=R;
     }
   }
printmatrix(A);
X=A*q;
for (i=0;i<g;i++) for (x=0;x<Resolution;x++)
X(i,x)=exp(J*2*M_PI*h*X(i,x))/sqrt(Resolution); /*
matrix r1(Resolution,1);
for (i=0;i<Resolution;i++) r1(i)=1;
Z=X*r1; // correlating with the all 1 vector
for (i=0;i<g;i++) if (norm(Z(i)-1)<0.0001) Z(i)=1;
*/
Y=ortho(X);
Z=X*trans_conj(Y);   // now the rows of Z contains the symbols.
printf("\n X:");
printmatrix(X,0.001);
printf("\n Y:");
printmatrix(Y,0.001);
printf("\n Z:");
printmatrix(Z,0.001);

return(Z);
}
endif if !CPM
void prepare()   // very odd way of doing things... (but correct)
{
//NOTE: if (v[0] != v[1]) for a symbol it should not be included
in const list //though it will be included in this function. It
shouldnt matter.

int state,i;
int w,k,j,r,t,c,l,x,y;
int Input_value[N],h[K];
struct {int ind; int offset;} const_seq_member[N];
// work out semi-states.
for (state=0;state<N;state++) {
   for (i=0;i<R;i++) { // i!=input !
      Next[state][i]=(state*R+i) % N;
      Prev[state][i]=((state+N*i)/R) % N;
      }
   }
w=1;
for (t=0;t<D;t++) Output[0].v[t]=1;
for (k=0;k<K;k++) {
   for (j=0;j<N;j+=N/w) {
```

A- 4

```
    for (r=1;r<R;r++) {
        for (t=0;t<D;t++) {
          complex a;
          a=Output[j+N/w/R*(r-1)].v[t]*Base[K-k-1][t];
          // against numerical errors
          if (abs(a-1)   <1e-13) a=1;
          if (abs(a+1)   <1e-13) a=-1;
          if (abs(a+J)   <1e-13) a=-J;
          if (abs(a-J)   <1e-13) a=J;
          if (abs(a-1*Q) <1e-13) a=1*Q;
          if (abs(a+1*Q) <1e-13) a=-1*Q;
          if (abs(a+J*Q) <1e-13) a=-J*Q;
          if (abs(a-J*Q) <1e-13) a=J*Q;
          Output[j+N/w/R*r].v[t]=a;
          }
        }
      }
    w*=R;
    }
t=0;
for (i=0;i<N;i++) {
  if ((c=check_const(i,0))>=0) {
      const_seq_member[t].ind=i;
      const_seq_member[t++].offset=c;
      if (i==Na) {   // 0 and multiples of Na must be in seperate
groups. //    If this happen try to remove from being const
symbols in which v[0]!=v[1]. //    see note above.
        printf("\nunable to reduce this code\n");
        exit(0);
        }
//   printf("\n");
//   for (j=0;j<20;j++) printbaseR(list[j]);
      }
  }
for (i=0;i<N;i++) Input_value[i]=-1;
for (i=0;i<Na;i++) if (Input_value[i]==-1) {
  for (j=0;j<t;j++) {
    y=const_seq_member[j].ind;
    x=i;
//   l=x(add mod 4)y;

l=0;
    for (k=0;k<K;k++) {
      h[k]=((x&(R-1))+(y&(R-1))) & (R-1);
      x>>=B;
      y>>=B;
      }
    for (k=K-1;k>=0;k--) l=(l<<B)+h[k];
    Input_value[l % (Na)]=const_seq_member[j].offset;
    }
  }
// reduce states. This is part of old way.
for (state=0;state<Na;state++) {
  for (i=0;i<R;i++) { // i=input
    Next[state][i]=(state*R+((i+Input_value[state])%R)) % (Na);
    Prev[state][i]=state/R+i*Na/R;
```

A- 5

```
    }
  }
/*
// form Prev out of Next
for (state=0;state<Na;state++) for (i=0;i<R;i++)
Prev[state][i]=-1; for (state=0;state<Na;state++) for
(i=0;i<R;i++) {
  a=Next[state][i];
  for (j=0;j<R;j++) {
     if (Next[state][j]==a)
  Prev[next
 */
} else // cpm
void prepare()
{
int i,j,a,b,g,m,c,new_phase_state,gg,ggg;
matrix Z; // will contain the correlations of all the difference
symbols //as rows (R^G symbols).

Z=prepare_cpm_symbols();
if (Z.columns!=D) {
  printf("Wrong D, need to be %d",Z.columns);
  exit(0);
  }
gg=pow(R,G-1);
ggg=gg/R;
complex rot;
#if G>1
for (i=0;i<Na;i++) {
  b=i%gg;
  m=b/ggg; // phase transition symbol.
  c=b*R;
  rot=polar(1,h*M_PI*index_to_inp_symbol(m));
  for (j=0;j<R;j++) {
    Output[i*R+j].rotation=rot;
    g=c+j;
    int t;
    for (t=0;t<D;t++) Output[i*R+j].v[t]=Z(g,t);
    Next[i][j]=(i*R+j)%Na;
    Prev[i][j]=i/R+j*Na/R;
    }
  }
else
for (i=0;i<Na;i++) {
  for (j=0;j<R;j++) {
    m=j;
    rot=polar(1,h*M_PI*index_to_inp_symbol(m));
    Output[i*R+j].rotation=rot;
    g=j;
    int t;
    for (t=0;t<D;t++) Output[i*R+j].v[t]=Z(g,t);
    Next[i][j]=(i*R+j)%Na;
    Prev[i][j]=i/R+j*Na/R;
    }
```

```
                                A- 6
}
endif

/*
double S0,C0;

for (i=0;i<Na;i++) { // i can be seen as shift register contents.
 for (j=0;j<R;j++) { // j is current input.
    Output[i*R+j].rotation=polar(1,h*M_PI*(2*j-1));
    Next[i][j]=((i<<B)+j) % Na;
    Prev[i][j]=((i+Na*j)>>B);
// Good for binary CPFSK: (now included in the general case)
if (j==0) { Output[i*R+j].v[0]=1; Output[i*R+j].v[1]=0; }    else
if (j==1) {
    S0=sin(2*M_PI*h)/(2*M_PI*h);
    C0=(cos(2*M_PI*h)-1)/(2*M_PI*h);
    Output[i*R+j].v[0]=complex(S0,C0);
    Output[i*R+j].v[1]=sqrt(1-S0*S0-C0*C0);
    }

}
  }
 */
}
endif void Encode(int inp,complex *out)    /* inp is a bit array,out
array of D coefs */ {
int i,a;

if (inp>R-1) inp=R-1;
State=Next[a=State][inp];
#if CPM
for(i=0;i<D;i++) out[i]=Output[(a<<B)+inp].v[i]*rotation;
rotation*=Output[(a<<B)+inp].rotation;
#else
for(i=0;i<D;i++) out[i]=Output[(a<<B)+inp].v[i];
#endif
} void printcomplex1(complex a)
{
if (a==Q) printf(" +Q");
else if (a==J*Q) printf(" JQ");
else if (a==-Q) printf(" -Q");
else if (a==-J*Q) printf("-JQ");
else if (real(a)!=0) {
  if (real(a)==1) printf(" +1");
  else if (real(a)==-1) printf(" -1");
  else printf("%2.2g",real(a));
  if (imag(a)!=0) printf("+%2.2g*J",imag(a));
  }
else if (imag(a)==1) printf(" +J");
else if (imag(a)==-1) printf(" -J");
```

A- 7

```c
else if (imag(a)!=0) printf("%2.2g*J",imag(a));
else printf("0");
printf(" ");
} double metric(symbol_link *link)   // Inps is global.
{
int i,t;
double s;

complex met;

// go back in time.
met=0;
for (i=0;i<L;i++) {
   for(t=0;t<D;t++)
        met+=Inps[i][t]*conj(link->s.v[t]);
   link=link->link;
#if CPM
   if (i<L-1) met*=conj(link->s.rotation);
#endif
   }
s=norm(met);
return(s);
} int Decode(complex *inp)   /* inp is array of D complex numbers,
which is one received symbol. */
{
int pntr,state,i,j,a;
double metr[R];
double Acc_new[Na];
double max;
int ind;
symbol_link curr_output,*p1,*p2,**Out_His,**Out_His_new;
double tmp;

Out_His=Output_History[I&1];
Out_His_new=Output_History[!(I&1)];
//printf("%d ",I);
for(j=L-2;j>=0;j--) for (i=0;i<D;i++) Inps[j+1][i]=Inps[j][i];
for (i=0;i<D;i++) Inps[0][i]=inp[i];
for (state=0;state<Na;state++) {
/* add compare select */
   if (state==56) {
      printf("");
      }
   max=-1e30;
   p1=Out_His_new[state];
   for (i=0;i<R;i++) {
      int prv;
      double acc; // for test only
      curr_output.link=Out_His[prv=Prev[state][i]];
      for (j=0;j<R;j++) if (Next[prv][j]==state) break;
      curr_output.s=Output[prv*R+j+(i&((1<<P)-1))]; // branches
```

A- 8

```
are enumerated forwards //
curr_output.s=Output[state+((prv<<B)&-(Na))];

metr[i]=metric(&curr_output);
//    if (Prev[state][i]!=0) acc=Acc[Prev[state][i]];
//    else acc=Acc0;                //
!!!!!!!!!!!!!!!!!!!!!!!!!!!!!!!!!!!!    if
((tmp=Acc[Prev[state][i]]+metr[i])>max) {
        max=tmp;
        ind=i;
        #if zero_input
        if (state==0 && ind!=0) {
            printf("*%ld*",I);
            if (I-last_err>10) { // Warning: last ep event isnt
counted.          seq_err_cnt++;
                if (first_err>0) {
                    ep_len=last_err-first_err+1;
                    if (ep_len<=Max_len_hist)
ep_hist[ep_len]++;            else ep_hist[0]++;
                    if (ep_len>1) {
                        avv_ep_len+=ep_len;
                        avv_ep_len_cnt++;
                    }
                }
                first_err=I;
            }
            last_err=I;
        }
        #endif
        p1->s=curr_output.s;
        }
    }
    History[history_cnt][state]=ind;
//#if Disable_error_propagation  // forcing correct decision. //
if (state==0) {
//    max=Acc[0]+metr[0];
//    ind=0;
//    p1->s=Output[0];
//  }
//#endif
    Acc_new[state]=max;
    p1=p1->link;
    p2=Out_His[Prev[state][ind]];
    for (i=1;i<L-1;i++) {
        p1->s=p2->s;
        p1=p1->link;
        p2=p2->link;
        }
    }
//Acc0 is the Acc corresponding to the whole 0 sequence.
complex met;
int t;
/*
met=0;
for (i=0;i<L;i++)
    for(t=0;t<D;t++)
```

A-9

```
        met+=Inps[i][t];
Acc0+=pow(abs(met),2);
*/ if (I==193) {
  printf("");
  }
pntr=history_cnt;
history_cnt++;
history_cnt%=Memory_Length;
/* copy Acc_new to Acc and search for best sorvivor */
max=Acc_new[0]; ind=0;
for (state=0;state<Na;state++) {
  Acc[state]=Acc_new[state];
  if (Acc_new[state]>max) {max=Acc_new[state]; ind=state;}
  }

//if ((I&1)==0) printf("\n");
//printf("I=%4ld | ind=%4d | max=%7.1f &&",I,ind,max);

/* trace back */
next = Prev[ind][History[pntr][ind]];
for (i=0;i<Memory_Length-1;i++) {
  pntr--; if (pntr<0) pntr=Memory_Length-1;
  next = Prev[next][History[pntr][a=next]];
  }
for (i=0;i<R;i++) if (Next[next][i]==a) break;
if (i==R) {
  printf("\nerror\n");
  exit(0);
  }
next=a;   // for comparison with del_state
return i+(History[pntr][a]&((1<<P)-1));
} int Produce_input() // not used
{
int z,out;

out=PN&1;
z=((PN&2)>>1) ^ (PN&1);
PN|=z<<6;
PN>>=1;
return(out);
} void normal(double &n1,double &n2,double sigma)
{
int i;

n1=n2=0;
for (i=0;i<25;i++) {n1+=rand()-16384;}
for (i=0;i<25;i++) {n2+=rand()-16384;}
n1/=47296.534/sigma;
n2/=47296.534/sigma;
}
```

A-10

```
/*
char Output1(int state)
{
if (real(Output[state].v)==1) return('+');
else return('-');
} char Output2(int state)
{
if (imag(Output[state].v)==1) return('+');
else return('-');
}
*/ void main(int argc,char **argv)
{
int i,j,k;
int inp,dec;
complex out[D];
int delay_cnt,delayed_input[Memory_Length],del_state;
int delayed_state[Memory_Length],del_inp;
complex out1[D];
double ebn0,sigma,n1,n2;
long NO_OF_SYMBOLS=2000,ber;
long a;
long Sber;              // symbols ber
long State_ber;         // unequal states
long last_I=0,Seq_ber=0;
//int ind; double max;
long seq_err,his[100];
int save[100],save2[100];
int t;
symbol_link *p;
int prev_del_state,prev_next;
complex phase=polar(1,0); // arbitary constant phase shift last_err=first_err=ep_len=avv_ep_len=avv_ep_len_cnt=seq_err_cn
t=0 ; memset(ep_hist,0,sizeof(ep_hist));

a=CODE;
for (i=0;i<K;i++) {
   for (t=0;t<D;t++) {
      switch (a&(R-1)) {
        case 0:Base[i][t]=1; break;
        case 1:Base[i][t]=-1; break;
        case 2:Base[i][t]=J; break;
        case 3:Base[i][t]=-J; break;

case 4:Base[i][t]=Q;  break;
        case 5:Base[i][t]=-Q; break;
        case 6:Base[i][t]=J*Q; break;
        case 7:Base[i][t]=-J*Q; break;
```

A-11

```
      }
    a>>=B;
    }
  }
PN=1;
history_cnt=delay_cnt=0;
memset(History,0,sizeof(History));
memset(his,0,sizeof(his));
memset(save,0,sizeof(save));
for (i=1;i<Na;i++) Acc[i]=-1e30;
Acc[0]=0;
Acc0=0;
for (i=0;i<L;i++) {
  for (j=0;j<D;j++) Inps[i][j]=0; // initial cond.
  }

// Output_History  points to linked list .
for(k=0;k<2;k++) for(i=0;i<Na;i++) {
  p=Output_History[k][i]=(symbol_link
*)malloc(sizeof(symbol_link));   if (p==NULL) {
    printf("Out of memory");
    exit(0);
    }
  for (t=0;t<D;t++) p->s.v[t]=1;
  #if CPM
  p->s.rotation=1;
  #endif
  for (j=1;j<L-1;j++) {
     p=p->link=(symbol_link *)malloc(sizeof(symbol_link));
     if (p==NULL) {
      printf("Out of memory");
      exit(0);
      } if CPM
     p->s.rotation=1;
     #endif
     for (t=0;t<D;t++) p->s.v[t]=1;
     }
  p->link=NULL;   // not needed, just for comleteness.
  }

State=0;
prepare();
Sber=ber=seq_err=State_ber=0;

if (argc<3) {
  printf("\nENTER Eb/N0 : "); cin>>ebn0;
  printf("\nENTER NO OF BITS : "); cin>>a; NO_OF_SYMBOLS=a/B;
} else {
  printf("--------------- START ----------------\n");
  ebn0=atof(argv[1]);
  printf("Eb/N0 = %f\n",ebn0);
  NO_OF_SYMBOLS=atol(argv[2])/B;
  printf("NO OF BITS = %ld\n",atol(argv[2]));
```

A-12

```
  printf("RUTI = HAMUDA\n");
  } ebn0=pow(10,ebn0/10);
if !CPM
sigma=sqrt(D/(2*ebn0*B));    // r=1+n for each dimention
#else
sigma=sqrt(1/(2*ebn0*B));    // r=1+n for each dimention
endif srand(131);
//randomize();
for (I=0;I<=NO_OF_SYMBOLS+Memory_Length;I++) {
   if (!(I%500)) printf(" %ld",I*B);
   if   (kbhit()&&getch()=='q')   {NO_OF_SYMBOLS=I-Memory_Length;
break;} #if !zero_input
   inp=random(R)%R;
#else
   inp=0;
endif
   Encode(inp,out);
   del_inp=delayed_input[delay_cnt];
   del_state=delayed_state[delay_cnt];
   delayed_state[delay_cnt]=State;
   delayed_input[delay_cnt++]=inp;
   delay_cnt%=(Memory_Length-1);
   for (j=0;j<D;j++) {
      normal(n1,n2,sigma);
       out1[j]=(complex(n1,n2)+out[j])*phase;
      }
// max=0;
//   for (i=0;i<D;i++) if (abs(out1[i])>max) {max=abs(out1[i]);
ind=i;}

//   if ((a=ind ^ State/2)!=0) for (i=0;i<2*B-2;i++,a>>=1)
Sber+=a&1;   dec=Decode(out1);
   if (I==472) {
      a=I;
      }
   if (I>=Memory_Length-1)    {
      if ((a=dec ^ del_inp)!=0) {
         printf("%5ld",I);
         if (seq_err>=20) seq_err=0;
         for (i=0;i<B;i++,a>>=1) ber+=a&1;
         Sber++;
         }
      if (del_state != next) {
         if (I-last_I>5)
                       Seq_ber++;
         last_I=I;
         }
      State_ber += del_state != next;
      if (del_state != next && seq_err<20) {
         if (seq_err==0) {
            save2[0]=prev_del_state;
            save[0]=prev_next;
```

A-13

```
        }
      save[++seq_err]=next;
      save2[seq_err]=del_state;
      if (seq_err>=20) seq_err=20;
      }
    if (del_state == next || I==NO_OF_SYMBOLS+Memory_Length ||
seq_err==20) {          if (seq_err>0) {
         his[seq_err]++;
         save[++seq_err]=next;
         save2[seq_err]=del_state;
#if !CPM   && !P
         for (i=1;i<=seq_err-1;i++)
            if (Output[save[i]+((save[i-1]<<B)&-
(Na))].v[0]!=Output[save[i+1]+
((save[i]<<B)&-(Na))].v[0] ||
Output[save[i]+((save[i-1]<<           B)&-
(Na))].v[1]!=Output[save[i+1]+
                ((save[i]<<B)&-(Na))].v[1]) break;

if (i==seq_err) continue;
#endif
         printf("\nTRANS: ");
         for (i=0;i<=seq_err;i++) {printbaseR(save2[i]);}
         printf("\nREC  : ");
         for (i=0;i<=seq_err;i++) printbaseR(save[i]);
#if !CPM   && !P
         if (seq_err==20) printf("... ");
         for (t=0;t<D;t++) {
           printf("\n         ");
           for (i=1;i<=seq_err;i++) {
printcomplex1(Output[save[i]+((save[i-1]<<B)&-
(Na))].v[t]);}          }
#endif
         }
      if (seq_err!=20) seq_err=0;
      else seq_err=22;
      }
    }
  prev_del_state=del_state;
  prev_next=next;
  } printf("\nThe BER is %g\n",(double)ber/NO_OF_SYMBOLS/B);
printf("\nThe BER in symbols is
%g\n",(double)Sber/NO_OF_SYMBOLS); printf("\nThe BER in states
is %g\n",(double)State_ber/NO_OF_SYMBOLS); printf("\nThe BER in
sequences is %g\n",(double)Seq_ber/NO_OF_SYMBOLS);

//printf("\nThe BER in T'FSK is
%3g\n",(double)Sber/NO_OF_SYMBOLS/B); /* In QPSK the sigma must
be sqrt(2) less because the signal's energy is double */
#if zero_input
printf("\nAverage ep length is
%g\n",(float)avv_ep_len/avv_ep_len_cnt); printf("\nTotal error
events %ld, Total ep events is
```

A-14

```
%ld\n",seq_err_cnt,avv_ep_len_cnt); printf("\nb  errors  hist:
(also written to file ep_hist.dat "); printf("Above %d :
%ld\n",Max_len_hist,ep_hist[0]);
for  (i=1;i<=Max_len_hist;i++)  if  (ep_hist[i])  printf("%d-%d
",i,ep_hist[i]); FILE *fp=fopen("ep_hist.dat","w");
for  (i=1;i<=Max_len_hist;i++)  fprintf(fp,"%ld\n",ep_hist[i]);
fclose(fp);
endif sound(1500);
delay(100);
nosound();
if (argc<3) getch();
nosound();
}
```

B- 1

APPENDIX B

The following is a listing of a C-language implementation of the MDFA algorithm.

```c
// MDFA
#include "complex.h"
#include "stdlib.h"
#include "stdio.h"
#include "mem.h"
#include "conio.h"
#include "dos.h"

define zero_input 1 define L 5    // number of symbols in one integration.
define B 2    // number of bits per symbol
#define Na 64  // number of states.
#define K 4    // log2(N)/B + 1 , constraint length.
#define T 2    // number of outputs
#define R 4    // 2^B
#define N (Na*R)   // number of semi-states. (old definition)
define ML 32 define CODE 31209
double Acc[Na]; // accumulates metrics
double Acc0;
int History[ML][Na];   /* I could use one bit per entry instead
of whole int but there is no need */
int PN;  // for the input preparation
int history_cnt; // modulu counter
int State; // remember the state for encode.
int Next[N][R];   // for each state, what the next and Previous.
int Prev[N][R];
typedef struct {complex v[T];} symbol;
symbol Output[N];
complex Inps[L][T];
typedef struct symbol_link {
  symbol s;
  symbol_link *link;
} symbol_link;
symbol_link *Output_History[2][Na];

long I;
#define  J complex(0,1)
complex  Q=polar(1,M_PI_4);
int next;
complex Base[K][T];
int data_in; // input to the encoder.

void printbaseR(int a)
{
int i,h[20];
for (i=0;i<K-1;i++) {
  h[i]=a & (R-1);
  a >>= B;
```

```
                                B- 2
  }
  for (i=K-2;i>=0;i--) printf("%d",h[i]);
  printf(" ");
} int check_const(int g,int n)   // g is from the N semi-states { int b;
int k;

if (n>20) return(0);

b=((g<<B) & (N-1));
for (k=0;k<R;k++) {
  int t;
  for (t=0;t<T;t++)
     if (Output[b+k].v[t]!=Output[g].v[t]) break;
  if (t==T) {
     if (check_const(b+k,n+1)>=0) return(k);
     }
  }
if (k==R) return(-1);
//list[j]=g;
} void prepare()
{
//NOTE: if (v[0] != v[1]) for a symbol it should not be included
in const list //though it will be included in this function. It
shouldnt matter.

int state,i;
int w,k,j,r,t,c,l,x,y;
int Input_value[N],h[K];
struct {int ind; int offset;} const_seq_member[N];
// work out semi-states.
for (state=0;state<N;state++) {
  for (i=0;i<R;i++) { // i!=input !
     Next[state][i]=(state*R+i) % N;
     Prev[state][i]=((state+N*i)/R) % N;
     }
  }
w=1;
for (t=0;t<T;t++) Output[0].v[t]=1;
for (k=0;k<K;k++) {
  for (j=0;j<N;j+=N/w) {
     for (r=1;r<R;r++) {
        for (t=0;t<T;t++) {
           complex a;
           a=Output[j+N/w/R*(r-1)].v[t]*Base[K-k-1][t];
           // against numerical errors
           if (abs(a-1) <1e-13) a=1;
           if (abs(a+1) <1e-13) a=-1;
           if (abs(a+J) <1e-13) a=-J;
```

B- 3

```
            if (abs(a-J) <1e-13) a=J;
            if (abs(a-1*Q) <1e-13) a=1*Q;
            if (abs(a+1*Q) <1e-13) a=-1*Q;
            if (abs(a+J*Q) <1e-13) a=-J*Q;
            if (abs(a-J*Q) <1e-13) a=J*Q;
            Output[j+N/w/R*r].v[t]=a;
          }
        }
      }
   w*=R;
   }
t=0;
for (i=0;i<N;i++) {
   if ((c=check_const(i,0))>=0) {
      const_seq_member[t].ind=i;
      const_seq_member[t++].offset=c;
      if (i==Na) {    // 0 and multiples of Na must be in seperate
groups. //   If this happen try to remove from being const
symbols in which v[0]!=v[1]. //   see note above.
         printf("\nunable to reduce this code\n");
         exit(0);
         }
//    printf("\n");
//    for (j=0;j<20;j++) printbaseR(list[j]);
   }
}
for (i=0;i<N;i++) Input_value[i]=-1;
for (i=0;i<Na;i++) if (Input_value[i]==-1) {
   for (j=0;j<t;j++) {
      y=const_seq_member[j].ind;
      x=i;
 //   l=x(add mod 4)y;

l=0;
      for (k=0;k<K;k++) {
        h[k]=((x&(R-1))+(y&(R-1))) & (R-1);
        x>>=B;
        y>>=B;
        }
      for (k=K-1;k>=0;k--) l=(l<<B)+h[k];
      Input_value[l % (Na)]=const_seq_member[j].offset;
      }
   }
// reduce states.
for (state=0;state<Na;state++) {
   for (i=0;i<R;i++) { // i=input
      Next[state][i]=(state*R+((i+Input_value[state])%R)) % (Na);
      Prev[state][i]=state/R+i*Na/R;
      }
   }

} void Encode(int inp,complex *out)     /* inp is a bit array,out
array of T coefs */ {
```

B- 4

```
int i,a;

if (inp>R-1) inp=R-1;
State=Next[a=State][inp];
for(i=0;i<T;i++) out[i]=Output[State+((a<<B)&-(Na))].v[i];
} void printcomplex(complex a)
{
if (a==Q) printf(" +Q");
else if (a==J*Q) printf(" JQ");
else if (a==-Q) printf(" -Q");
else if (a==-J*Q) printf("-JQ");
else if (real(a)!=0) {
  if (real(a)==1) printf(" +1");
  else if (real(a)==-1) printf(" -1");
  else printf("%2.2g",real(a));
  if (imag(a)!=0) printf("+%2.2g*J",imag(a));
  }
else if (imag(a)==1) printf(" +J");
else if (imag(a)==-1) printf(" -J");
else if (imag(a)!=0) printf("%2.2g*J",imag(a));
else printf("0");
printf(" ");
} double metric(symbol_link *link)    // Inps is global.
{
int i,t;
double s;

complex met;

// go back in time.  Note states[i] are semi-states.
met=0;
for (i=0;i<L;i++) {
  for(t=0;t<T;t++)
      met+=Inps[i][t]*conj(link->s.v[t]);
  link=link->link;
  }
s=pow(abs(met),2);
return(s);
} double cmetric(symbol_link *link,double &metr)    // Inps is
global. {
int i,t;
double s;

complex met,g[L];

// go back in time.
s=0;
```

B- 5

```
met=0;
for (i=0;i<L;i++) {
   for(t=0;t<T;t++)
       met+=Inps[i][t]*conj(link->s.v[t]);
   g[i]=met;
   link=link->link;
   } metr=norm(met);
double max=0,avv=0;
int ind,k;
complex ro=met/(L*T);
//for (k=0;k<8;k++) {
//   ro=polar(1,k*M_PI/4);
   s=metr;
   for (i=0;i<L-1;i++) {
       s+=norm(g[i]+ro*T*(L-i-1));
       }
//   if (s>max) {max=s; ind=k;}
//   avv+=s;
//   }
//avv/=8;
//if (I>=10 && state==0) {
//   state=0;
//   }
return(s);
} int Decode(complex *inp)   /* inp is array of T complex numbers,
which is one received symbol. */
{
int pntr,i,j,a;
double metr[R],metr1[R];
double Acc_new[Na];
double max;
int ind;
symbol_link curr_output,*p1,*p2,**Out_His,**Out_His_new;
int state;
double tmp;

Out_His=Output_History[I&1];
Out_His_new=Output_History[!(I&1)];
//printf("%d ",I);
for(j=L-2;j>=0;j--) for (i=0;i<T;i++) Inps[j+1][i]=Inps[j][i];
for (i=0;i<T;i++) Inps[0][i]=inp[i];
for (state=0;state<Na;state++) {
/* add compare select */
   if (state==56) {
      printf("");
      }
   max=-1e31;
   p1=Out_His_new[state];
   for (i=0;i<R;i++) {
      int prv;
      double acc; // for test only
      curr_output.link=Out_His[prv=Prev[state][i]];
```

B- 6

```
      curr_output.s=Output[state+((prv<<B)&-(Na))];
      metr[i]=cmetric(&curr_output,metr1[i]);
      if ((tmp=Acc[Prev[state][i]]+metr[i])>max) {
        max=tmp;
        ind=i;
        p1->s=curr_output.s;
        }
      }
   if (state==State && Next[Prev[state][ind]][data_in]!=state) {
      printf("*%ld*",I);
      }
   Acc_new[state]=Acc[Prev[state][ind]]+metr1[ind];//max;
   History[history_cnt][state]=Prev[state][ind];
   p1=p1->link;
   p2=Out_His[Prev[state][ind]];
   for (i=1;i<L-1;i++) {
      p1->s=p2->s;
      p1=p1->link;
      p2=p2->link;
      }
   }
//Acc0 is the Acc corresponding to the whole 0 sequence.
complex met;
int t;

met=0;
for (i=0;i<L;i++)
   for(t=0;t<T;t++)
      met+=Inps[i][t];
Acc0+=pow(abs(met),2);

if (I==193) {
   printf("");
   }
pntr=history_cnt;
history_cnt++;
history_cnt%=ML;
/* copy Acc_new to Acc and search for best sorvivor */
max=Acc_new[0]; ind=0;
for (state=0;state<Na;state++) {
   Acc[state]=Acc_new[state];
   if (Acc_new[state]>max) {max=Acc_new[state]; ind=state;}
   }

//if ((I&1)==0) printf("\n");
//printf("I=%4ld | ind=%4d | max=%7.1f &&",I,ind,max);

/* trace back */
if (I<ML) return(0);
next = History[pntr][ind];
for (i=0;i<ML-1;i++) {
   pntr--; if (pntr<0) pntr=ML-1;
   next = History[pntr][a=next];
   }
for (i=0;i<R;i++) if (Next[next][i]==a) break;
```

B- 7

```
if (i==R) {
  printf("\nerror\n");
  exit(0);
  }
next=a;   // for comparison with del_state
return i;
} int Produce_input() // not used
{
int z,out;

out=PN&1;
z=((PN&2)>>1) ^ (PN&1);
PN|=z<<6;
PN>>=1;
return(out);
} void normal(double &n1,double &n2,double sigma)
{
int i;

n1=n2=0;
for (i=0;i<25;i++) {n1+=rand()-16384;}
for (i=0;i<25;i++) {n2+=rand()-16384;}
n1/=47296.534/sigma;
n2/=47296.534/sigma;
}

/*
char Output1(int state)
{
if (real(Output[state].v)==1) return('+');
else return('-');
} char Output2(int state)
{
if (imag(Output[state].v)==1) return('+');
else return('-');
}
*/ void main(int argc,char **argv)
{
int i,j,k;
int dec;
complex out[T];
int delay_cnt,delayed_input[ML],del_state;
int delayed_state[ML],del_data_in;
complex out1[T];
double ebn0,sigma,n1,n2;
long NO_OF_SYMBOLS=2000,ber;
long a;
```

```
                        B- 8
long Sber;          // symbols ber
long State_ber;     // unequal states
long last_I=0,Seq_ber=0;
//int ind; double max;
long seq_err,his[100];
int save[100],save2[100];
int t;
symbol_link *p;
int prev_del_state,prev_next;
complex phase=polar(1,135*M_PI/180); // arbitary constant phase
shift int seed=131;

a=CODE;
for (i=0;i<K;i++) {
  for (t=0;t<T;t++) {
      switch (a&(R-1)) {
        case 0:Base[i][t]=1; break;
        case 1:Base[i][t]=-1; break;
        case 2:Base[i][t]=J; break;
        case 3:Base[i][t]=-J; break;

case 4:Base[i][t]=Q;   break;
          case 5:Base[i][t]=-Q; break;
          case 6:Base[i][t]=J*Q; break;
          case 7:Base[i][t]=-J*Q; break;
          }
     a>>=B;
     }
  }
PN=1;
history_cnt=delay_cnt=0;
memset(History,0,sizeof(History));
memset(his,0,sizeof(his));
memset(save,0,sizeof(save));
for (i=0;i<Na;i++) Acc[i]=-1e30;
Acc[0]=0;
Acc0=0;
for (i=0;i<L;i++) {
  for (j=0;j<T;j++) Inps[i][j]=0; // initial cond.
  }

// Output_History  points to linked list .
for(k=0;k<2;k++) for(i=0;i<Na;i++) {
  p=Output_History[k][i]=(symbol_link
*)malloc(sizeof(symbol_link));   if (p==NULL) {
    printf("Out of memory");
    exit(0);
    }
  for (t=0;t<T;t++) p->s.v[t]=1;
  for (j=1;j<L-1;j++) {
     p=p->link=(symbol_link *)malloc(sizeof(symbol_link));
     if (p==NULL) {
```

B- 9

```
      printf("Out of memory");
      exit(0);
      } for (t=0;t<T;t++) p->s.v[t]=1;
    }
  p->link=NULL;   // not needed, just for comleteness.
  }

State=0;
prepare();
Sber=ber=seq_err=State_ber=0;

if (argc<3) {
  printf("\nENTER Eb/N0 : "); cin>>ebn0;
  printf("\nENTER NO OF BITS : "); cin>>a; NO_OF_SYMBOLS=a/B;
} else {
  cout<<"-------------- START -----------------\n";
  ebn0=atof(argv[1]);
  cout<<"Eb/N0 = "<<ebn0<<"\n";
  NO_OF_SYMBOLS=atol(argv[2])/B;
  cout<<"NO OF BITS = "<<atol(argv[2])<<"\n";
  cout<<"RUTI = HAMUDA\n";
  }
if (argc==4) seed=atoi(argv[3]);

ebn0=pow(10,ebn0/10);
sigma=sqrt(T/(2*ebn0*B));    // r=1+n for each dimention
srand(seed);
//randomize();
for (I=0;I<=NO_OF_SYMBOLS+ML;I++) {
  if (!((I*B)%100)) printf(" %ld",I*B);
  if (kbhit()&&getch()=='q') {NO_OF_SYMBOLS=I-ML; break;}
#if zero_input
  data_in=0;
#else
  data_in=random(R);
#endif
  Encode(data_in,out);
  del_data_in=delayed_input[delay_cnt];
  del_state=delayed_state[delay_cnt];
  delayed_state[delay_cnt]=State;
  delayed_input[delay_cnt++]=data_in;
  delay_cnt%=(ML-1);
  for (j=0;j<T;j++) {
    normal(n1,n2,sigma);
    out1[j]=(complex(n1,n2)+out[j])*phase;
    }
  dec=Decode(out1);
  if (I>=ML-1)   {
     if ((a=dec ^ del_data_in)!=0) {
       printf("%5ld",I);
       if (seq_err>=20) seq_err=0;
       for (i=0;i<B;i++,a>>=1) ber+=a&1;
       Sber++;
       }
```

B-10

```
      State_ber += del_state != next;

if (del_state != next) {
         if (I-last_I>5)
                     Seq_ber++;
         last_I=I;
         } if (del_state != next && seq_err<20) {
        if (seq_err==0) {
           save2[0]=prev_del_state;
           save[0]=prev_next;
           }
        save[++seq_err]=next;
        save2[seq_err]=del_state;
        if (seq_err>=20) seq_err=20;
        }
      if (del_state == next || I==NO_OF_SYMBOLS+ML || seq_err==20)
{     if (seq_err>0) {
           his[seq_err]++;
           save[++seq_err]=next;
           save2[seq_err]=del_state;
           for (i=1;i<=seq_err-1;i++)
              if (Output[save[i]+((save[i-1]<<B)&-
(Na))].v[0]!=Output[save[i+1]+
((save[i]<<B)&-(Na))].v[0] ||
Output[save[i]+((save[i-1]<<          B)&-
(Na))].v[1]!=Output[save[i+1]+
                     ((save[i]<<B)&-(Na))].v[1]) break;

if (i==seq_err) continue;
           printf("\nTRANS: ");
           for (i=0;i<=seq_err;i++) {printbaseR(save2[i]);}
           printf("\nREC  : ");
           for (i=0;i<=seq_err;i++) printbaseR(save[i]);
           if (seq_err==20) printf("... ");
           for (t=0;t<T;t++) {
             printf("\n            ");
             for (i=1;i<=seq_err;i++) {
                     printcomplex(Output[save[i]+((save[i-1]<<B)&-
(Na))].v[t]);}            }
             }
         if (seq_err!=20) seq_err=0;
         else seq_err=22;
         }
      }
   prev_del_state=del_state;
   prev_next=next;
   } printf("\nThe BER is %g\n",(double)ber/NO_OF_SYMBOLS/B);
printf("\nThe BER in symbols is
%g\n",(double)Sber/NO_OF_SYMBOLS); printf("\nThe BER in states
is %g\n",(double)State_ber/NO_OF_SYMBOLS); printf("\nThe BER in
sequences is %g\n",(double)Seq_ber/NO_OF_SYMBOLS);
```

B-11

```
//printf("\nThe BER in T'FSK is
%3g\n",(double)Sber/NO_OF_SYMBOLS/B); /* In QPSK the sigma must
be sqrt(2) less because the signal's energy is double */

/*
sound(1500);
delay(100);
nosound();
if (argc<3) getch();
nosound();
*/
}
```

C- 1

APPENDIX C

The following is a listing of a C-language software implementation of the EFDFA algorithm.

```
//EFDFA
#define DOS 0 // unix version doesn't support cpm !! (because of matrix.h)
#include "stdlib.h"
#include "stdio.h"
#if DOS
#include "mem.h"
#include "conio.h"
#include "dos.h"
#include "matrix.h"
#else
#include "math.h"
endif define zero_input 0
define tst 1//zero_input
define btst 1 define L 20  // number of symbols in one integration.
define B 1   // number of bits per symbol
#define Na 8  // number of states. For cpm R^(G-1+extra1+extra2) for codedcpm extra is defined by CODE
#define K 4    // log2(Na)/B+1
#define D 4    // number of outputs
#define R 2    // 2^B
#define MDFA 1 // use MDFA (1) or BDFA (0) for both backwords and forwards
#define ML 100   // also A=ML.
#define W L+20   // must be L<=W<=ML
#define CPM 2 // 2 for coded full response cpm (a specific form of R^D1 levels)
#define CODE (0x2e*4) //15243//7899501//11948574 //53666 for R=8,K=L=3 //1447 for R=8,K=2,L=2 //31426 R=4,K=4,L=4
#define Angle_in_L 0
#if CPM
#define h 1./4.
#define M 4                    // level of CPM = R for uncoded
#define G 1 // number of symbols in partial response
#define PULSE_TYPE 0   // 0-Linear 1-RC
#define index_to_inp_symbol(m) (2*(m)-R+1)
#define D1 2                   // at output of code.
#define Resolution 30
#endif
#define N (Na*R) // old definition
#define Two_ML (2*ML)
#define Input_Delay (3*ML)
#define path_size long  // long or int.
path_size extra_bit=((long)1<<(sizeof(path_size)*8-1));
#if DOS
#define mem_cpy(x,y) memcpy(x,y,sizeof(y))
#define mem_clr(x) memset(x,0,sizeof(x))
```

C- 2

```
#else
#define mem_cpy(x,y) for (i=0;i<sizeof(y);i++) ((char
*)x)[i]=((char *)y)[i];
#define mem_clr(x) for (i=0;i<sizeof(x);i++) ((char *)x)[i]=0;
struct complx
{
     double re,im;
};
struct complx mul(struct complx a,struct complx b)
{
struct complx c;

c.re = a.re*b.re-a.im*b.im;
c.im = a.re*b.im+a.im*b.re;
return(c);
} struct complx polar(double a,double b)
{
struct complx c;

c.re = a*cos(b);
c.im = a*sin(b);
return(c);
} define complex struct complx
define real(x) x.re
#define imag(x) x.im
complex z[64][D];
endif /*
if (L-1)*B>sizeof(path_size)*8-1   // has to be represented as
integers in history,projecting path
#error L and B combination too large
#endif
*/ int pr_cnt=0;
int cr;
double f_Acc[Na],nf2_Acc[Na],b_Acc[Na]; // accomulates metrics
Note b_Acc is waist
// of memory since this memory can be shared with the other
Acc's.
double Acc0; // for test only save the zero path acc.
/* I could use B bits per entry in History instead of
   whole int but there is no need in this program. */
path_size f_History[Two_ML][Na];     // if negative its no fit
Note:f_History can be int, just use another value for extra_bit
when using int for f_History.
path_size nf2_History[Two_ML][Na];   // if negative its the
projecting state
int b_History[Two_ML][Na];
```

C-3

```c
double Projected_Acc[L-1][Na];     // cyclic buffer
path_size Projecting_path[L-1][Na];     // cyclic buffer int acc_del_ptr; // pointer to the cyclic buffer.
int decoded[ML];
int decoded_state[ML];
// for tests
int save_state[5*ML];
long metric_cnt=0,metric_cnt2=0;
int b_error_hist[Two_ML+1];
int nf_errors;

int PN;  // for the input preparation
int State; // remember the state for encode.
int Next[N][R];   // for each state, what the next and Previous.
int Prev[N][R];
#if !CPM
typedef struct {complex v[D];} symbol;
#else
typedef struct {complex v[D]; complex rotation;} symbol;// phase rotation of this symbol.
complex Rotation; // its the transmitter phase state.
#endif
symbol Output[N];
complex b_Inps[L][D],Inps2[2*L-1][D],Inps1[L][D];   // Inps go back in time.
// Inps1 saves past input for forward1(),Inps2 for forward2().
typedef struct symbol_link {
  symbol s;
  symbol_link *link;
  } symbol_link;
symbol_link *f_Output_History[2][Na],
     *nf2_Output_History[2][Na],
     *b_Output_History[2][Na];  // b_Output_History can share memory with f or nf.
int inp_ptr; // pointer to the cyclic buffer Inp_blk
int inp_cnt; // index within last block of length ML
complex Inp_blk[Two_ML][D];
symbol_link future_list[L-1];
int start_flag;
long Blk_cnt;
long I;
#define J  complex(0,1)
#define Q  complex(sqrt(2)/2,sqrt(2)/2)

complex Base[K][D];
int delay_cnt,delayed_input[Input_Delay],del_state;
int delayed_state[Input_Delay],del_inp;

void printbaseR(int a)
{
int i,hh[20];
for (i=0;i<K-1;i++) {
  hh[i]=a & (R-1);
  a >>= B;
  }
```

```
                            C- 4
for (i=K-2;i>=0;i--) printf("%d",hh[i]);
printf(" ");
} int check_const(int g,int n)   // g is from the N semi-states { int b;
int k;

if (n>20) return(0);

b=((g<<B) & (N-1));
for (k=0;k<R;k++) {
   int t;
   for (t=0;t<D;t++)
#if DOS
     if (Output[b+k].v[t]!=Output[g].v[t]) break;
#else
     if (Output[b+k].v[t].re!=Output[g].v[t].re ||
       Output[b+k].v[t].im!=Output[g].v[t].im ) break;
endif if (t==D) {
      if (check_const(b+k,n+1)>=0) return(k);
      }
   }
if (k==R) return(-1);
//list[j]=g;
} if CPM
double phase_func(double t)
{
#if PULSE_TYPE==0
return(t/(2*G));
#endif
#if PULSE_TYPE==1
return(t/(2*G)-sin(2*M_PI*t/G)/(4*M_PI));
#endif
}
if DOS
matrix prepare_cpm_symbols()
{
int a,i,j,x,g;
g=pow(M,G);
matrix q(G,Resolution),A(g,G),X,Y,Z;
for (j=0;j<G;j++) for (x=0;x<Resolution;x++)
q(j,x)=phase_func(j+x/(float)Resolution);
for (i=0;i<g;i++) {
  a=i;
  for (j=0;j<G;j++) {
     A(i,j)=index_to_inp_symbol(a%M); // difference symbol.
     }
  }
```

C- 5

```
printmatrix(A);
X=A*q;
for (i=0;i<g;i++) for (x=0;x<Resolution;x++)
X(i,x)=exp(J*2*M_PI*h*X(i,x))/sqrt(Resolution);
/*
matrix r1(Resolution,1);
for (i=0;i<Resolution;i++) r1(i)=1;
Z=X*r1; // correlating with the all 1 vector
for (i=0;i<g;i++) if (norm(Z(i)-1)<0.0001) Z(i)=1;
*/
Y=ortho(X);
Z=X*trans_conj(Y);  // now the rows of Z contains the symbols.
/*intf("\n X:");
printmatrix(X,0.001);
printf("\n Y:");
printmatrix(Y,0.001);
*/
printf("\n Z:");
printmatrix(Z,0.001);
for (i=0;i<Z.rows;i++) printf("\n%g",norm(Z(i,'R')));
return(Z);
}
endif
#if CPM==1
void prepare()
{
int i,j,a,b,g,m,c,new_phase_state,gg,ggg,gggg;
matrix Z; // will contain the correlations of all the difference
symbols
//as rows (R^G symbols).

Z=prepare_cpm_symbols();
if (Z.columns!=D) {
  printf("Wrong D, need to be %d",Z.columns);
  exit(0);
  }
int extra1=(K-G)/2;
gg=pow(R,G-1+extra1);
ggg=gg/R;
gggg=pow(R,extra1);
complex rot;
if (G+extra1>1)
 for (i=0;i<Na;i++) {
   b=i%gg;
   m=b/ggg; // phase transition symbol.
   c=b*R;
   rot=polar(1,h*M_PI*index_to_inp_symbol(m));
   for (j=0;j<R;j++) {
      g=(c+j)/gggg;
      int t,z;
      Next[i][j]=(i*R+j)%Na;
     Prev[i][j]=i/R+j*Na/R;
      z=Next[i][j]+((i<<B)&-(Na));
      Output[z].rotation=rot;
      for (t=0;t<D;t++) Output[z].v[t]=Z(g,t);
      }
```

C- 6

```
    }
  else
for (i=0;i<Na;i++) {
  for (j=0;j<R;j++) {
      m=j;
      rot=polar(1,h*M_PI*index_to_inp_symbol(m));
      g=j;
      int t,z;
      Next[i][j]=(i*R+j)%Na;
      Prev[i][j]=i/R+j*Na/R;
      z=Next[i][j]+((i<<B)&-(Na));
      Output[z].rotation=rot;
      for (t=0;t<D;t++) Output[z].v[t]=Z(g,t);
      }
  }

}
endif
#endif
#if CPM==2 // coded cpm no uncoded bits for now.
#if G>1
#error not implemented G>1
#endif
void prepare()
{
int state,i;
int w,k,j,r,t,c,l,x,y;
w=1;
for (t=0;t<D;t++) {real(Output[0].v[t])=1;
imag(Output[0].v[t])=0;}
#if D1>D
#error D1>D
#endif
FILE *fw;
#if DOS
matrix Z;
Z=prepare_cpm_symbols();
if (Z.columns!=D) {
   printf("Wrong D, need to be %d",Z.columns);
   exit(0);
   }
fw=fopen("symbols.dat","w");
if (pow(M,G)>64) {printf("increase z"); exit(0);}
for (i=0;i<pow(M,G);i++) {
   for (j=0;j<D;j++) fprintf(fw,"%lg %lg
",real(Z(i,j)),imag(Z(i,j)));
   fprintf(fw,"\n");
   }
fclose(fw);
#endif
#if !DOS
fw=fopen("symbols.dat","r");
for (i=0;i<pow(M,G);i++) {
   for (j=0;j<D;j++) fscanf(fw,"%lg %lg
",&z[i][j].re,&z[i][j].im);
   }
```

```
                              C- 7
fclose(fw);
#endif
for (k=0;k<K;k++) {
  for (j=0;j<N;j+=N/w) {
     for (r=1;r<R;r++) {
        for (t=0;t<D1;t++) {
           complex a;
           #if DOS
           a=Output[j+N/w/R*(r-1)].v[t]*Base[K-k-1][t];
           // against numerical errors
           if (abs(a-1)   <1e-13) a=1;
           if (abs(a+1)   <1e-13) a=-1;
           if (abs(a+J)   <1e-13) a=-J;
           if (abs(a-J)   <1e-13) a=J;
           if (abs(a-1*Q) <1e-13) a=1*Q;
           if (abs(a+1*Q) <1e-13) a=-1*Q;
           if (abs(a+J*Q) <1e-13) a=-J*Q;
           if (abs(a-J*Q) <1e-13) a=J*Q;
           Output[j+N/w/R*r].v[t]=a;
           #else Output[j+N/w/R*r].v[t]=mul(Output[j+N/w/R*(r-1)].v[t],Base[K-k-1][t]);
           #endif
         }
      }
   }
   w*=R;
 }
// convert to cpm
for (i=0;i<N;i++) {
   int b=0;
   complex a;
   int a1;
   for (j=D1-1;j>=0;j--) {
      a=Output[i].v[j];
#if R==2
      if (real(a)==1) a1=0;
      if (real(a)==-1) a1=1;
#elif R==4
      if (a==1) a1=0;
      if (a==-1) a1=2;
      if (a==-J) a1=3;
      if (a==J) a1=1;
#else
#error R>4 is not implemented
#endif
      b=b*R+a1;
   }
   Output[i].rotation=polar(1,h*M_PI*index_to_inp_symbol(b));
int t;
#if DOS
   for (t=0;t<D;t++) Output[i].v[t]=Z(b,t);
#else
   for (t=0;t<D;t++) Output[i].v[t]=z[b][t];
#endif
```

C- 8

```
  }
  for (i=0;i<Na;i++) for (j=0;j<R;j++) {
    Next[i][j]=(i*R+j)%Na;
    Prev[i][j]=i/R+j*Na/R;
    }
}
endif if !CPM
void prepare()
{
//NOTE: if (v[0] != v[1]) for a symbol it should not be included in const list
//though it will be included in this function. It shouldnt matter.

int state,i;
int w,k,j,r,t,c,l,x,y;
int Input_value[Na],h[K];
struct {int ind; int offset;} const_seq_member[N];
// work out semi-states.
for (state=0;state<N;state++) {
  for (i=0;i<R;i++) { // i!=input !
     Next[state][i]=(state*R+i) % N;
     Prev[state][i]=((state+N*i)/R) % N;
     }
   }
w=1;
#if DOS
for (t=0;t<D;t++) Output[0].v[t]=1;
#else
for (t=0;t<D;t++)  {Output[0].v[t].re=1;  Output[0].v[t].im=0;}
#endif
for (k=0;k<K;k++) {
  for (j=0;j<N;j+=N/w) {
     for (r=1;r<R;r++) {
        for (t=0;t<D;t++) {
           complex a;
#if DOS
           a=Output[j+N/w/R*(r-1)].v[t]*Base[K-k-1][t];
           // against numerical errors
           if (abs(a-1)  <1e-13) a=1;
           if (abs(a+1)  <1e-13) a=-1;
           if (abs(a+J)  <1e-13) a=-J;
           if (abs(a-J)  <1e-13) a=J;
           if (abs(a-1*Q) <1e-13) a=1*Q;
           if (abs(a+1*Q) <1e-13) a=-1*Q;
           if (abs(a+J*Q) <1e-13) a=-J*Q;
           if (abs(a-J*Q) <1e-13) a=J*Q;
           Output[j+N/w/R*r].v[t]=a;
else Output[j+N/w/R*r].v[t]=mul(Output[j+N/w/R*(r-1)].v[t],Base[K-k-1][t]);
endif
           }
```

C- 9

```
      }
    }
  w*=R;
  }
t=0;
for (i=0;i<N;i++) {
  if ((c=check_const(i,0))>=0) {
      const_seq_member[t].ind=i;
      const_seq_member[t++].offset=c;
      if (i==Na) {    // 0 and multiples of Na must be in seperate groups.
//      If this happen try to remove from being const symbols in which v[0]!=v[1].
//      see note above.
          printf("\nunable to reduce this code\n");
          exit(0);
      }
//    printf("\n");
//    for (j=0;j<20;j++) printbaseR(list[j]);
    }
  }
for (i=0;i<Na;i++) Input_value[i]=-1;
for (i=0;i<Na;i++) if (Input_value[i]==-1) {
  for (j=0;j<t;j++) {
      y=const_seq_member[j].ind;
      x=i;
//    l=x(add mod 4)y;

l=0;
      for (k=0;k<K;k++) {
        h[k]=((x&(R-1))+(y&(R-1))) & (R-1);
        x>>=B;
        y>>=B;
      }
      for (k=K-1;k>=0;k--) l=(l<<B)+h[k];
      Input_value[l % Na]=const_seq_member[j].offset;
    }
  }
// reduce states.
for (state=0;state<Na;state++) {
  for (i=0;i<R;i++) { // i=input
      Next[state][i]=(state*R+((i+Input_value[state])%R)) % Na;
      Prev[state][i]=state/R+i*Na/R;
    }
  }

}
endif void Encode(int inp,complex *out)    /* inp is a bit array,out array of D coefs */
{
int i,a;

if (inp>R-1) inp=R-1;
State=Next[a=State][inp];
```

C-10

```
#if CPM
#if DOS
for(i=0;i<D;i++) out[i]=Output[State+((a<<B)&-
(Na))].v[i]*Rotation;
Rotation*=Output[(a<<B)+inp].rotation;
#else
for(i=0;i<D;i++) out[i]=mul(Output[State+((a<<B)&-
(Na))].v[i],Rotation);
Rotation=mul(Rotation,Output[(a<<B)+inp].rotation);
#endif
#else
for(i=0;i<D;i++) out[i]=Output[State+((a<<B)&-(Na))].v[i];
#endif
} if !DOS
void printcomplex(complex a)
{
if (real(a)!=0) {
  if (real(a)==1) printf("+1");
  else if (real(a)==-1) printf("-1");
  else printf("%2.2g",real(a));
  if (imag(a)!=0) printf("+%2.2g*J",imag(a));
  }
else if (imag(a)==1) printf("+J");
else if (imag(a)==-1) printf("-J");
else if (imag(a)!=0) printf("%2.2g*J",imag(a));
else printf("0");
printf(" ");
}
endif
/* defined in matrix.h
void printcomplex(complex a)
{
#if DOS
if (a==Q) printf(" +Q");
else if (a==J*Q) printf(" JQ");
else if (a==-Q) printf(" -Q");
else if (a==-J*Q) printf("-JQ");
else
#endif
if (real(a)!=0) {
  if (real(a)==1) printf(" +1");
  else if (real(a)==-1) printf(" -1");
  else printf("%2.2g",real(a));
  if (imag(a)!=0) printf("+%2.2g*J",imag(a));
  }
else if (imag(a)==1) printf(" +J");
else if (imag(a)==-1) printf(" -J");
else if (imag(a)!=0) printf("%2.2g*J",imag(a));
else printf("0");
printf(" ");
}
*/
#if DOS
double metric(complex Inps[][D],symbol_link *link,int
```

C-11

```
direction=0)
{                                         // direction 0-forward
1-backwords
int i,t;
double s;
complex rot=1;

complex met,met1,*a,*b;
//printf("%ld' ",metric_cnt);
metric_cnt++;

// go back in time.  Note states[i] are semi-states.
met=0;
for (i=0;i<L;i++) {
  met1=0;
#if CPM
   if (direction==0)
     rot*=link->s.rotation;
#endif
//   for(t=0;t<D;t++)
//       met1+=Inps[i][t]*conj(link->s.v[t]);
  a=Inps[i];
  b=link->s.v;
  for(t=0;t<D;t++) { //faster!
     real(met1)+=real(a[t])*real(b[t])+imag(a[t])*imag(b[t]);
     imag(met1)+=imag(a[t])*real(b[t])-real(a[t])*imag(b[t]);
  }
  met+=met1*rot;
#if CPM
   if (direction==1)
     rot*=conj(link->s.rotation);
endif
  link=link->link;
  }
s=norm(met);
return(s);
} double cmetric(complex Inps[][D],symbol_link *link,double &metr,
                int direction=0) // direction 0-forward 1-
backwords
{
int i,t;
double s;

complex met,met1,g[L],rot=1; // g saves partial sums.
complex ro;

// go back in time.
s=0;
met=0;
complex *a,*b;

for (i=0;i<L;i++) {
  met1=0;
#if CPM
```

C-12

```
    if (direction==0)
       rot*=link->s.rotation;
#endif
    a=Inps[i];
    b=link->s.v;
    for(t=0;t<D;t++) {
        real(met1)+=real(a[t])*real(b[t])+imag(a[t])*imag(b[t]);
        imag(met1)+=imag(a[t])*real(b[t])-real(a[t])*imag(b[t]);
}
    met+=met1*rot;
    g[i]=met;
#if CPM
    if (direction==1)
       rot*=conj(link->s.rotation);
endif link=link->link;
    }
  s=metr=norm(met);
  ro=met/(L*D);

for (i=0;i<L-1;i++) {
    s+=norm(g[i]+ro*D*(L-i-1));
    }
  return(s);
} double metric2(complex Inps[][D],symbol_link *link)
{
int i,k,t;
double s=0;
complex rot=1,*a,*b;

complex met,tmp[2*L-1];

//printf("%ld ",metric_cnt2);
metric_cnt2++;
// go back in time.
for (i=0;i<2*L-1;i++) {
    met=0;
#if CPM
    rot*=link->s.rotation; // always forwards.
#endif
//   for(t=0;t<D;t++)
//       met+=Inps[i][t]*conj(link->s.v[t]);
    a=Inps[i];
    b=link->s.v;
    for(t=0;t<D;t++) {  // faster!
        real(met)+=real(a[t])*real(b[t])+imag(a[t])*imag(b[t]);
        imag(met)+=imag(a[t])*real(b[t])-real(a[t])*imag(b[t]); }
    tmp[i]=met*rot;
    link=link->link;
    }
for (k=0;k<L;k++) {
   met=0;
```

C-13

```
   for (i=0;i<L;i++) {
      met+=tmp[i+k];
      }
   s+=norm(met);
   }
return(s);
}
else
//unix
struct complx conj(struct complx z)
{
struct complx a;
a.re=z.re; a.im=-z.im;
return a;
} double metric(struct complx Inps[][D],struct symbol_link
*link,int direction=0)
{                                        // direction 0-forward
1-backwords
int i,t;
double s;
struct complx rot;

rot.re=1;rot.im=0;

struct complx met,met1,*a,*b;
//printf("%ld' ",metric_cnt);
metric_cnt++;

// go back in time.  Note states[i] are semi-states.
met.re=met.im=0;
for (i=0;i<L;i++) {
   met1.re=met1.im=0;
#if CPM
   if (direction==0)
      rot=mul(rot,link->s.rotation);
#endif
//    for(t=0;t<D;t++)
//       met1+=Inps[i][t]*conj(link->s.v[t]);
   a=Inps[i];
   b=link->s.v;
   for(t=0;t<D;t++) {
      met1.re+=a[t].re*b[t].re+a[t].im*b[t].im;
      met1.im+=a[t].im*b[t].re-a[t].re*b[t].im;
      }
   met1=mul(met1,rot);
   met.re+=met1.re;
   met.im+=met1.im;
#if CPM
   if (direction==1)
      rot=mul(rot,conj(link->s.rotation));
endif
   link=link->link;
   }
s+=met.re*met.re+met.im*met.im;
```

C-14

```
return(s);
} double cmetric(struct complx Inps[][D],struct symbol_link
*link,double &metr,
                int direction=0) // direction 0-forward 1-
backwords
{
int i,t;
double s;

struct complx met,met1,g[L],rot; // g saves partial sums.
struct complx ro;

rot.im=0;rot.re=1;
// go back in time.
s=0;
met.im=met.re=0;
struct complx *a,*b;

for (i=0;i<L;i++) {
  met1.im=met1.re=0;
#if CPM
  if (direction==0)
    rot=mul(rot,link->s.rotation);
#endif
  a=Inps[i];
  b=link->s.v;
  for(t=0;t<D;t++) {
     met1.re+=a[t].re*b[t].re+a[t].im*b[t].im;
     met1.im+=a[t].im*b[t].re-a[t].re*b[t].im;
     }
  met1=mul(met1,rot);
  met.re+=met1.re;
  met.im+=met1.im;
  g[i]=met;
#if CPM
  if (direction==1)
    rot=mul(rot,conj(link->s.rotation));
endif link=link->link;
  }
s=metr=met.re*met.re+met.im*met.im;
ro.re=met.re/(L*D);
ro.im=met.im/(L*D);
for (i=0;i<L-1;i++) {
  s+=pow(g[i].re+ro.re*D*(L-i-1),2)+pow(g[i].im+ro.im*D*(L-i-1),2);
  }
return(s);
} double metric2(struct complx Inps[][D],struct symbol_link *link)
{
int i,k,t;
```

C-15

```
double s=0;
struct complx rot,*a,*b;
rot.re=1;rot.im=0;

struct complx met,tmp[2*L-1];

//printf("%ld ",metric_cnt2);
metric_cnt2++;
// go back in time.
for (i=0;i<2*L-1;i++) {
  met.im=met.re=0;
#if CPM
    rot=mul(rot,link->s.rotation); // always forwards.
#endif
//   for(t=0;t<D;t++)
//      met+=Inps[i][t]*conj(link->s.v[t]);
  a=Inps[i];
  b=link->s.v;
  for(t=0;t<D;t++) {  // faster!
     met.re+=a[t].re*b[t].re+a[t].im*b[t].im;
     met.im+=a[t].im*b[t].re-a[t].re*b[t].im;
     }
  tmp[i]=mul(met,rot);
  link=link->link;
  }
for (k=0;k<L;k++) {
  met.re=met.im=0;
  for (i=0;i<L;i++) {
     met.re+=tmp[i+k].re;
     met.im+=tmp[i+k].im;
     }
  s+=met.re*met.re+met.im*met.im;
  }
return(s);
}
/* before CPM
//unix
double metric(struct complx Inps[][D],struct symbol_link *link)
{
int i,t;
double s;

struct complx met;
//printf("%ld' ",metric_cnt);
metric_cnt++;

// go back in time.
met.re=met.im=0;
for (i=0;i<L;i++) {
  for(t=0;t<D;t++) {
     struct complx a,b;
     a=Inps[i][t];
     b=link->s.v[t];
     met.re+=a.re*b.re+a.im*b.im;   // multiply by conjugate.
     met.im+=a.im*b.re-a.re*b.im;
```

C-16

```
    }
  link=link->link;
  }
s=met.re*met.re+met.im*met.im;
return(s);
}
double cmetric(complex Inps[][D],symbol_link *link,double
&metr,int direction=0)
{
int i,t;
double s;

complex met,g[L]; // g saves partial sums.
complex ro;

// go back in time.
s=0;
met.re=met.im=0;
for (i=0;i<L;i++) {
  for(t=0;t<D;t++) {
     struct complx a,b;
     a=Inps[i][t];
     b=link->s.v[t];
     met.re+=a.re*b.re+a.im*b.im;
     met.im+=a.im*b.re-a.re*b.im;
     }
  g[i].re=met.re; g[i].im=met.im;
  link=link->link;
  }
s=metr=met.re*met.re+met.im*met.im;
ro.re=met.re/(L*D);
ro.im=met.im/(L*D);
for (i=0;i<L-1;i++) {
  s+=pow(g[i].re+ro.re*D*(L-i-1),2)+pow(g[i].im+ro.im*D*(L-i-1),2);
  }
return(s);
}

//unix
double metric2(struct complx Inps[][D],struct symbol_link *link)
{
int i,k,t;
double s=0;

struct complx met,tmp[2*L-1],a,b;

//printf("%ld ",metric_cnt2);
metric_cnt2++;
// go back in time.
for (i=0;i<2*L-1;i++) {
  met.re=met.im=0;
  for(t=0;t<D;t++) {
     a=Inps[i][t];
     b=link->s.v[t];
```

C-17

```
        met.re+=a.re*b.re+a.im*b.im;
        met.im+=a.im*b.re-a.re*b.im;
        }
     tmp[i].re=met.re;
     tmp[i].im=met.im;
     link=link->link;
     }
  for (k=0;k<L;k++) {
    met.re=met.im=0;
    for (i=0;i<L;i++) {
        met.re+=tmp[i+k].re;
        met.im+=tmp[i+k].im;
        }
     s+=met.re*met.re+met.im*met.im;
     }
  return(s);
}
*/
#endif

// B A C K W A R D
//***************************************************** void backward()         // Note b_History is shifted 1 in index.
{
int state,i,j;
double metr[R],metr1[R];
double Acc_new[Na];
double max;
int ind;
symbol_link curr_output,*p1,*p2,**Out_His,**Out_His_new;
double tmp;
int in_blk=W+ML-1,blk_ptr;
int last_error=W+ML;
//complex complex_metr[R],ro;//,met_max=0;
//double max_acc,avv;
//int ind_max;
//int stop=0;
//double alpha;
cr=1;
pr_cnt=0;
for (blk_ptr=(inp_ptr+W+ML-1)%Two_ML; in_blk>=0;
        blk_ptr=(blk_ptr+Two_ML-1)%Two_ML,in_blk--) {
   Out_His=b_Output_History[blk_ptr&1];
   Out_His_new=b_Output_History[!(blk_ptr&1)];
   for(j=L-2;j>=0;j--) for (i=0;i<D;i++)
b_Inps[j+1][i]=b_Inps[j][i];
   for (i=0;i<D;i++) b_Inps[0][i]=Inp_blk[blk_ptr][i];
//   max_acc=0; avv=0;
   for (state=0;state<Na;state++) {
   /* add compare select */
      max=-1e31;
      p1=Out_His_new[state];

for (i=0;i<R;i++) {
        int prv;
```

C-18

```
      curr_output.link=Out_His[prv=Next[state][i]];
      curr_output.s=Output[prv+((state<<B)&-Na)];
//    printf("%d,%d,%d\n",in_blk,state,i);
#if MDFA
      metr1[i]=cmetric(b_Inps,&curr_output,metr[i],1);
#else
      metr1[i]=metr[i]=metric(b_Inps,&curr_output,1);
#endif
      /*complex_metr[ind1]/abs(complex_metr[ind1]));*/
      if ((tmp=b_Acc[Next[state][i]]+metr1[i])>max) {
         max=tmp;
         ind=i;
         p1->s=curr_output.s;
      }
    }
    Acc_new[state]=b_Acc[Next[state][ind]]+metr[ind];
//    if (Acc_new[state]>max_acc)
{max_acc=Acc_new[state];ind_max=ind;}
//    avv+=Acc_new[state];
    b_History[in_blk][state]=Next[state][ind];
    if (state==save_state[(in_blk+Blk_cnt*ML-1)%(5*ML)] &&
Next[state][ind]!=save_state[(in_blk+Blk_cnt*ML)%(5*ML)]) {  if
(btst) {
         if (cr) {printf("\n"); cr=0;};
         printf(" *b-%ld,%d*",Blk_cnt,in_blk);
         if (pr_cnt++==6) {printf("\n"); pr_cnt=0;}
      }
      if (-in_blk+last_error<=10) last_error=in_blk;
    }
//    if (last_error-in_blk>10) goto end;
    p1=p1->link;
    p2=Out_His[Next[state][ind]];
    for (i=1;i<L-1;i++) {
       p1->s=p2->s;
       p1=p1->link;
       p2=p2->link;
    }
  }
/*
  if (!stop && max_acc - avv/Na>12*L*D) {
    if (!stop && btst) printf("&b-%ld,%d&",Blk_cnt,in_blk);
    stop=1;
    alpha-=10/(float)ML*2*M_PI;
  }
*/
  mem_cpy(b_Acc,Acc_new);
  }
if (tst && last_error<W+ML) printf("\nLast b error
%d",last_error);
end:
b_error_hist[last_error]++;
if (!cr) printf("\n");
}

// F O R W A R D   2
//****************************************************
```

C-19

```
void forward_2()
{
int state,i,j;
double metr[R],metr1[R];
double nf_Acc_new[Na],f_Acc_new[Na];
double max;
int a,b;
int ind,prv;
symbol_link curr_output,*p1,*p2,**f_Out_His,**f_Out_His_new,
     **nf_Out_His,**nf_Out_His_new;
double tmp;
int in_blk=0,f_ptr,k;
int fit,fit1;
int err; // a flag for test
path_size path;

// Note b_History is shifted 1 in index.
err=0;

pr_cnt=0;
for (f_ptr=inp_ptr; in_blk<ML;f_ptr=(f_ptr+1)%Two_ML,in_blk++)
{   f_Out_His=f_Output_History[f_ptr&1];
  f_Out_His_new=f_Output_History[!(f_ptr&1)];
  nf_Out_His=nf2_Output_History[f_ptr&1];// f_ptr for
alternating.
  nf_Out_His_new=nf2_Output_History[!(f_ptr&1)];
  for(j=2*L-3;j>=L-1;j--) for (i=0;i<D;i++)
Inps2[j+1][i]=Inps2[j][i];
  for(j=L-1,k=f_ptr;j>=0;j--,k=(1+k)%Two_ML)
                                for (i=0;i<D;i++)
Inps2[j][i]=Inp_blk[k][i];

// nf decision
   for (state=0;state<Na;state++) {
   /* add compare select */
      if (Blk_cnt==120 && in_blk==14 && state==0) {
        printf("");
        }
     max=-1e30;
      p1=nf_Out_His_new[state];
     for (i=0;i<R;i++) {
       int prv;
        curr_output.link=nf_Out_His[prv=Prev[state][i]];
        curr_output.s=Output[state+((prv<<B)&-Na)];
#if MDFA
       metr[i]=cmetric(Inps2+L-1,&curr_output,metr1[i]);   //!!
#else
       metr1[i]=metr[i]=metric(Inps2+L-1,&curr_output);
#endif
        if ((tmp=nf2_Acc[Prev[state][i]]+metr[i])>max) {
         max=tmp;
         ind=i;
           p1->s=curr_output.s;
           }
        }
#if tst
```

C-20

```
      if (state==save_state[(in_blk+Blk_cnt*ML)%(5*ML)] &&
Prev[state][ind]!=save_state[(in_blk+Blk_cnt*ML-1)%(5*ML)]) {
if (cr) {printf("\n"); cr=0;};
            printf(" *nf-%ld,%d*",Blk_cnt,in_blk);
            if (pr_cnt++==6) {printf("\n"); pr_cnt=0;}
            }
endif
      nf2_History[in_blk+inp_ptr][state]=prv=Prev[state][ind];
      max=nf2_Acc[prv]+metr1[ind];                           //!!
      if (Projected_Acc[acc_del_ptr][state]>max+0.001 && max>0 )
{     #if tst
      if (state==save_state[(in_blk+Blk_cnt*ML)%(5*ML)]) { i f
(cr) {printf("\n"); cr=0;};
            printf(" /C%ld,%d/",Blk_cnt,in_blk);
            if (pr_cnt++==6) {printf("\n"); pr_cnt=0;}
            }
      #endif
      nf_Acc_new[state]=Projected_Acc[acc_del_ptr][state];
path=Projecting_path[acc_del_ptr][state]; // encoding of  the
path.
      nf2_History[in_blk+inp_ptr][state]=path+extra_bit;
//    if (nf2_History[b=(in_blk-
(L-1)+inp_ptr+Two_ML)%Two_ML][a]!=
//          f_History[b][a])
//          nf2_History[b=(in_blk-(L-1)+inp_ptr+Two_ML)%Two_ML][a]=
//          f_History[b][a];
      b=state;
       for (i=L-2;i>=0;i--) {
          b=b+((path&(R-1))<<((K-1)*B));
          p1->s=Output[b];
        p1=p1->link;
        path>>=B;
          b>>=B;
          }

}
     else {
       nf_Acc_new[state]=max;
      p1=p1->link;
      p2=nf_Out_His[prv];
      for (i=1;i<L-1;i++) {
        p1->s=p2->s;
        p1=p1->link;
        p2=p2->link;
        }
      }

}
  mem_clr(Projected_Acc[acc_del_ptr]);

/* f decision */
  symbol_link *root=future_list+L-2;  // start point for the
linked list used by metric() .
  future_list[0].link=&curr_output;
```

C-21

```
   for (state=0;state<Na;state++) {
   /* add compare select */
      if (Blk_cnt==1 && in_blk==22 && state==0) {
        printf("");
      }
     max=-1e30;
     p1=f_Out_His_new[state];
     a=state;
     path=0;    // path will be an encoding of the future path for
projecting
      for (i=0;i<L-1;i++) {
        b=b_History[i+in_blk+1][a];
        path=(path<<B)+(a>>((K-2)*B));
        future_list[i].s=Output[b+((a<<B)&-Na)];
        a=b;
      }
      for (i=0;i<R;i++) {
        prv=Prev[state][i];
        curr_output.s=Output[state+((prv<<B)&-Na)];

if (b_History[in_blk][prv]==state && in_blk>0) {
        // a fit
           curr_output.link=f_Out_His[prv]; // not realy needed.
           metr[i]=metric(Inps2,root);
           tmp=f_Acc[prv]+metr[i];
           fit1=1;
        }
        else {
        // no fit, use nf_Acc.
           curr_output.link=nf_Out_His[prv];
           metr[i]=metric2(Inps2,root);
           fit1=0;
           tmp=nf2_Acc[prv]+metr[i];
        } if (tmp>max) {
           fit=fit1;   //save if maximal is fit or not.
           max=tmp;
           ind=i;
           p1->s=curr_output.s;
        }
      }
#if tst
      if (state==save_state[(in_blk+Blk_cnt*ML)%(5*ML)] &&

Prev[state][ind]!=save_state[(in_blk+Blk_cnt*ML-1)%(5*ML)]) {
if (cr) {printf("\n"); cr=0;};
           printf(" #f-%ld,%d#",Blk_cnt,in_blk);
           if (pr_cnt++==6) {printf("\n"); pr_cnt=0;}
         }
endif
     f_Acc_new[state]=max;
     if (fit) f_History[in_blk+inp_ptr][state]=Prev[state][ind];
     else
f_History[in_blk+inp_ptr][state]=Prev[state][ind]+extra_bit; if
(max>Projected_Acc[acc_del_ptr][b]) {
```

C-22

```
      Projected_Acc[acc_del_ptr][b]=max;
        Projecting_path[acc_del_ptr][b]=path;
        }
      p1=p1->link;
      if (fit) p2=f_Out_His[Prev[state][ind]];
      else p2=nf_Out_His[Prev[state][ind]];
      for (i=1;i<L-1;i++) {
        p1->s=p2->s;
        p1=p1->link;
        p2=p2->link;
        }
      }
   /* for test */
/*
   //Acc0 is the Acc corresponding to the whole 0 sequence.
   complex met;
   int t;

met=0;
   for (i=0;i<L;i++)
      for(t=0;t<D;t++)
            met+=(Inps2+L-1)[i][t];
   Acc0+=pow(abs(met),2);
*/
   /**********/
   mem_cpy(nf2_Acc,nf_Acc_new);
   mem_cpy(f_Acc,f_Acc_new);
   acc_del_ptr=(1+acc_del_ptr)%(L-1);

}
if (!cr) printf("\n");
} void out_decoded(path_size next,int a,int j)
{
int i;

if (j>=ML) return;
for (i=0;i<R;i++) if (Next[next][i]==a) break;
if (i==R) {
   printf("\nerror\n");
   exit(0);
   }
decoded[j]=i;
decoded_state[j]=a;
if (decoded_state[j]!=save_state[(j+(Blk_cnt-1)*ML)%(5*ML)]) {
  printf(""); // save_state contain only 5ML symbols.
   }
} int Decode(complex *inp)
{
int state,i,t,k,j;
path_size a;
double max;
int ind;
```

C-23

```
path_size next;
int f_flag;
path_size path;

// save inp in a memory block.
for (t=0;t<D;t++) Inp_blk[inp_ptr][t]=inp[t];
if (++inp_ptr>=ML*2) inp_ptr=0;
if (++inp_cnt<ML) return(decoded[inp_cnt]);
inp_cnt=0;

if (start_flag==0) {
  start_flag=1;
  return(0);
  }
// BACKWARD      NO FUTURE
  // init
#if DOS
for (i=0;i<L;i++) for (j=0;j<D;j++) b_Inps[i][j]=0;
#else
for (i=0;i<L;i++) for (j=0;j<D;j++)
b_Inps[i][j].re=b_Inps[i][j].im=0;
#endif
mem_clr(b_History);
for (i=0;i<Na;i++) b_Acc[i]=0;

backward();
/* for test */
max=b_Acc[0]; ind=0;
for (state=0;state<Na;state++) {
  if (b_Acc[state]>max) {max=b_Acc[state]; ind=state;}
  } next = ind;
for (i=0;i<Two_ML;i++) {
  next = b_History[i][next];
  }
forward_2();
// go back end decode previous ML
max=f_Acc[0]; ind=0;   // why not nf2_Acc ? probably it doesn't
matter.
for (state=0;state<Na;state++) {
  if (f_Acc[state]>max) {max=f_Acc[state]; ind=state;}
  } if (Blk_cnt>0) {
  if (Blk_cnt==32)
     printf("");
  next = ind;
  j=Two_ML-1;
  f_flag=0;
  for (i=inp_ptr+ML-1;j>=0;i=(i+Two_ML-1)%Two_ML,j--) {
     if (f_flag) {
        next = f_History[i][a=next];
        if (next&extra_bit) {
           f_flag=0;
```

C-24

```
           next-=extra_bit;
           }
        out_decoded(next,a,j);
        }
      else {
        next = nf2_History[i][a=next];
        if (next&extra_bit) {
         path=next;
           f_flag=1;
           k=0;
           while (1) {
              t=(a>>B)+((path&(R-1))<<(K-2)*B);
              path>>=B;
              out_decoded(t,a,j);
              next=a=t;
              if (k++>=L-2) break;
              if (j==0) break;
              i=(i+Two_ML-1)%Two_ML;
              j--;
              }
           }
        else out_decoded(next,a,j);
        }

}
  }
Blk_cnt++;
return(decoded[0]);
} int Produce_input() // not used
{
int z,out;

out=PN&1;
z=((PN&2)>>1) ^ (PN&1);
PN|=z<<6;
PN>>=1;
return(out);
} if DOS
void normal(double &n1,double &n2,double sigma)
{
int i;

n1=n2=0;
for (i=0;i<25;i++) {n1+=rand()-16384;}
for (i=0;i<25;i++) {n2+=rand()-16384;}
n1/=47296.534/sigma;
n2/=47296.534/sigma;
}
else
void normal(double *n1,double *n2,double sigma)
{
int i;
```

C-25

```
*n1=*n2=0;
for (i=0;i<25;i++) {*n1+=rand()-1073741824;}
for (i=0;i<25;i++) {*n2+=rand()-1073741824;}
*n1/=3099625652.22/sigma;
*n2/=3099625652.22/sigma;
}
endif void main(int argc,char **argv)
{
int i,j,k;
int inp,dec;
complex out[D];
complex out1[D];
double ebn0,sigma,n1,n2;
long NO_OF_SYMBOLS=2000,ber;
long a;
long Sber;          // symbols ber
long State_ber;     // unequal states
long last_I=0,Seq_ber=0;
//int ind; double max;
long seq_err,his[100];
int save[100],save2[100];
int t;
symbol_link *p1,*p3,*p4;
int prev_del_state,prev_dec_state;
int dec_state; // decoded state.
int seed=111;
complex phase;
phase=polar(1,180*M_PI/180);
#if !DOS
printf("UNIX VERSION");
endif a=CODE;
for (i=0;i<K;i++) {
#if CPM==2
   for (t=0;t<D1;t++) {
#else
   for (t=0;t<D;t++) {
#endif
     switch (a&(R-1)) {
#if DOS
       case 0:Base[i][t]=1; break;
       case 1:Base[i][t]=-1; break;
       case 2:Base[i][t]=J; break;
       case 3:Base[i][t]=-J; break;
        case 4:Base[i][t]=Q;  break;
        case 5:Base[i][t]=-Q; break;
        case 6:Base[i][t]=J*Q; break;
        case 7:Base[i][t]=-J*Q; break;
#else
       case 0:Base[i][t].re=1; Base[i][t].im=0; break;
       case 1:Base[i][t].re=-1; Base[i][t].im=0; break;
       case 2:Base[i][t].im=1;  Base[i][t].re=0;break;
```

```
                                            C-26
        case 3:Base[i][t].im=-1; Base[i][t].re=0; break;
        case 4:Base[i][t].re=sqrt(2)/2; Base[i][t].im=sqrt(2)/2;
break;
        case 5:Base[i][t].re=-sqrt(2)/2; Base[i][t].im=-sqrt(2)/2;
break;
        case 6:Base[i][t].im=sqrt(2)/2;  Base[i][t].re=-
sqrt(2)/2;break;
        case7:Base[i][t].im=-sqrt(2)/2;Base[i][t].re=sqrt(2)/2;
break;
#endif
        }
    a>>=B;
    }
  }
PN=1;
delay_cnt=0;
inp_ptr=inp_cnt=0;
start_flag=Blk_cnt=0;
acc_del_ptr=0;
mem_clr(f_History);
mem_clr(Inp_blk);
mem_clr(nf2_History);
mem_clr(b_History);
mem_clr(Projected_Acc);
mem_clr(his);
mem_clr(save);
mem_clr(b_error_hist);
#if DOS
Rotation=1;
#else
Rotation.re=1; Rotation.im=0;
#endif
for (i=1;i<Na;i++) f_Acc[i]=nf2_Acc[i]=-1e30;
f_Acc[0]=nf2_Acc[0]=0;  // assuming initial state is zero
Acc0=0;
#if DOS
for (i=0;i<L;i++) {
   for (j=0;j<D;j++) b_Inps[i][j]=Inps1[i][j]=0;
   }
for (i=0;i<2*L-1;i++) {
   for (j=0;j<D;j++) Inps2[i][j]=0;
   }
else
for (i=0;i<L;i++) {
   for (j=0;j<D;j++)
b_Inps[i][j].re=Inps1[i][j].re=b_Inps[i][j].im=Inps1[i][j].im=
0;  }
for (i=0;i<2*L-1;i++) {
   for (j=0;j<D;j++) Inps2[i][j].im=Inps2[i][j].re=0;
   }
endif
// Output_History  points to linked list .

for(k=0;k<2;k++) for(i=0;i<Na;i++) {
  p1=b_Output_History[k][i]=(symbol_link
*)malloc(sizeof(symbol_link));
```

C-27

```
  if (p1==NULL) {
   printf("Out of memory");
   exit(0);
  }
  p3=f_Output_History[k][i]=(symbol_link
*)malloc(sizeof(symbol_link));
   if (p3==NULL) {
    printf("Out of memory");
    exit(0);
   }
   p4=nf2_Output_History[k][i]=(symbol_link
*)malloc(sizeof(symbol_link));
   if (p4==NULL) {
    printf("Out of memory");
    exit(0);
   }
if DOS
  #if CPM
  p1->s.rotation=p3->s.rotation=p4->s.rotation=1;
  #endif
   for (t=0;t<D;t++) p1->s.v[t]=p3->s.v[t]=p4->s.v[t]=0; // not
realy needed since will be multiplied by zero.
#else
  #if CPM
  p1->s.rotation.re=p3->s.rotation.re=p4->s.rotation.re=1;
  p1->s.rotation.im=p3->s.rotation.im=p4->s.rotation.im=0;
  #endif
   for (t=0;t<D;t++) {
      p1->s.v[t].re=p3->s.v[t].re=p4->s.v[t].re=0; // not realy
needed since will be multiplied by zero.
      p1->s.v[t].im=p3->s.v[t].im=p4->s.v[t].im=0; // not realy
needed since will be multiplied by zero.
   }
endif
   for (j=1;j<L-1;j++) {
     p1=p1->link=(symbol_link *)malloc(sizeof(symbol_link));
if (p1==NULL) {
     printf("Out of memory");
     exit(0);
     }
     p3=p3->link=(symbol_link *)malloc(sizeof(symbol_link));
  if (p3==NULL) {
     printf("Out of memory");
     exit(0);
     }
     p4=p4->link=(symbol_link *)malloc(sizeof(symbol_link)); if
(p4==NULL) {
     printf("Out of memory");
     exit(0);
     }
if DOS
    #if CPM
    p1->s.rotation=p3->s.rotation=p4->s.rotation=1;
    #endif
     for (t=0;t<D;t++) p1->s.v[t]=p3->s.v[t]=p4->s.v[t]=0; // not
realy needed since will be multiplied by zero
```

C-28

```
#else
    #if CPM
      p1->s.rotation.re=p3->s.rotation.re=p4->s.rotation.re=1;
p1->s.rotation.im=p3->s.rotation.im=p4->s.rotation.im=0;
#endif
      for (t=0;t<D;t++) {
        p1->s.v[t].re=p3->s.v[t].re=p4->s.v[t].re=0; // not realy
needed since will be multiplied by zero
        p1->s.v[t].im=p3->s.v[t].im=p4->s.v[t].im=0; // not realy
needed since will be multiplied by zero
      }
endif
    }
  p1->link=p3->link=p4->link=NULL;   // not needed, just for
comleteness.
  } for (i=1;i<L-1;i++) future_list[i].link=future_list+i-1;

State=0;
printf("Base is:\n");
for (t=0;t<D;t++) {
  for (i=0;i<K;i++) printcomplex(Base[i][t]);
  printf("\n");
  }
prepare();
Sber=ber=seq_err=State_ber=0;

if (argc<3) {
  printf("\nENTER Eb/N0 : ");
  scanf("%lf",&ebn0);
  printf("\nENTER NO OF BITS : "); scanf("%ld",&a);
NO_OF_SYMBOLS=a/B;
  }
else {
  printf("--------------- START ----------------\n");
  ebn0=atof(argv[1]);
  printf("Eb/N0 = %f\n",ebn0);
  NO_OF_SYMBOLS=atol(argv[2])/B;
  printf("NO OF BITS = %s\n",argv[2]);
  }
if (argc==4) seed=atoi(argv[3]);

ebn0=pow(10,ebn0/10);
if !CPM
sigma=sqrt(D/(2*ebn0*B));   // r=1+n for each dimention
#else
sigma=sqrt(1/(2*ebn0*B));   // r=1+n total
#endif
srand(seed);
//randomize();
for (I=0;I<=NO_OF_SYMBOLS+Input_Delay;I++) {
  if (!(I%ML)) {
    printf(" %ld",I*B);
```

C-29

```
//   sound(1000);
//   delay(20);
//   nosound();
    }
if DOS
   if (kbhit()&&getch()=='q') {NO_OF_SYMBOLS=I-Input_Delay;
break;}
#endif
#if !zero_input
   inp=rand()%R;
#else
   inp=0;
endif Encode(inp,out);
   save_state[I%(5*ML)]=State;
   del_inp=delayed_input[delay_cnt];
   del_state=delayed_state[delay_cnt];
   delayed_state[delay_cnt]=State;
   delayed_input[delay_cnt++]=inp;
   delay_cnt%=(Input_Delay-1);
#if DOS
   for (j=0;j<D;j++) {
     normal(n1,n2,sigma);
       out1[j]=complex(n1,n2)+out[j]*phase;
     }
   phase*=polar(1,Angle_in_L*M_PI/180/L);
#else
   for (j=0;j<D;j++) {
     normal(&n1,&n2,sigma);
     out[j]=mul(out[j],phase);
     out1[j].re=n1+out[j].re;
     out1[j].im=n2+out[j].im;
     }
   phase=mul(phase,polar(1,Angle_in_L*M_PI/180/L)); // 10 degrees
in L symobls
endif dec=Decode(out1);
   dec_state=decoded_state[inp_cnt];
   if (I>=Input_Delay-1)    {
     if ((a=dec ^ del_inp)!=0) {
       printf(" %ld",I);
       if (seq_err>=20) seq_err=0;
       for (i=0;i<B;i++,a>>=1) ber+=a&1;
       Sber++;
       }
     if (del_state != dec_state) {
        if (I-last_I>5)
                  Seq_ber++;
        last_I=I;
        }
     State_ber += del_state != dec_state;
     if (del_state != dec_state && seq_err<20) {
       if (seq_err==0) {
```

C-30

```
            save2[0]=prev_del_state;
            save[0]=prev_dec_state;
            }
        save[++seq_err]=dec_state;
        save2[seq_err]=del_state;
        if (seq_err>=20) seq_err=20;
        }
    if (del_state == dec_state || I==NO_OF_SYMBOLS+Input_Delay
|| seq_err==20) {
        if (seq_err>0) {
            his[seq_err]++;
            save[++seq_err]=dec_state;
            save2[seq_err]=del_state;
#if !CPM
#if DOS
        for (i=1;i<=seq_err-1;i++)
            if (Output[save[i]+((save[i-1]<<B)&-
Na)].v[0]!=Output[save[i+1]+
                    ((save[i]<<B)&-Na)].v[0] ||
Output[save[i]+((save[i-1]<<
                    B)&-Na)].v[1]!=Output[save[i+1]+
                    ((save[i]<<B)&-Na)].v[1]) break;
#else
        for (i=1;i<=seq_err-1;i++) {
            if (Output[save[i]+((save[i-1]<<B)&-
Na)].v[0].re!=Output[save[i+1]+
                    ((save[i]<<B)&-Na)].v[0].re ||
Output[save[i]+((save[i-1]<<
                    B)&-Na)].v[1].re!=Output[save[i+1]+
                    ((save[i]<<B)&-Na)].v[1].re) break;
            if (Output[save[i]+((save[i-1]<<B)&-
Na)].v[0].im!=Output[save[i+1]+
                    ((save[i]<<B)&-Na)].v[0].im ||
Output[save[i]+((save[i-1]<<
                    B)&-Na)].v[1].im!=Output[save[i+1]+
                    ((save[i]<<B)&-Na)].v[1].im) break;
            }
        if (i==seq_err) continue;
#endif
#endif
        printf("\nTRANS: ");
        for (i=0;i<=seq_err;i++) {printbaseR(save2[i]);}
        printf("\nREC  : ");
        for (i=0;i<=seq_err;i++) printbaseR(save[i]);
        if (seq_err==20) printf("... ");
#if !CPM
        for (t=0;t<D;t++) {
            printf("\n            ");
            for (i=1;i<=seq_err;i++) {
                printcomplex(Output[save[i]+((save[i-1]<<B)&-
Na)].v[t]);}
            }
        printf("\n");
#endif
        }
    if (seq_err!=20) seq_err=0;
```

C-31

```
      else seq_err=22;
      }
    }
  prev_del_state=del_state;
  prev_dec_state=dec_state;

} printf("\nb errors hist: ");
for   (i=Two_ML;i>=0;i--)   if   (b_error_hist[i])   printf("%d-%d ",i,b_error_hist[i]);
long s=0,s1=0;
for (i=Two_ML;i>=0;i--) s+=b_error_hist[i];
for (i=ML+L-1;i>=0;i--) s1+=b_error_hist[i];
printf("ratio of b-error<ML+L-1 is %g",(float)s1/s);

printf("\nThe BER is %g\n",(double)ber/NO_OF_SYMBOLS/B);
printf("\nThe BER in symbols is %g\n",(double)Sber/NO_OF_SYMBOLS);
printf("\nThe BER in states is %g\n",(double)State_ber/NO_OF_SYMBOLS);
printf("\nThe BER in sequences is %g\n",(double)Seq_ber/NO_OF_SYMBOLS);

#if DOS
sound(1500);
delay(100);
nosound();
if (argc<3) getch();
nosound();
#endif
}
```

D-1

APPENDIX D

The following is a listing of a software utility called by the software program of Appenix A and of Appendix C, called "Matrix H".

```
/* matrix.h
    Matrics Library - Include File
    class matrix declarations.*/
// needs stdlib.h & stdio.h.

//int creations=0,destructions=0;

#ifndef __cplusplus
#error Must use C++ for the type matrix.
endif ifndef ORIGIN
define ORIGIN 0
endif define Max_N 20 // defined also in eigen.c: max size of A.

include <complex.h>
#include <alloc.h>
void printcomplex(complex a,double thresh=0.00001);

class matrix {
public:
    int rows,columns;
    complex *base;
//    int temp_flag;

// constructors
    matrix() {
      base=NULL;
//      creations++;
    }
    matrix(int M,int N) {
      rows=M;
      columns=N;
      if (M<=0 || N<=0) {
         printf("\nmatrix.h (create) error: bad dimentions.");
         exit(0);
      }
      if ((base = new complex[M*N])==NULL) {
         printf("\nmatrix.h (create) error: out of memory.");
         exit(0);
         }
//    creations++;
      } matrix(matrix& Other) {
      rows = Other.rows;
```

D-2

```
        columns = Other.columns;
        if ((base = new complex[rows*columns])==NULL) {
           printf("\nmatrix.h (create) error: out of memory.");
           exit(0);
        }
        memcpy(base,Other.base,rows*columns*sizeof(complex));
//      creations++;
        }

~matrix() {
//       destructions++;
         delete base;
         }

// matrix functions
    friend complex det(matrix&);
     friend matrix trans_conj(matrix&);   // the matrix conjugate
     friend matrix unit(int size);
     friend void printmatrix(matrix& Arg,double thresh=0.00001);
     friend int eigen(matrix& A,matrix& V,matrix& L);   //
hermitian only!! != on error   friend complex sum(matrix&);    //
sum the elements of a matrix   friend double norm(matrix&); // sum
of elements magnitude square   friend complex
correlate(matrix&,matrix&); // for vectors, sum(conj(Arg1)*Arg2)
     friend matrix ortho(matrix&); // form orthogonal basis of
the rows // Overloaded C math functions and operators.
     double abs(matrix&);
     friend matrix random(int rows,int cols,int range);

// Binary Operator Functions
     friend matrix operator+(matrix&, matrix&);
     friend matrix operator-(matrix&, matrix&);
     friend matrix operator*(matrix&, matrix&);
     friend matrix operator*(matrix&, complex);
     friend matrix operator*(complex, matrix&);
     friend int operator==(matrix&, matrix&);
     friend int operator!=(matrix&, matrix&);
     matrix& operator+=(matrix&);
     matrix& operator-=(matrix&);
     matrix& operator*=(matrix&);
     matrix& operator*=(complex);
     matrix& operator/=(complex);
     matrix& operator+();
     matrix operator-();
     matrix& operator=(matrix&);
     complex& operator()(int,int);
     matrix operator()(int,char); // take a vector form matrix
'R' or 'C'.    complex& operator()(int);      // vector
component.
     complex* operator[](int);      // take a row from matrix as
complex array.   // matrix& operator[](int);

// Implementation
```

D- 3

```
};

// Inline matrix functions
inline matrix& matrix::operator=(matrix& Arg)
{
if (base!=NULL) delete base;
columns=Arg.columns;
rows=Arg.rows;
//temp_flag=0;
//if (!Arg.temp_flag) {
base = new complex[columns*rows];
memcpy(base,Arg.base,columns*rows*sizeof(complex));
//  }
//else base=Arg.base;
return(*this);
} inline complex& matrix::operator()(int i,int j)
{
i-=ORIGIN;
j-=ORIGIN;
#if !SUPRESS_CHECK_INDEX_BOUNDS
if (i>=rows || i<0 || j>=columns || j<0) {
  printf("\nmatrix.h () error: index out of bounds.");
  exit(0);
  }
endif
return base[i*columns+j];
} inline complex& matrix::operator()(int i) // From vector take one element. {
i-=ORIGIN;
if (rows==1) {
#if !SUPRESS_CHECK_INDEX_BOUNDS
  if (i>=columns || i<0) {
     printf("\nmatrix.h () error: index out of bounds.");
     exit(0);
     }
endif
  return base[i];
  }
if (columns==1) {
#if !SUPRESS_CHECK_INDEX_BOUNDS
  if (i>=rows || i<0) {
     printf("\nmatrix.h () error: index out of bounds.");
     exit(0);
     }
endif
  return base[i];
  }
printf("\nmatrix.h () error: function apply to vector only.");
exit(0);
}
```

D- 4

```
inline matrix matrix::operator()(int i,char c) // used only as
Rvalue {
int j;
matrix temp;

i-=ORIGIN;
if (c=='R') {
  #if !SUPRESS_CHECK_INDEX_BOUNDS
  if (i>=rows || i<0) {
     printf("\nmatrix.h () error: index out of bounds.");
     exit(0);
     }
  #endif
  temp=matrix(1,columns);
  memcpy(temp.base,base+i*columns,columns*sizeof(complex));   }
else if (c=='C') {
  #if !SUPRESS_CHECK_INDEX_BOUNDS
  if (i>=columns || i<0) {
     printf("\nmatrix.h () error: index out of bounds.");
     exit(0);
     }
  #endif
  temp=matrix(rows,1);
  for (j=0;j<rows;j++) {
     temp(j)=base[j*columns+i];
     }
  }
else {
  printf("\nmatrix.h () error: bad parameter.");
  exit(0);
  } return temp;
} inline complex* matrix::operator[](int i)    // take a row from
matrix as array {
i-=ORIGIN;
#if !SUPRESS_CHECK_INDEX_BOUNDS
if (i>=rows || i<0 ) {
  printf("\nmatrix.h [] error: index out of bounds.");
  exit(0);
  }
endif
return base+i*columns;
}

/*
inline matrix matrix::operator[](int i)    // take a row from
matrix as array {
printf("Not working");
exit(0);

i-=ORIGIN;
matrix temp;
#if !SUPRESS_CHECK_INDEX_BOUNDS
```

What is claimed is:

1. In a communication system receiving from a channel a received signal corresponding to a succession of received symbols during a corresponding succession of symbol times, said succession of symbols corresponding to a succession states of a code of said communication system, each of said states branching to a predetermined number of others of said states, a process for deducting an estimate of said succession of symbols from said received signal by overlapped observations of said received signal, said process comprising:

storing a block of symbols of said received signal;

for each one of said states at a current symbol time of said received signal, identifying a previously stored survivor path of states corresponding to said received signal leading to said one state and forming plural candidate paths from said one state by appending to said survivor path next ones of said states branching from said one state;

for each one of said plural candidate paths, computing a path metric comprising a sum of products of symbols corresponding to said succession of states in one of said plural candidate paths and a corresponding succession of symbols in said received signal extending back from a next state of said one candidate path over a predetermined number of prior symbol times;

for each of said next ones of said states, selecting one of said plural candidate paths having the greatest path metric as said survivor path to a corresponding next state and storing said survivor path to said one next state; and outputting a symbol of a survivor path corresponding to an earlier symbol time displaced from a current symbol time by a predetermined delay.

2. The process of claim 1 wherein said survivor paths converge within a span of symbol times corresponding to said predetermined delay.

3. The process of claim 1 wherein said symbols correspond to transitions between current states and next states branching from said current states.

4. The process of claim 3 wherein said code is a trellis code.

5. The process of claim 1 wherein said symbols of said code are mutually orthogonal whereby said products correspond to correlations between symbols of said received signal and symbols of said candidate paths.

6. The process of claim 1 further comprising incrementing said current symbol time by one symbol time and repeating said identifying, computing, selecting and outputting steps, whereby to process said entire block of said symbols of said received signal over successive symbol times.

7. The process of claim 6 wherein said computing comprises:

for each current symbol time, computing said sum of products over a time period extending back in time by L symbol times; and accumulating the sum of products for each symbol time over said succession of symbol times by updating an accumulated sum of products with the sum of products of said current symbol time.

8. The process of claim 7 wherein symbols of said block corresponding to a limited number future symbol times occurring after said current symbol time are known, and wherein said sum of products is computed over a time window including said prior symbol times and said future symbol times.

9. The process of claim 8 wherein each product in said sum of products involving one of the known symbols of said future symbol times is estimated based upon the orthogonality of said symbols.

10. In a communication system receiving from a channel a received signal corresponding to a succession of received symbols during a corresponding succession of symbol times, said succession of symbols corresponding to a succession states of a code of said communication system, each of said states branching to a predetermined number of others of said states, a process for deducting an estimate of said succession of symbols from said received signal by overlapped observations of said received signal, said process comprising:

storing a block of symbols of said received signal;

starting at the last symbol time and proceeding toward the earliest symbol time of said block, performing a backward process comprising:

for each one of said states at a current symbol time of said received signal, identifying a previously stored past survivor path of states from said one state, and forming plural past candidate paths through said one state by appending to said survivor path previous ones of said states branching to said one state;

for each one of said plural past candidate paths, computing a path metric comprising a sum of products of symbols corresponding to the succession of states in the one past candidate path and a corresponding succession of symbols in said received signal extending from said previous state of said one past candidate path over a predetermined number of prior symbol times;

for each of said previous states, selecting one of said plural past candidate paths having the greatest path metric as the survivor past path to the corresponding one of said previous states and storing said survivor past path from said one previous state; and decrementing said current symbol time by one symbol time and repeating the identifying, computing, and selecting steps, whereby to process said entire block of said symbols of said received signal over successive symbol times to form survivor past paths for each state at each symbol time of said block;

starting with the earliest symbol time of said block, performing a forward process, comprising:

for each one of said states at a current symbol time of said received signal, forming plural candidates including:

a future candidate path extending between said one state and the next state in the past survivor path passing through said one state at the current symbol time, plural no-future candidate paths extending through said one state and ending at each next state branching from said one state, plural future candidate paths formed by appending to each said no-future candidate path a portion of that past survivor path extending through the next state of said no-future candidate path;

for each one of said plural future and no- future candidate paths, computing a path metric comprising a sum of products of symbols corresponding to the succession of states in the candidate path and a corresponding succession of symbols in said received signal;

for each of said next states, selecting one of said future candidate paths having the greatest path metric as the survivor future path to the corresponding one of said next states and storing said survivor future path to said one next state;

for each of said next states, selecting one of said future and no-future candidate paths having the greatest path metric as the survivor no-future path to the corresponding one of said next states and storing said survivor no- future path to said one next state;

outputting a symbol of one of said no- future survivor paths corresponding to an earlier symbol time displaced from said current symbol time by a predetermined delay; and incrementing said current symbol time by one symbol time and repeating said identifying, computing, selecting and outputting steps, whereby to process said entire block of said symbols of said received signal over successive symbol times.

11. The process of claim 10 wherein said no-future survivor paths converge within a span of symbol times corresponding to said predetermined delay.

12. The process of claim 10 wherein said symbols correspond to transitions between current states and next states branching from said current states.

13. The process of claim 12 wherein said code is a trellis code.

14. The process of claim 10 wherein said symbols of said code are mutually orthogonal whereby said products correspond to correlations between symbols of said received signal and symbols of said candidate paths.

15. The process of claim 10 wherein said no-future survivor path is the most reliable estimate of a sequence of symbols of said received signal.

16. The process of claim 10 wherein said computing of said backward and forward processes comprises, respectively,:

for each current symbol time, computing said sum of products over a time period extending, respectively, back and forward, in time by L symbol times; and accumulating the sum of products for each symbol time over said succession of symbol times by updating an accumulated sum of products with the sum of products of said current symbol time.

17. The process of claim 16 wherein, in said backward process, symbols of said block corresponding to a limited number future symbol times occurring after said current symbol time are known, and wherein said sum of products is computed over a time window including said prior symbol times and said future symbol times.

18. The process of claim 17 wherein each product in said sum of products involving one of the known symbols of said future symbol times is estimated based upon the orthogonality of said symbols.

19. In a communication system receiving from a channel a received signal corresponding to a succession of received symbols during a corresponding succession of symbol times, said succession of symbols corresponding to a succession states of a code of said communication system, each of said states branching to a predetermined number of others of said states, a process for deducting an estimate of said succession of symbols from said received signal by overlapped observations of said received signal, said process comprising:

means for storing a block of symbols of said received signal;

means, operative for each one of said states at a current symbol time of said received signal, for identifying a previously stored survivor path of states corresponding to said received signal leading to said one state and forming plural candidate paths from said one state by appending to said survivor path next ones of said states branching from said one state;

means, operative for each one of said plural candidate paths, for computing a path metric comprising a sum of products of symbols corresponding to said in said one candidate path and a corresponding succession of symbols in said received signal extending back from said next state of said one candidate path over a predetermined number of prior symbol times;

means, operative for each of said next ones of said states, for selecting one of said plural candidate paths having the greatest path metric as said survivor path to a corresponding one of said next states and storing said survivor path to said one next state; and means for outputting a symbol of one of a survivor path corresponding to an earlier symbol time displaced from a current symbol time by a predetermined delay.

20. The processor of claim 19 wherein said survivor paths converge within a span of symbol times corresponding to said predetermined delay.

21. The processor of claim 19 wherein said symbols correspond to transitions between current states and next states branching from said current states.

22. The processor of claim 21 wherein said code is a trellis code.

23. The processor of claim 19 wherein said symbols of said code are mutually orthogonal whereby said products correspond to correlations between symbols of said received signal and symbols of said candidate paths.

24. The processor of claim 19 further comprising means for incrementing said current symbol time by one symbol time, whereby to process said entire block of said symbols of said received signal over successive symbol times.

25. The processor of claim 24 wherein said means for computing comprises:

means, operative for each current symbol time, for computing said sum of products over a time period extending back in time by L symbol times; and means for accumulating the sum of products for each symbol time over said succession of symbol times by updating and accumulated sum of products with the sum of products of said current symbol time.

26. The processor of claim 25 wherein symbols of a block corresponding to a limited number future symbol times occurring after said current symbol time are known, and wherein said sum of products is computed by said means for computing over a time window including said prior symbol times and said future symbol times.

27. The processor of claim 26 wherein each product in said sum of products involving one of the known symbols of said future symbol times is estimated by said means for computing based upon the orthogonality of said symbols.

28. In a communication system receiving from a channel a received signal corresponding to a succession of received symbols during a corresponding succession of symbol times, said succession of symbols corresponding to a succession states of a code of said communication system, each of said states branching to a predetermined number of others of said states, a process for deducting an estimate of said succession of symbols from said received signal by overlapped observations of said received signal, said process comprising:

means for storing a block of symbols of said received signal;

a backward processor operative starting at the last symbol time and proceeding toward an earliest symbol time of said block, said backward processor comprising:

means, operative for each one of said states at a current symbol time of said received signal, for identifying a previously stored survivor path of states corresponding to said received signal leading to said one state and forming plural past candidate paths through said one state by appending to said survivor path precious ones of said states branching to said one state;

means, operative for each one of said plural past candidate paths, for computing a path metric comprising a sum of products of symbols corresponding to said succession of states in one past candidate path and a corresponding succession of symbols in said received signal extending from said previous state of said one past candidate path over a predetermined number of prior symbol times;

means, operative for each of said previous states, for selecting one of said plural past candidate paths having the greatest path metric as said survivor past path to a corresponding one of said previous states and for storing said survivor past path from said one previous state; and means for decrementing said current symbol time by one symbol time and iterating said identifying, computing, and selecting means to process said entire block of said symbols of said received signal over successive symbol times to form survivor past paths for each state at each symbol time of said block;

a forward processor operative starting with an earliest symbol time of said block, said forward processor comprising:

means, operative for each of said states at a current symbol time of said received signal, for forming plural candidates including:
a future candidate path extending between said one state and a next state in a past survivor path passing through said one state at said current symbol time,
plural no-future candidate paths extending through said one state and ending at each next state branching from said one state,
plural future candidate paths formed by appending to each of said plural no-future candidate paths a portion of a past survivor path extending through said next state of said no-future candidate path;

means, operative for each one of said plural future and no-future candidate paths, for computing a path metric comprising a sum of products of symbols corresponding to said succession of states in a candidate path and a corresponding succession of symbols in said received signal;

means, operative for each of said next states, for selecting one of said future candidate paths having the greatest path metric as a survivor future path to a corresponding one of said next states and for storing said survivor future path to said one next state;

means, operative for each of said next states, for selecting one of said future and no-future candidate paths having the greatest path metric as a survivor no-future path to a corresponding one of said next states and for storing said survivor no-future path to said one next state; and means for incrementing said current symbol time by one symbol time to process said entire block of said symbols of said received signal over successive symbol times; and means for outputting a symbol of one of said no-future survivor paths corresponding to an earlier symbol time displaced from said current symbol time by a predetermined delay.

29. The processor of claim 28 wherein said no-future survivor paths converge within a span of symbol times corresponding to said predetermined delay.

30. The processor of claim 28 wherein said symbols correspond to transitions between current states and next states branching from said current states.

31. The processor of claim 30 wherein said code is a trellis code.

32. The processor of claim 28 wherein said symbols of said code are mutually orthogonal whereby said products correspond to correlations between symbols of said received signal and symbols of said candidate paths.

33. In a communication system receiving from a channel a received signal corresponding to a succession of received symbols during a corresponding succession of symbol times, said succession of symbols corresponding to a succession states of a code of said communication system, each of said states branching to a predetermined number of others of said states, a process for deducting an estimate of said succession of symbols from said received signal by overlapped observations of said received signal, said process comprising:

storing a block of symbols of said received signal;

for each one of said states at a current symbol time of said received signal, identifying a preciously stored survivor path of states including said one state and forming plural candidate paths therefrom by appending to said survivor path other ones of said states branching from said one state;

for each one of said plural candidate paths, computing a path metric comprising a sum of products of symbols corresponding to the succession of states in the one candidate path and a corresponding succession of symbols in said received signal of said one candidate path over a predetermined number of symbol times;

for each of said next states, selecting one of said plural candidate paths having the greatest path metric as the survivor path to the corresponding one of said other states and storing said survivor path to said one other state; and outputting a symbol of one of said survivor paths corresponding to a symbol time displaced from said current symbol time by a predetermined delay.

34. The process of claim 33 wherein said survivor paths converge within a span of symbol times corresponding to said predetermined delay.

* * * * *